(12) United States Patent
Takeda et al.

(10) Patent No.: US 11,776,624 B2
(45) Date of Patent: Oct. 3, 2023

(54) MEMORY SYSTEM AND MEMORY DEVICE

(71) Applicant: KIOXIA CORPORATION, Tokyo (JP)

(72) Inventors: Naomi Takeda, Yokohama (JP);
Masanobu Shirakawa, Chigasaki (JP);
Akio Sugahara, Yokohama (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/159,123

(22) Filed: Jan. 25, 2023

(65) Prior Publication Data

US 2023/0162788 A1    May 25, 2023

Related U.S. Application Data

(63) Continuation of application No. 17/647,229, filed on Jan. 6, 2022, now Pat. No. 11,594,278, which is a continuation of application No. 17/018,684, filed on Sep. 11, 2020, now Pat. No. 11,257,541.

(30) Foreign Application Priority Data

Sep. 19, 2019    (JP) ................. 2019-170378

(51) Int. Cl.
| | | |
|---|---|---|
| G11C 16/08 | (2006.01) | |
| G11C 11/56 | (2006.01) | |
| G11C 16/04 | (2006.01) | |
| G11C 16/10 | (2006.01) | |
| G11C 16/26 | (2006.01) | |
| G06F 12/02 | (2006.01) | |

(52) U.S. Cl.
CPC ...... G11C 11/5628 (2013.01); G11C 11/5671 (2013.01); G11C 16/0483 (2013.01); G11C 16/08 (2013.01); G11C 16/10 (2013.01); G11C 16/26 (2013.01); *G06F 12/0246* (2013.01)

(58) Field of Classification Search
CPC ...................................................... G11C 16/08
See application file for complete search history.

(56) References Cited

U.S. PATENT DOCUMENTS

| | | |
|---|---|---|
| 8,068,365 B2 | 11/2011 | Kim |
| 8,250,437 B2 | 8/2012 | Sakurada et al. |
| 8,397,018 B2 | 3/2013 | Dhakshinamurthy et al. |
| 9,773,557 B2 | 9/2017 | Goto et al. |
| 2017/0365335 A1* | 12/2017 | Wang ................ G11C 16/08 |

FOREIGN PATENT DOCUMENTS

| | | |
|---|---|---|
| JP | 5360214 B2 | 12/2013 |
| JP | 5579621 B2 | 8/2014 |

* cited by examiner

*Primary Examiner* — Jason Lappas
(74) *Attorney, Agent, or Firm* — Oblon, McClelland, Maier & Neustadt, L.L.P.

(57) ABSTRACT

According to one embodiment, a memory system includes n memory cells, each capable of storing j bits of data; and a controller. The controller is configured to write a first portion of each of first data to n-th data from among n×j data with consecutive logical addresses to the n memory cells one by one. The first data has a lowest logical address among the n×j pieces of data. The first data to the n-th data have ascending consecutive logical addresses. The controller is configured to write the first portion of one of the first to n-th data as a first bit of the j bits, and write the first portion of another one of the first to n-th data except said one of the first to n-th data as a second bit of the j bits.

14 Claims, 68 Drawing Sheets

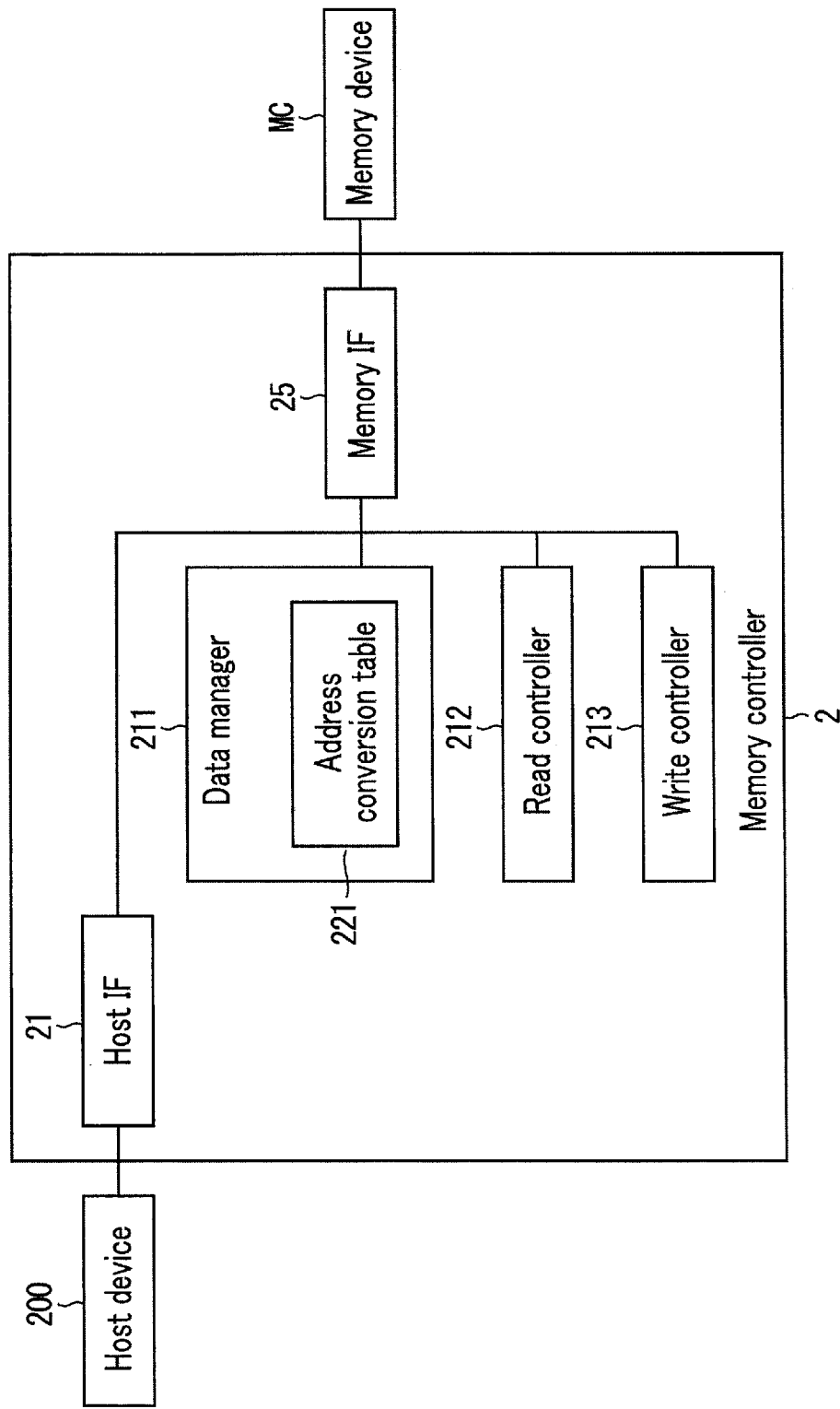
F I G. 2

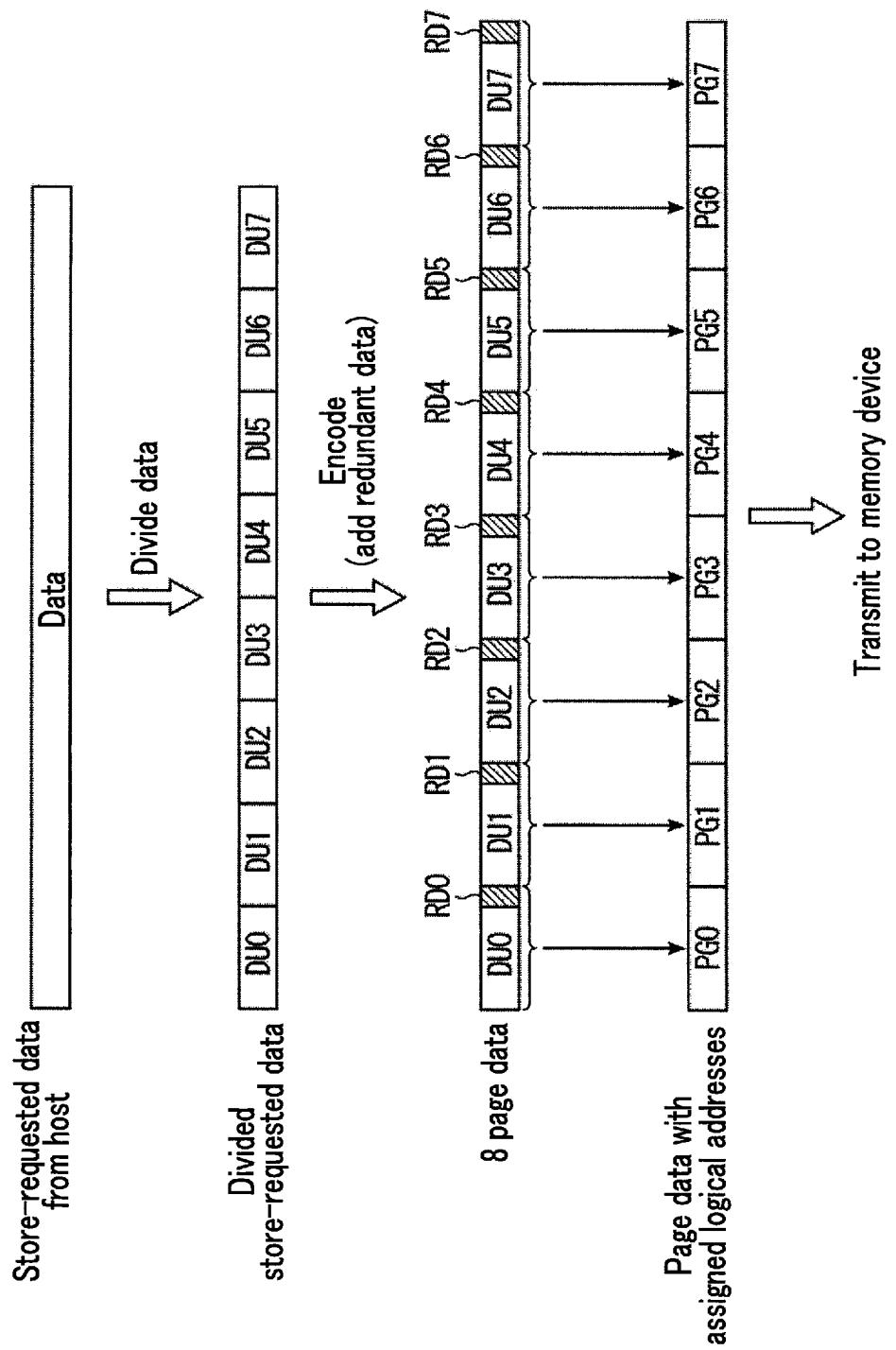
F I G. 6

|  | MC0 | |  |
|---|---|---|---|
|  | PB0 | PB1 | |
| Top page | PG4 | PG6 | ⋯ MA |
| Upper page | PG7 | PG5 | |
| Middle page | PG3 | PG1 | |
| Lower page | PG0 | PG2 | |

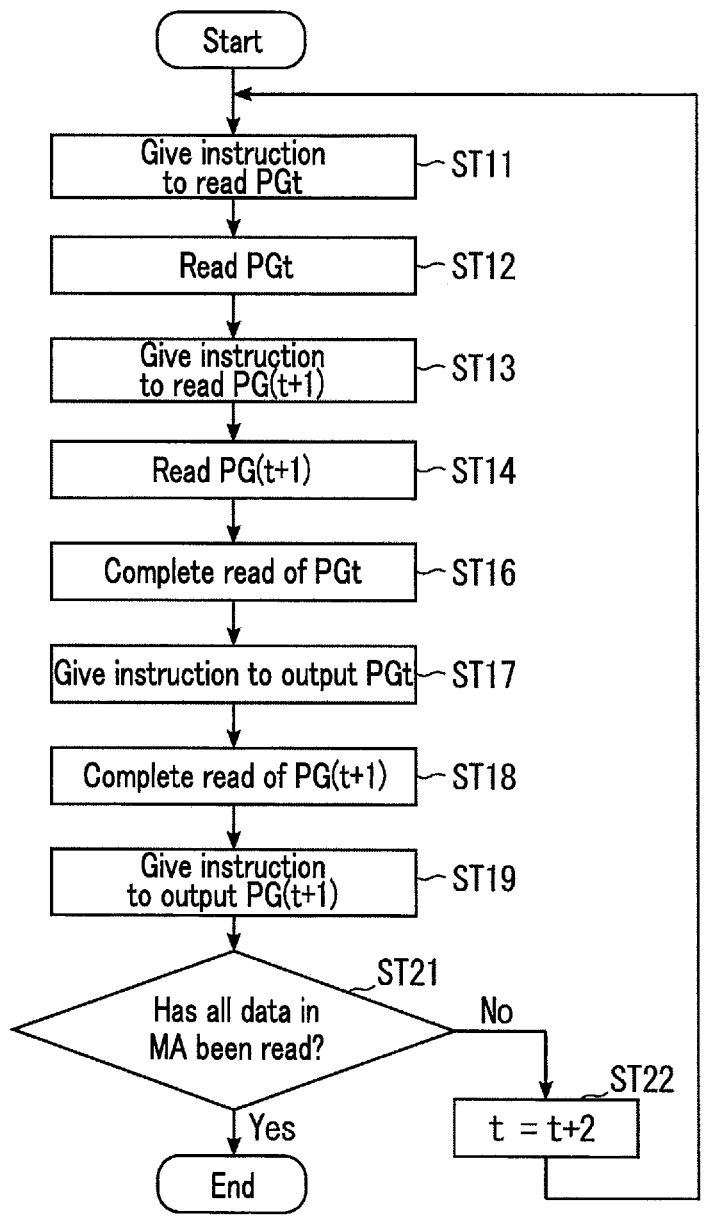
F I G. 11

|  | PB0 | PB1 |
|---|---|---|
| Top page | PG6 | PG7 |
| Upper page | PG4 | PG5 |
| Middle page | PG2 | PG3 |
| Lower page | PG0 | PG1 |

MA

F I G. 13

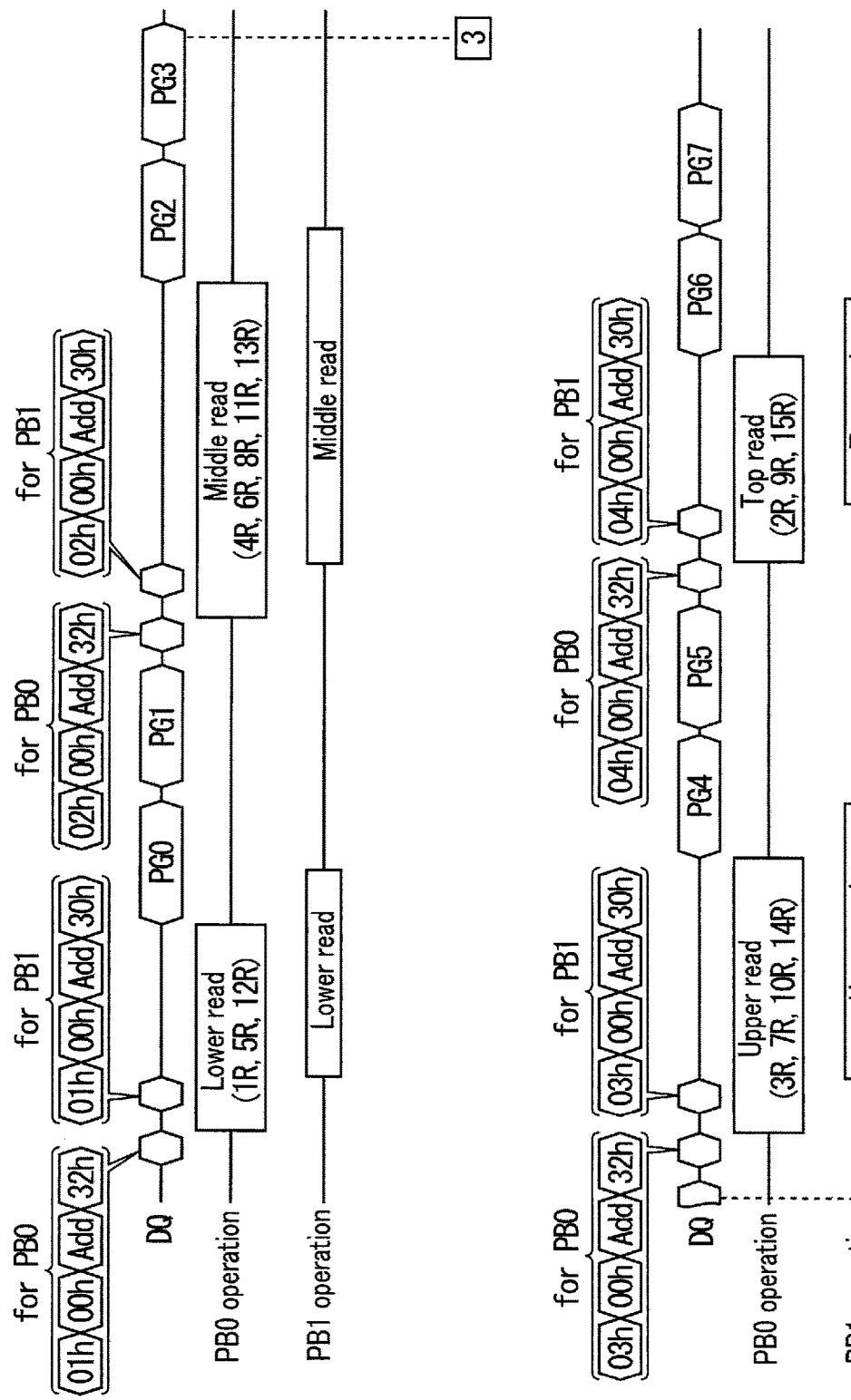
F I G. 14

|  | MC0 | | MC1 | |
| --- | --- | --- | --- | --- |
|  | PB0 | PB1 | PB0 | PB1 |
| Top page | PG10 | PG14 | PG7 | PG3 |
| Upper page | PG0 | PG4 | PG8 | PG12 |
| Middle page | PG5 | PG1 | PG13 | PG9 |
| Lower page | PG15 | PG11 | PG2 | PG6 |

FIG. 16

|  | MC0 | | MC1 | |
|---|---|---|---|---|
|  | PB0 | PB1 | PB0 | PB1 |
| Top page | PG13 | PG1 | PG5 | PG9 |
| Upper page | PG0 | PG4 | PG8 | PG12 |
| Middle page | PG7 | PG11 | PG15 | PG3 |
| Lower page | PG10 | PG14 | PG2 | PG6 |

FIG. 19

|  | MC0 | MC1 | MC2 | MC3 |
|---|---|---|---|---|
| Top page | PG10 | PG14 | PG7 | PG3 |
| Upper page | PG0 | PG4 | PG8 | PG12 |
| Middle page | PG5 | PG1 | PG13 | PG9 |
| Lower page | PG15 | PG11 | PG2 | PG6 |

The dashed box containing the data cells is labeled MA3.

F I G. 21

|  | MC0 | MC1 | MC2 | MC3 |
|---|---|---|---|---|
| Top page | PG13 | PG1 | PG5 | PG9 |
| Upper page | PG0 | PG4 | PG8 | PG12 |
| Middle page | PG7 | PG11 | PG15 | PG3 |
| Lower page | PG10 | PG14 | PG2 | PG6 |

MA3

F I G. 24

|  | MC0 | | MC1 | | MC2 | | MC3 | |
|---|---|---|---|---|---|---|---|---|
|  | PB0 | PB1 | PB0 | PB1 | PB0 | PB1 | PB0 | PB1 |
| Top page | PG20 | PG21 | PG28 | PG29 | PG14 | PG15 | PG6 | PG7 |
| Upper page | PG0 | PG1 | PG8 | PG9 | PG16 | PG17 | PG24 | PG25 |
| Middle page | PG10 | PG11 | PG2 | PG3 | PG26 | PG27 | PG18 | PG19 |
| Lower page | PG30 | PG31 | PG22 | PG23 | PG4 | PG5 | PG12 | PG13 |

F I G. 25

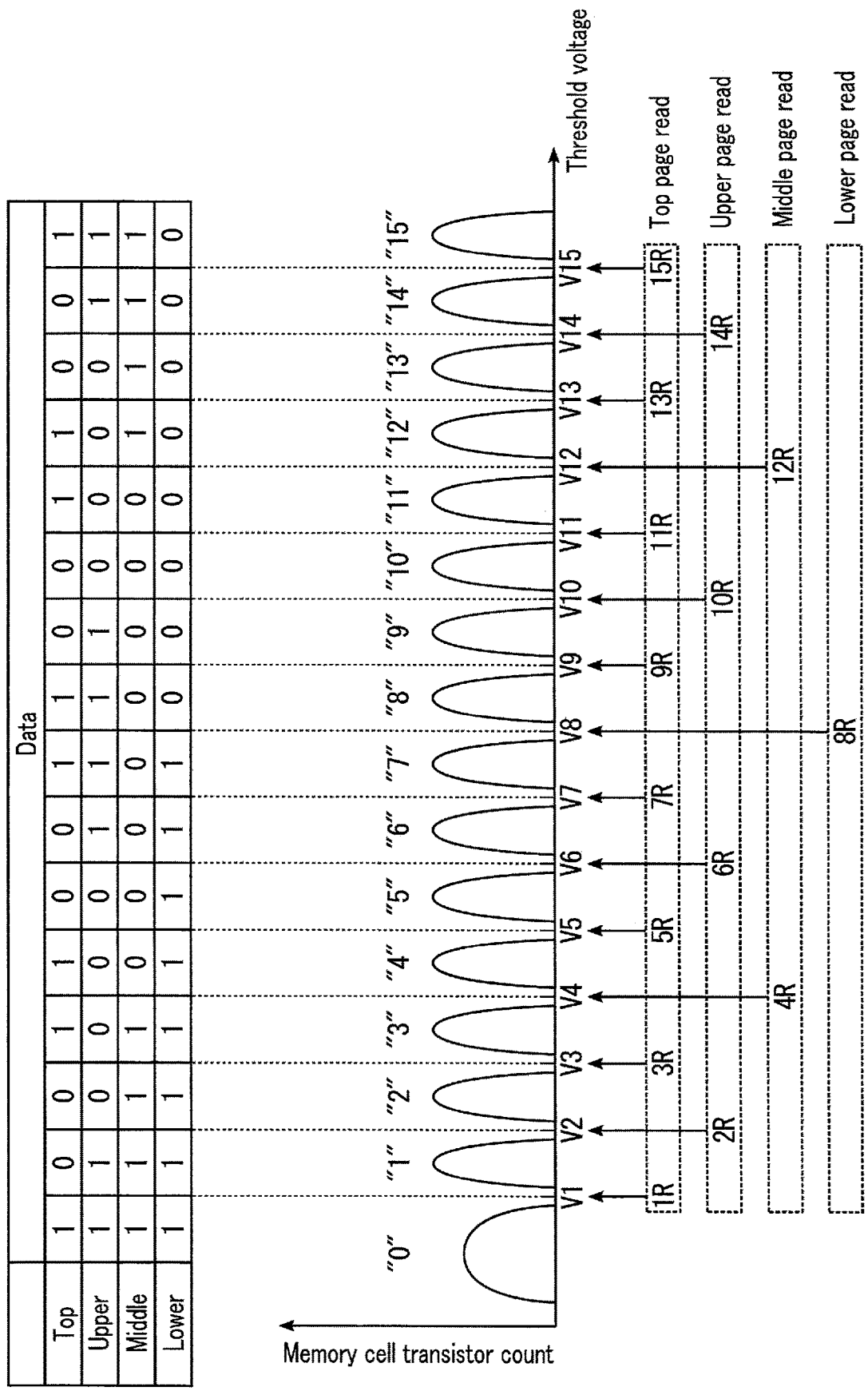
F I G. 26

|  | MC0 | | MC1 | |
| --- | --- | --- | --- | --- |
|  | PB0 | PB1 | PB0 | PB1 |
| Top page | PG7 | PG11 | PG15 | PG3 |
| Upper page | PG10 | PG14 | PG2 | PG6 |
| Middle page | PG13 | PG1 | PG5 | PG9 |
| Lower page | PG0 | PG4 | PG8 | PG12 |

MA2

F I G. 27

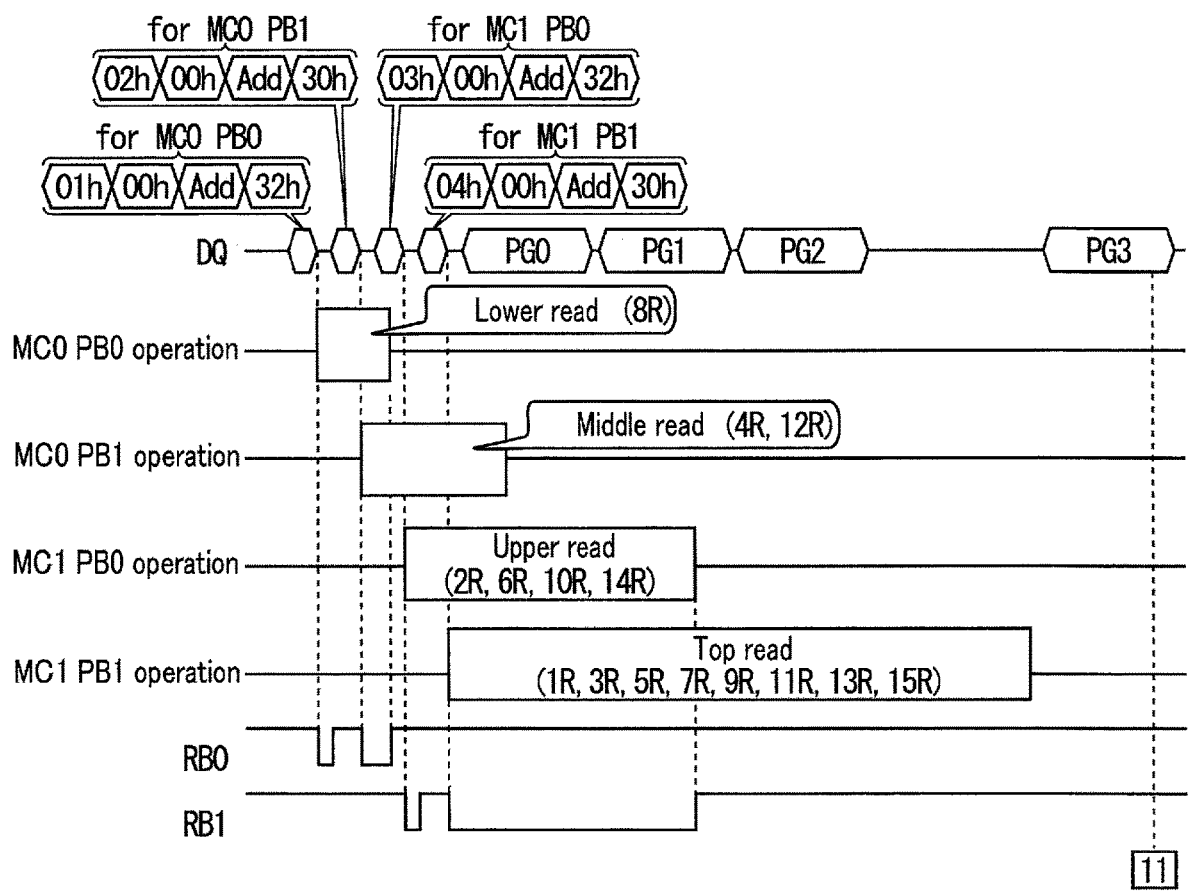
F I G. 28

| | MC0 | | MC1 | |
|---|---|---|---|---|
| | PB0 | PB1 | PB0 | PB1 |
| Top page | PG11 | PG15 | PG7 | PG3 |
| Upper page | PG14 | PG10 | PG2 | PG6 |
| Middle page | PG5 | PG1 | PG13 | PG9 |
| Lower page | PG0 | PG4 | PG8 | PG12 |

|  | MC0 | MC1 | MC2 | MC3 |
|---|---|---|---|---|
| Top page | PG7 | PG11 | PG15 | PG3 |
| Upper page | PG10 | PG14 | PG2 | PG6 |
| Middle page | PG13 | PG1 | PG5 | PG9 |
| Lower page | PG0 | PG4 | PG8 | PG12 |

MA3

F I G. 33

|  | MC0 | | MC1 | | MC2 | | MC3 | |
|---|---|---|---|---|---|---|---|---|
|  | PB0 | PB1 | PB0 | PB1 | PB0 | PB1 | PB0 | PB1 |
| Top page | PG14 | PG15 | PG22 | PG23 | PG30 | PG31 | PG6 | PG7 |
| Upper page | PG20 | PG21 | PG28 | PG29 | PG4 | PG5 | PG12 | PG13 |
| Middle page | PG26 | PG27 | PG2 | PG3 | PG10 | PG11 | PG18 | PG19 |
| Lower page | PG0 | PG1 | PG8 | PG9 | PG16 | PG17 | PG24 | PG25 |

F I G. 34

|              | MC0 | MC1 | PG2 |
|--------------|-----|-----|-----|
| Upper page   | PG5 | PG8 | PG2 |
| Middle page  | PG7 | PG1 | PG4 |
| Lower page   | PG0 | PG3 | PG6 |

MA4

F I G. 36

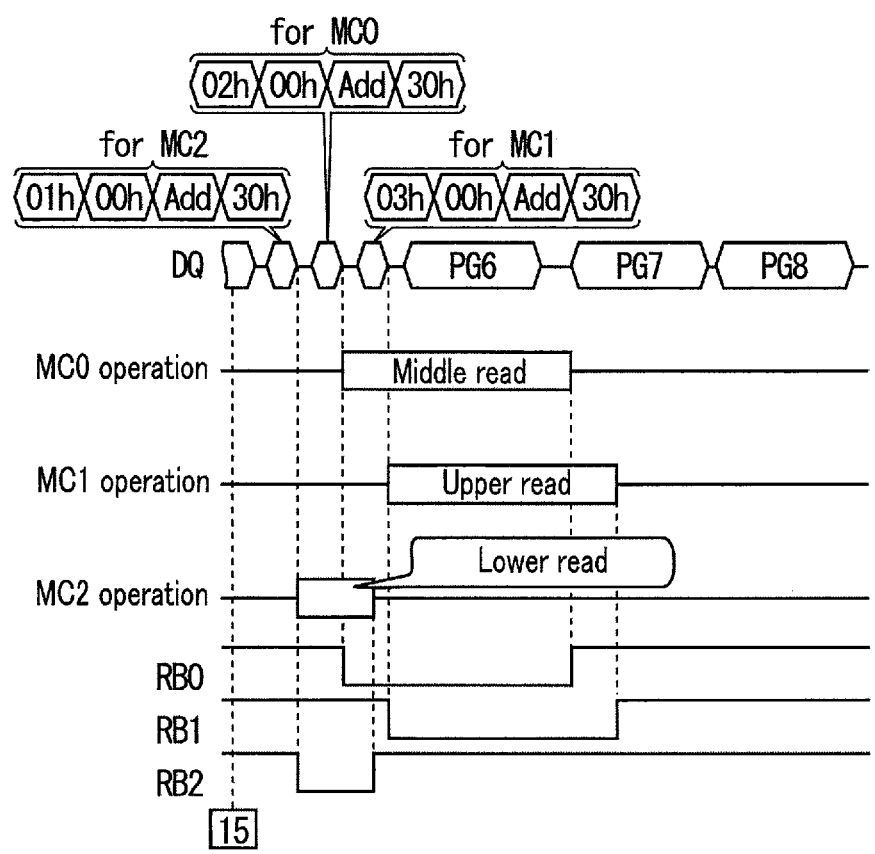
F I G. 38

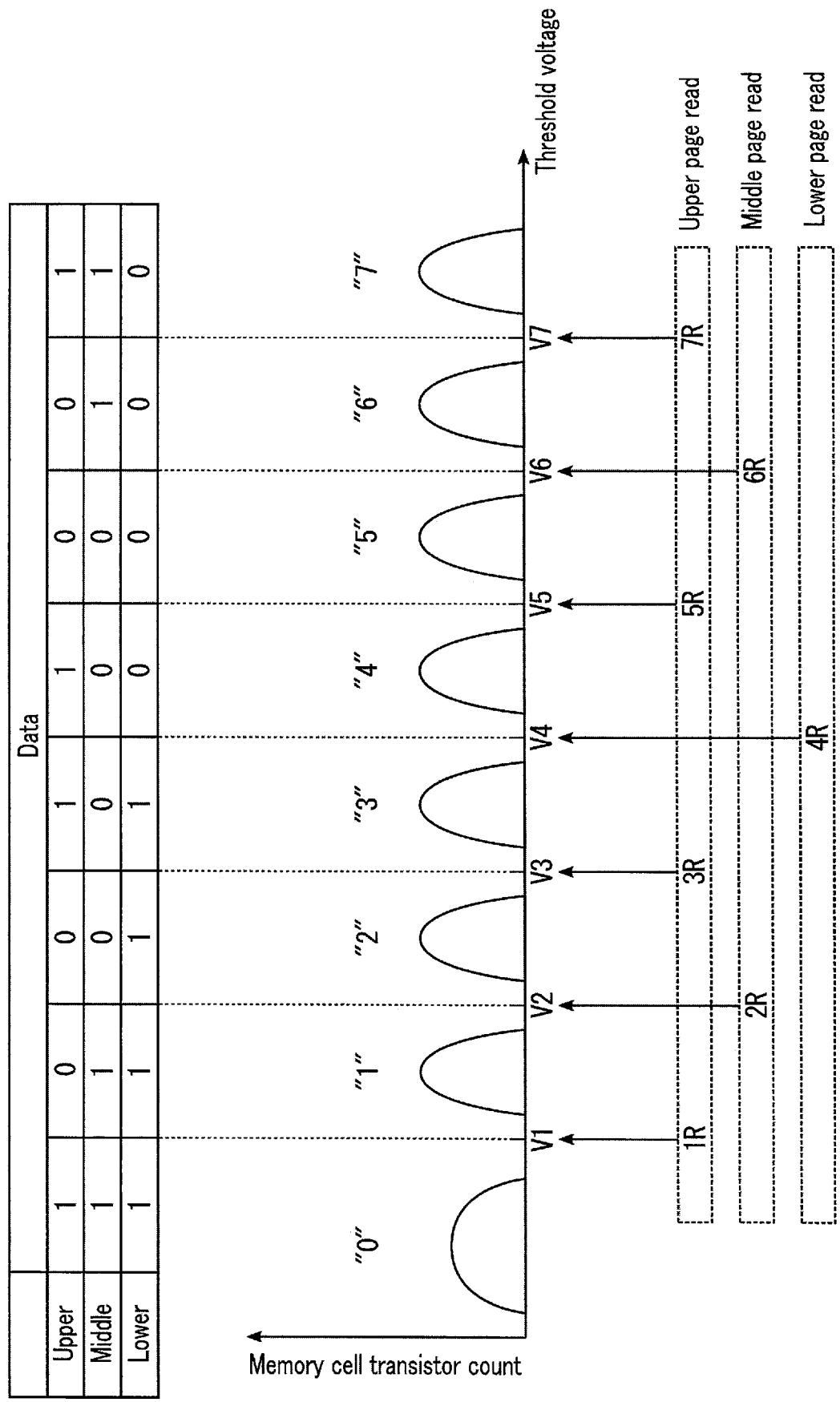
F I G. 39

|  | MC0 | | MC1 | | MC2 | |
|---|---|---|---|---|---|---|
|  | PB0 | PB1 | PB0 | PB1 | PB0 | PB1 |
| Upper page | PG10 | PG11 | PG16 | PG17 | PG4 | PG5 |
| Middle page | PG14 | PG15 | PG2 | PG3 | PG8 | PG9 |
| Lower page | PG0 | PG1 | PG6 | PG7 | PG12 | PG13 |

← MA4a

F I G. 40

|  | MC0 | | MC1 |
|---|---|---|---|
|  | PB0 | PB1 | PB0 |
| Upper page | PG5 | PG8 | PG2 |
| Middle page | PG7 | PG1 | PG4 |
| Lower page | PG0 | PG3 | PG6 |

← MA5

F I G. 41

|  | MC0 | | MC1 | | MC2 | |
|---|---|---|---|---|---|---|
|  | PB0 | PB1 | PB0 | PB1 | PB0 | PB1 |
| Upper page | PG11 | PG17 | PG2 | PG8 | PG14 | PG5 |
| Middle page | PG16 | PG1 | PG7 | PG13 | PG4 | PG10 |
| Lower page | PG0 | PG6 | PG12 | PG3 | PG9 | PG15 |

← MA6

F I G. 42

|  | MC0 | | |
|---|---|---|---|
|  | PB0 | PB1 | PB2 |
| Upper page | PG5 | PG8 | PG2 |
| Middle page | PG7 | PG1 | PG4 |
| Lower page | PG0 | PG3 | PG6 |

← MA7

F I G. 43

|  | MC0 | MC1 | MC2 |
|---|---|---|---|
| Upper page | PG0 | PG3 | PG6 |
| Middle page | PG5 | PG8 | PG2 |
| Lower page | PG7 | PG1 | PG4 |

MA4

F I G. 45

|  | MC0 | | |
|---|---|---|---|
|  | PB0 | PB1 | PB2 |
| Upper page | PG0 | PG3 | PG6 |
| Middle page | PG5 | PG8 | PG2 |
| Lower page | PG7 | PG1 | PG4 |

MA7

F I G. 46

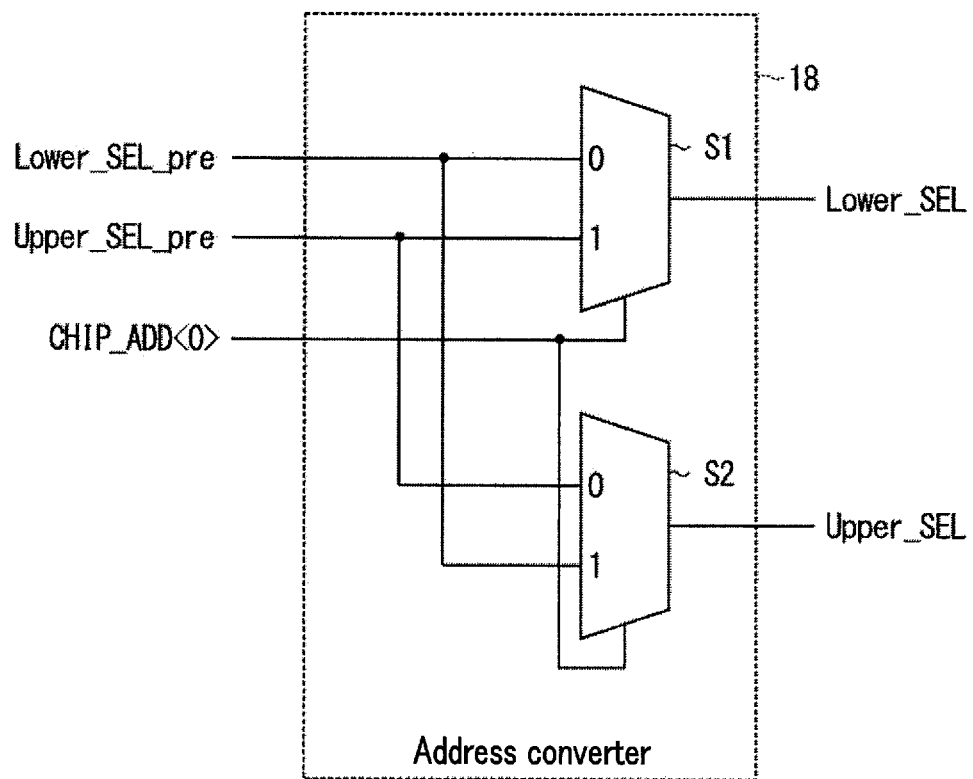
F I G. 51

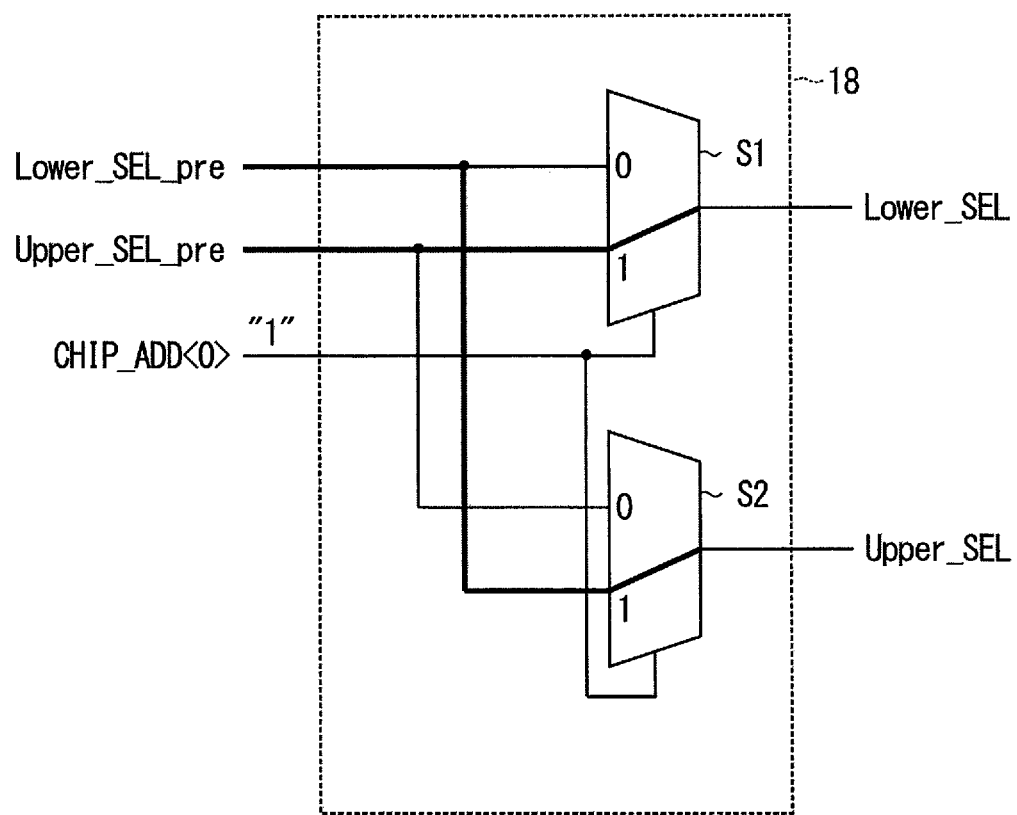
F I G. 52

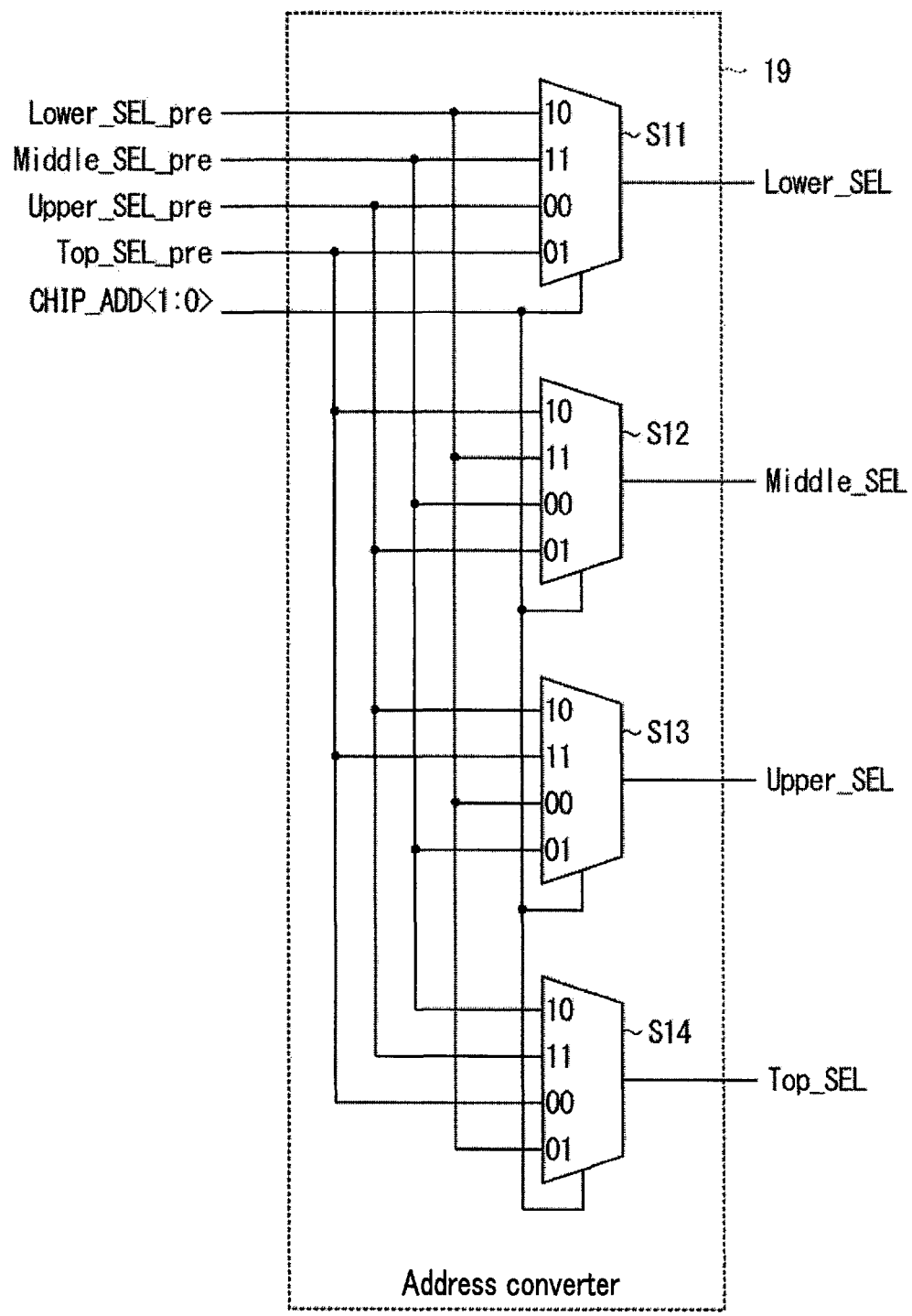
F I G. 58

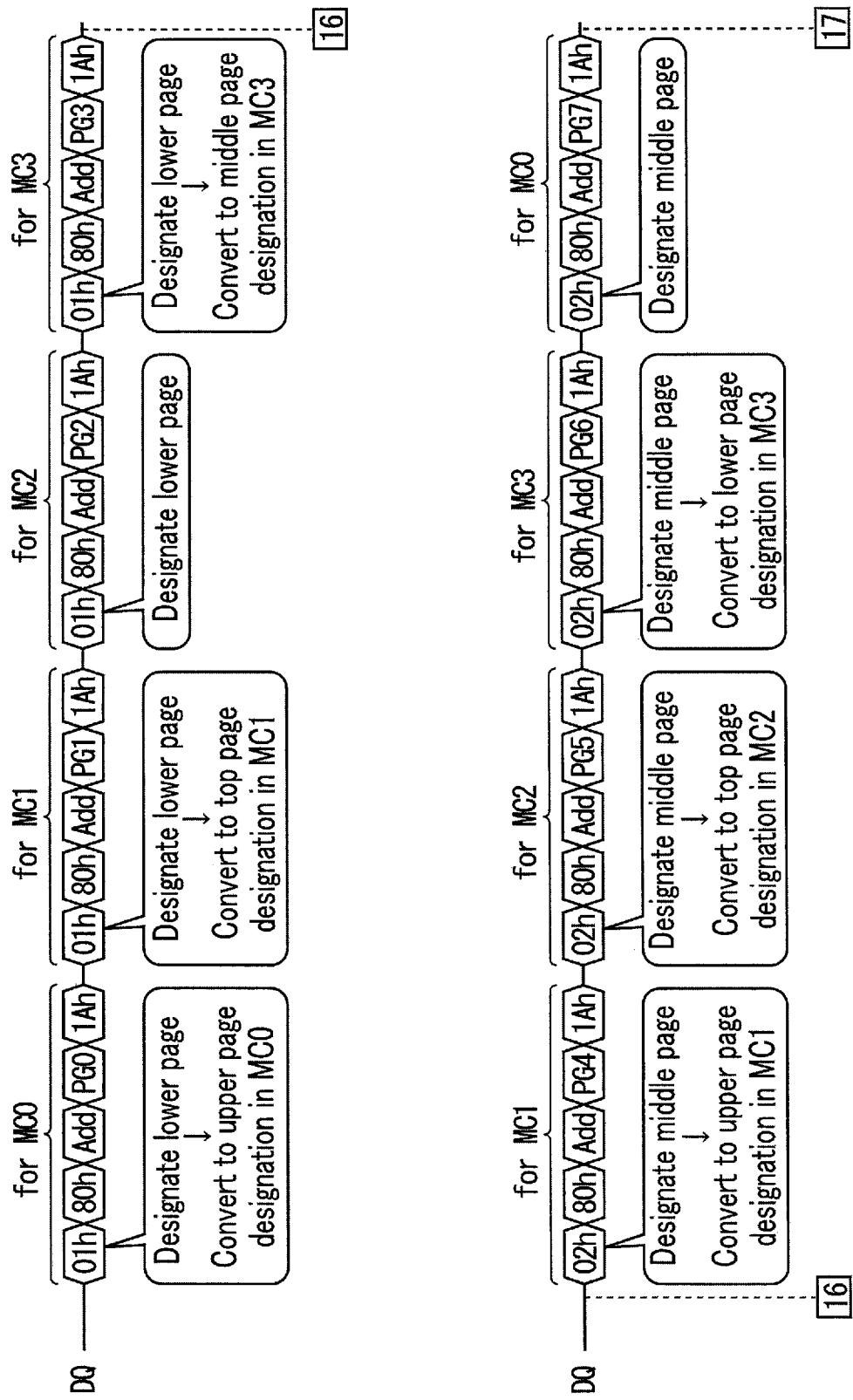
F I G. 60

|  | MC0 | MC1 | MC2 | MC3 |
|---|---|---|---|---|
| Top page | PG13 | PG14 | PG15 | PG12 |
| Upper page | PG10 | PG11 | PG8 | PG9 |
| Middle page | PG7 | PG4 | PG5 | PG6 |
| Lower page | PG0 | PG1 | PG2 | PG3 |

← MA3

F I G. 62

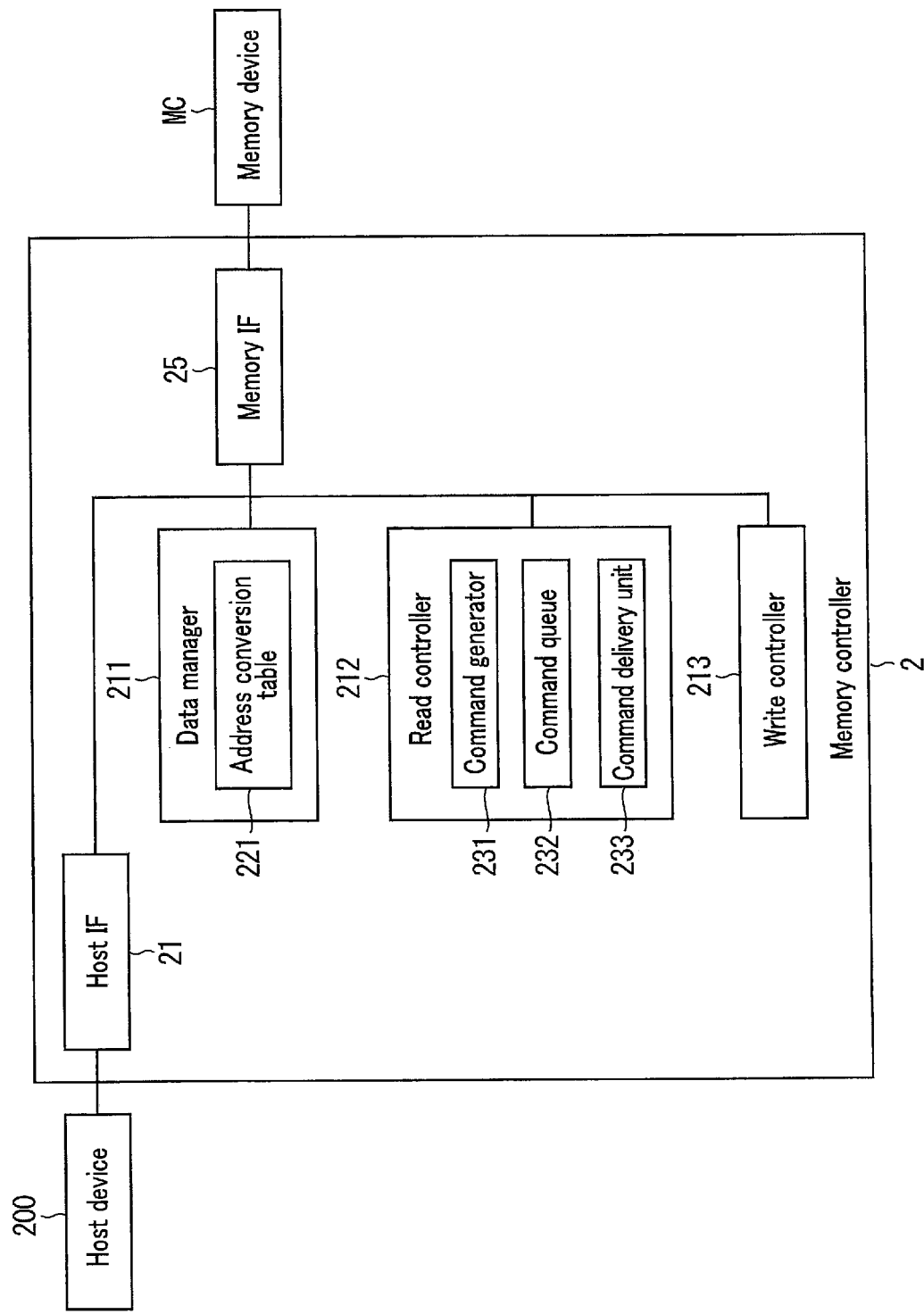
F I G. 66

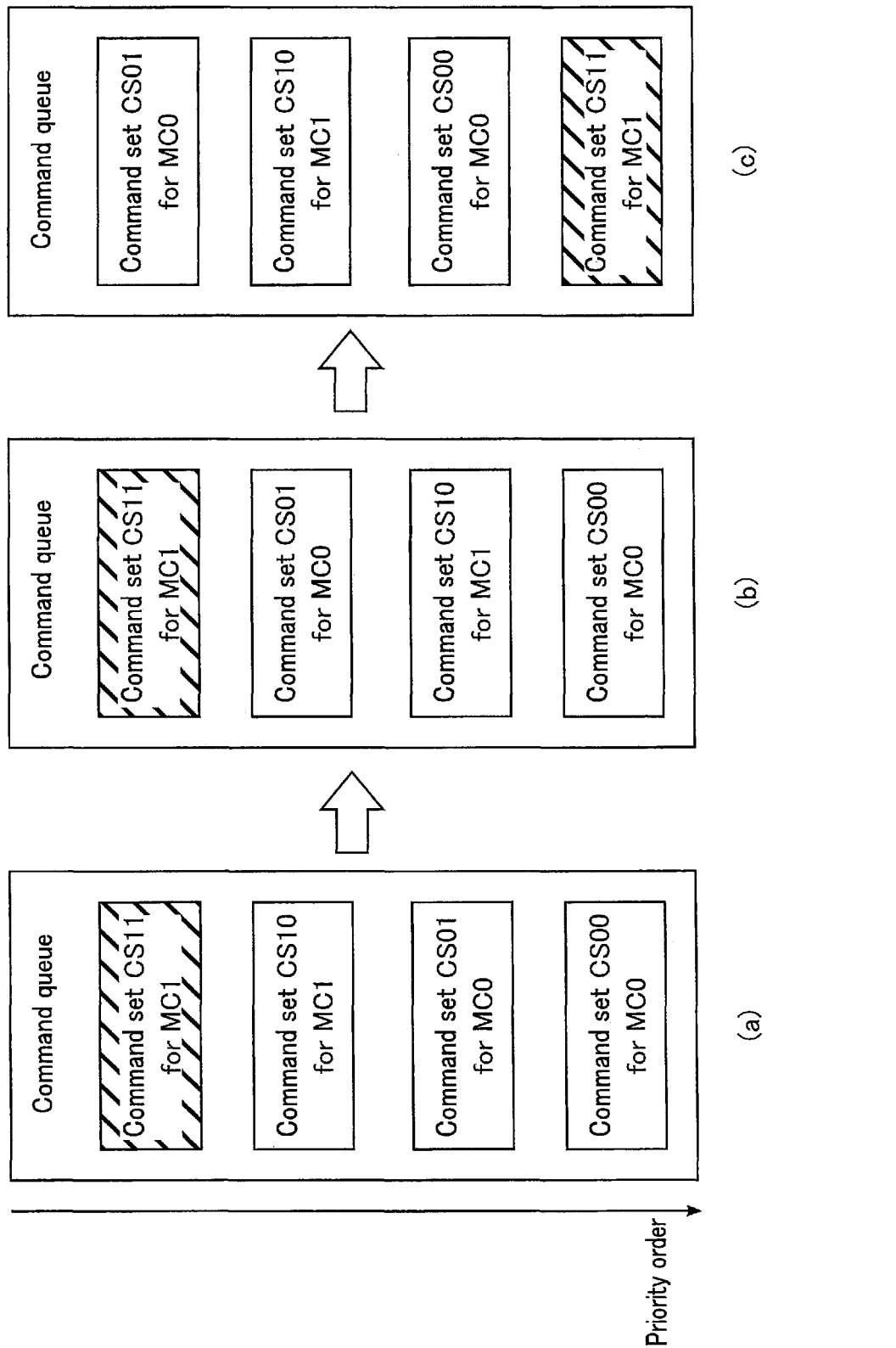
F I G. 68

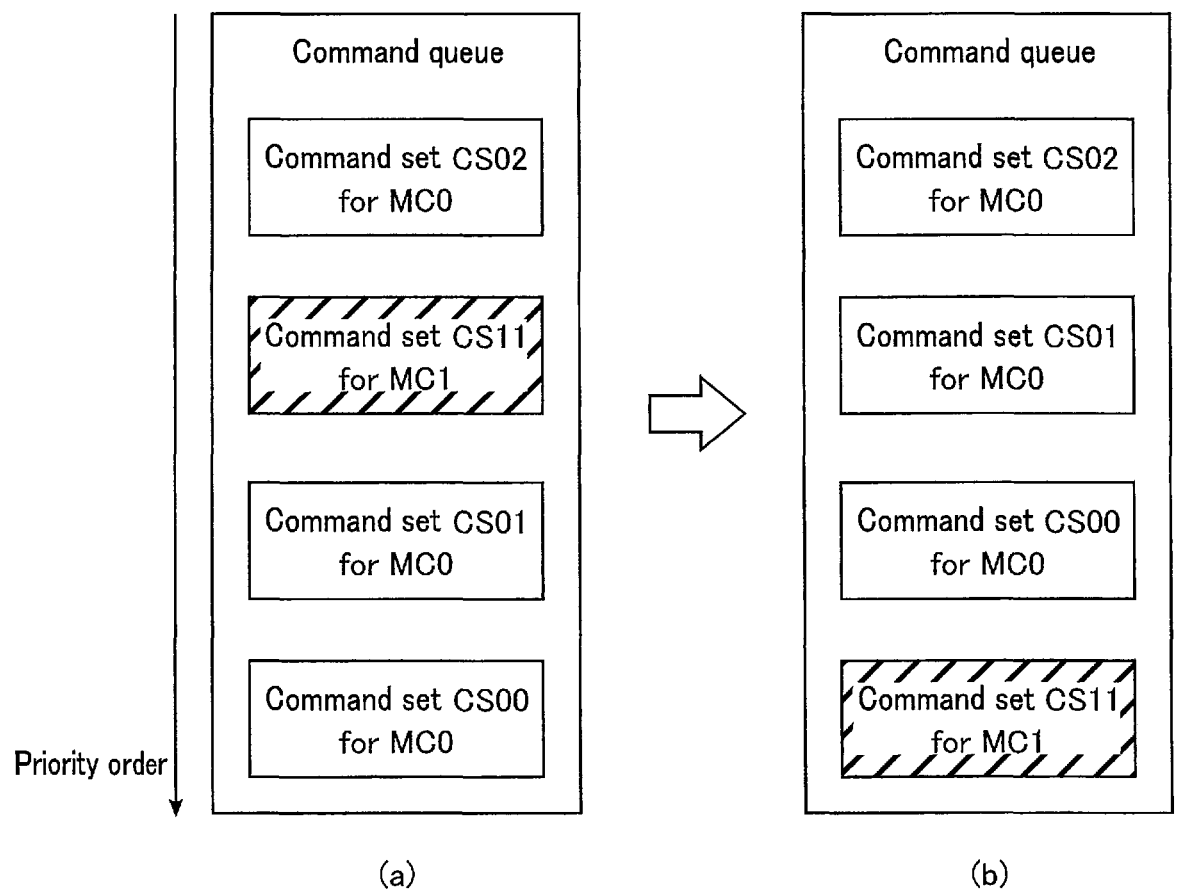
F I G. 69

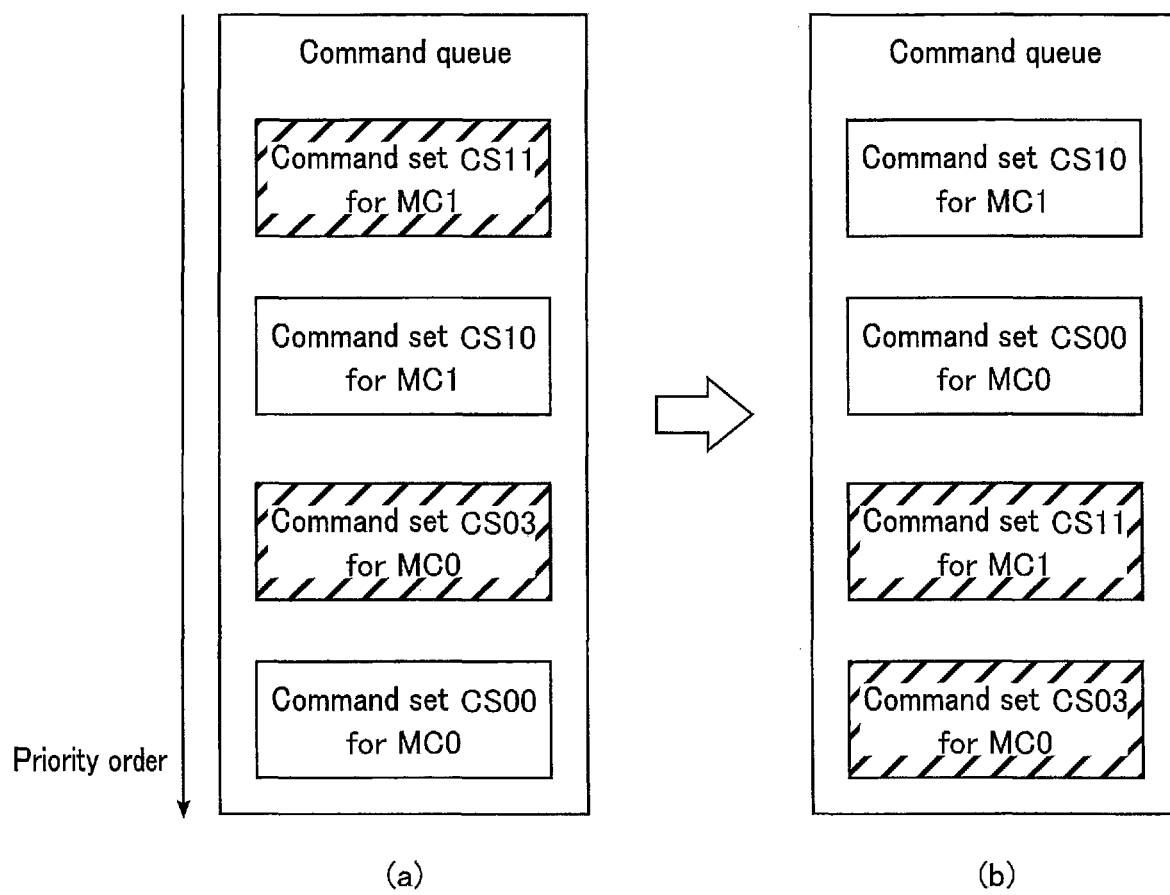
F I G. 70

MA2A

| | MCA0 | | MCA1 | |
|---|---|---|---|---|
| | PB0 | PB1 | PB0 | PB1 |
| Top page | PG20 | PG28 | PG14 | PG6 |
| Upper page | PG0 | PG8 | PG16 | PG24 |
| Middle page | PG10 | PG2 | PG26 | PG18 |
| Lower page | PG30 | PG22 | PG4 | PG12 |

MA2B

| | MCB0 | | MCB1 | |
|---|---|---|---|---|
| | PB0 | PB1 | PB0 | PB1 |
| Top page | PG21 | PG29 | PG15 | PG7 |
| Upper page | PG1 | PG9 | PG17 | PG25 |
| Middle page | PG11 | PG3 | PG27 | PG19 |
| Lower page | PG31 | PG23 | PG5 | PG13 |

F I G. 73

|  | MCA0 | | MCA1 | |
|---|---|---|---|---|
|  | PB0 | PB1 | PB0 | PB1 |
| Top page | PG20 | PG28 | PG13 | PG5 |
| Upper page | PG0 | PG8 | PG16 | PG24 |
| Middle page | PG9 | PG1 | PG25 | PG17 |
| Lower page | PG29 | PG21 | PG4 | PG12 |

MA2A

|  | MCB0 | | MCB1 | |
|---|---|---|---|---|
|  | PB0 | PB1 | PB0 | PB1 |
| Top page | PG22 | PG30 | PG15 | PG7 |
| Upper page | PG2 | PG10 | PG18 | PG26 |
| Middle page | PG11 | PG3 | PG27 | PG19 |
| Lower page | PG31 | PG23 | PG6 | PG14 |

MA2B

F I G. 74

| | MCA0 | | MCA1 | |
|---|---|---|---|---|
| | PB0 | PB1 | PB0 | PB1 |
| Top page | PG18 | PG26 | PG11 | PG3 |
| Upper page | PG0 | PG8 | PG16 | PG24 |
| Middle page | PG9 | PG1 | PG25 | PG17 |
| Lower page | PG27 | PG19 | PG2 | PG10 |

MA2A

| | MCB0 | | MCB1 | |
|---|---|---|---|---|
| | PB0 | PB1 | PB0 | PB1 |
| Top page | PG20 | PG30 | PG15 | PG7 |
| Upper page | PG4 | PG12 | PG22 | PG28 |
| Middle page | PG13 | PG5 | PG29 | PG23 |
| Lower page | PG31 | PG21 | PG6 | PG14 |

MA2B

F I G. 75

MEMORY SYSTEM AND MEMORY DEVICE

CROSS-REFERENCE TO RELATED APPLICATIONS

This application is a continuation of and claims benefit under 35 U.S.C. § 120 to U.S. application Ser. No. 17/647,229, filed Jan. 6, 2022, which is a continuation of and claims benefit under 35 U.S.C. § 120 to U.S. application Ser. No. 17/018,684, filed Sep. 11, 2020, which is based upon and claims the benefit of priority from Japanese Patent Application No. 2019-170378, filed Sep. 19, 2019, the entire contents of each of which are incorporated herein by reference.

FIELD

Embodiments described herein relate generally to a memory system.

BACKGROUND

A memory system including a memory device and a controller that controls the memory device is known.

BRIEF DESCRIPTION OF THE DRAWINGS

FIG. 2 illustrates functional blocks of a memory controller according to the first embodiment;

FIG. 6 illustrates an example of processing data for data writes in the memory controller according to the first embodiment;

FIG. 11 illustrates an example of a flow of data reads in the memory system according to the first embodiment;

FIG. 13 illustrates an example for reference of the positions where page data are written in a memory device;

FIG. 14 illustrates an example for reference of an input and output signal during data reads over time in a memory system;

FIG. 16 illustrates an example of positions where page data are written in the memory devices according to the second embodiment;

FIG. 19 illustrates a second example of positions where page data are written in the memory devices according to the second embodiment;

FIG. 21 illustrates an example of positions where page data are written in the memory devices according to the third embodiment;

FIG. 24 illustrates a second example of positions where page data are written in the memory devices according to the third embodiment;

FIG. 25 illustrates an example of positions where page data are written in the memory devices according to a modification of the third embodiment;

FIG. 26 illustrates a mapping between a threshold voltage distribution of memory cell transistors and data according to a fourth embodiment;

FIG. 27 illustrates an example of positions where page data are written in the memory devices according to the fourth embodiment;

FIG. 28 illustrates an input and output signal during data reads over time in the memory system according to the fourth embodiment;

FIG. 33 illustrates an example of positions where page data are written in the memory devices according to a fifth embodiment;

FIG. 34 illustrates an example of positions where page data are written in the memory devices according to a modification of the fifth embodiment;

FIG. 36 illustrates an example of positions where page data are written in the memory devices according to the sixth embodiment;

FIG. 38 illustrates an input and output signal during data reads over time in the memory system according to the sixth embodiment;

FIG. 39 illustrates a second example of mapping between a threshold voltage distribution of memory cell transistors and data according to the sixth embodiment;

FIG. 40 illustrates an example of positions where page data are written in the memory devices according to a modification of the sixth embodiment;

FIG. 41 illustrates an example of positions where page data are written in the memory devices according to a seventh embodiment;

FIG. 42 illustrates an example of positions where page data are written in the memory devices according to a modification of the seventh embodiment;

FIG. 43 illustrates an example of positions where page data are written in the memory device according to an eighth embodiment;

FIG. 45 illustrates an example of positions where page data are written in the memory devices according to the ninth embodiment;

FIG. 46 illustrates an example of positions where page data are written in the memory device according to a 10th embodiment;

FIG. 51 illustrates components and connections in an address converter according to the 12th embodiment;

FIG. 52 illustrates a state of the address converter according to the 12th embodiment;

FIG. 58 illustrates components and connections in an address converter according to the 13th embodiment;

FIG. 60 illustrates a flow of an input and output signal for data writes in the memory system according to the 13th embodiment;

FIG. 62 illustrates an example of positions where page data are written as recognized by the memory controller according to the 13th embodiment;

FIG. 66 illustrates functional blocks of a memory controller according to a 14th embodiment;

FIG. 68 illustrates a first example of the state of a command queue during operations over time in the memory system according to the 14th embodiment;

FIG. 69 illustrates a second example of the state of a command queue during operations over time in the memory system according to the 14th embodiment;

FIG. 70 illustrates a third example of the state of a command queue during operations over time in the memory system according to the 14th embodiment;

FIG. 73 illustrates a first example of positions where page data are written in the memory devices according to the 15th embodiment;

FIG. 74 illustrates a second example of positions where page data are written in the memory devices according to the 15th embodiment; and FIG. 75 illustrates a third example of positions where page data are written in the memory devices according to the 15th embodiment.

DETAILED DESCRIPTION

Figure 1:
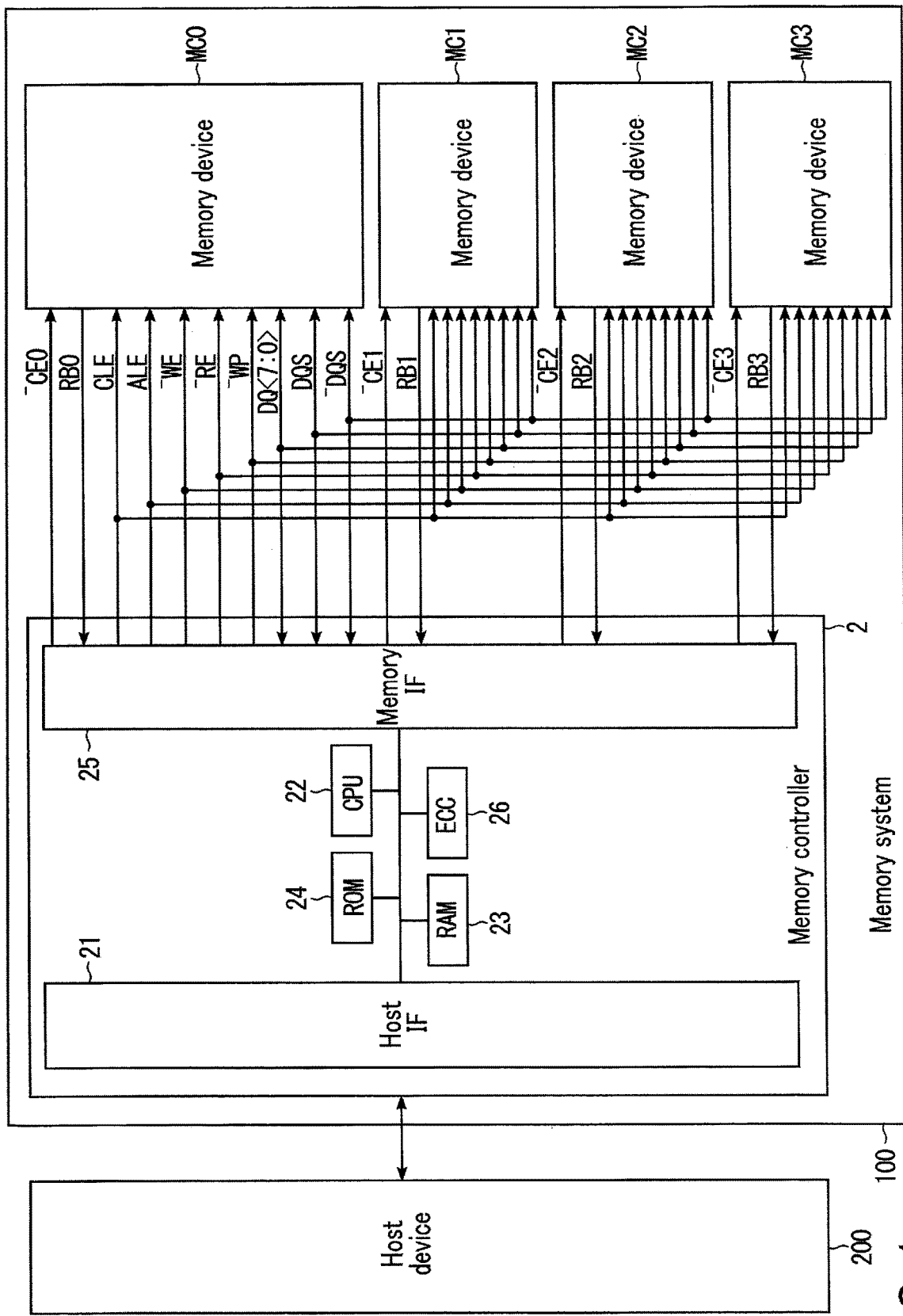
FIG. 1 illustrates components and connections in a memory system according to a first embodiment, and related components.

In general, according to one embodiment, a memory system includes n (where n is a natural number equal to or greater than 2) memory cells, each capable of storing j (where j is a natural number equal to or greater than 2) bits of data; and a controller. The controller is configured to write a first portion of each of first data to n-th data from among n×j data with consecutive logical addresses to the n memory cells one by one. The first data has a lowest logical address among the n×j pieces of data. The first data to the n-th data have ascending consecutive logical addresses. The controller is configured to write the first portion of one of the first to n-th data to as first bit of the j bits, and write the first portion of another one of the first to n-th data except said one of the first to n-th data as a second bit of the j bits.

Embodiments will now be described with reference to the figures. In the following description, components with substantially the same functionalities and configurations will be referred to with the same reference numerals, and repeated descriptions may be omitted. The entire description for a particular embodiment also applies to another embodiment unless it is explicitly mentioned otherwise or obviously eliminated.

Each functional block can be implemented as hardware, computer software, or combination of the both. For this reason, in order to clearly illustrate that each block can be any of hardware, software or combination thereof, descriptions will be made in terms of their functionalities in general. It is not necessary that functional blocks are distinguished as in the following examples. For example, some of the functions may be implemented by functional blocks different from those illustrated below. Furthermore, an illustrated functional block may be divided into functional sub-blocks.

Moreover, any step in a flow of a method of an embodiment is not limited to any illustrated order, and can occur in an order different from an illustrated order and/or can occur concurrently with another step.

In the specification and the claims, a phrase of a particular first component being "coupled" to another second component includes the first component being coupled to the second component either directly or via one or more components which are always or selectively conductive.

First Embodiment

<1.1. Structure (Configuration)>

FIG. 1 illustrates components and connections in a memory system according to a first embodiment, and related components. As illustrated in FIG. 1, a memory system 100 includes two or more memory devices MC and a memory controller 2. The memory system 100 may be a solid-state drive (SSD) or an SD(TM) card, for example. As an example, FIG. 1 and the following description are based on an example in which the memory system 100 includes four memory devices MC, namely memory devices MC0, MC1, MC2, and MC3. The memory devices MC may be semiconductor memory chips, for example.

The memory controller 2 is connected to the memory devices MC. The memory controller 2 receives requests from a host device 200, and operates on the basis of the request from the host device 200 to control the memory devices MC. The memory controller 2 controls the memory devices MC on the basis of the requests from the host device 200, for example. Specifically, the memory controller 2 writes data in the memory devices MC and reads data from the memory devices MC.

The memory controller 2 is connected to the memory devices MC through a NAND bus. The NAND bus transfers a plurality of types of control signals and an 8-*bit* input and output signal DQ. Some types of control signals among the plurality of types of control signals as well as the input and output signal DQ are shared by the memory devices MC0, MC1, MC2, and MC3. On the other hand, other control signals are provided individually for each memory device MC. The control signals include signals ⁻CE, CLE, ALE, ⁻WE, ⁻RE, and ⁻WP, data strobe signals DQS and DQS, and a ready/busy signal RB. The sign "⁻" denotes inverted logic, and indicates that a signal denoted by "⁻" is asserted when at a low level. The ready/busy signal RB is prepared individually for each memory device MC, or in other words, the ready/busy signal RB includes ready/busy signals RB0, RB1, RB2, and RB3 that respectively correspond to the memory devices MC0, MC1, MC2, and MC3. A chip enable signal ⁻CE is prepared individually for each memory device MC, or in other words, the chip enable signal CE includes chip enable signals ⁻CE0, ⁻CE1, ⁻CE2, and ⁻CE3 that respectively correspond to the memory devices MC0, MC1, MC2, and MC3.

When asserted, the chip enable signals ⁻CE0, ⁻CE1, ⁻CE2, and ⁻CE3 enable the memory devices MC0, MC1, MC2, and MC3, respectively. An asserted signal CLE informs a memory device MC that the input and output signal DQ that is input into that memory device MC in parallel to that signal CLE is a command. An asserted signal ALE informs a memory device MC that the input and output signal DQ that is input into that memory device MC in parallel to that signal ALE is an address signal. An asserted signal ⁻WE instructs the memory device MC to fetch the input and output signal DQ that are input into the memory device 1 in parallel to the signal ⁻WE. An asserted signal ⁻RE instructs a memory device MC to output the input and output signal DQ. The ready/busy signals RB0, RB1, RB2, and RB3 indicate whether the memory device MC that outputs respective signals is in a ready state or a busy state. The busy state is indicated by the low level. The memory device MC accepts commands from the memory controller 2 in the ready state, while it does not accept any commands from the memory controller 2 in the busy state.

The input and output signal DQ has a width of 8 bits, and includes information such as a command (CMD), write data or read data (DAT), an address (Add), and a status (STA). The notation "DQ" suffixed by "<M:0>" (where M is a natural number) indicates that the corresponding signal has bits from the 0th bit to the Mth bit.

The data strobe signals DQS and ⁻DQS designate the timing of capturing the input and output signal DQ.

<1.1.1. Memory Controller>

FIG. 1 also illustrates a hardware configuration of the memory controller 2. As illustrated in FIG. 1, the memory controller 2 includes a host interface 21, a central processing unit (CPU) 22, a random access memory (RAM) 23, a read only memory (ROM) 24, a memory interface 25, and an error correction circuit (error correction code, or ECC) 26. The memory controller 2 executes various operations and some of the functions of the host interface 21 and the memory interface 25 by the CPU 22 executing firmware (or, programs) stored in the ROM 24 and loaded in the RAM 23. The firmware is configured such that the memory controller 2 can be made to perform the operations described as each of the embodiments herein. With this arrangement, a data manager 211, a read controller 212, and a write controller 213 described later are configured to operate as described in each of the embodiments.

The host interface 21 is connected to the host device 200 through a bus, and manages communication between the memory controller 2 and the host device 200. The memory interface 25 is connected to the memory devices MC and manages communication between the memory controller 2 and the memory devices MC.

The error correction circuit (ECC circuit) 26 encodes data that will be written to the memory devices MC. Also, the error correction circuit 26 decodes data read from the memory devices MC. The encoding and decoding are processes necessary for detecting and correcting errors. Specifically, the error correction circuit 26 performs error-correcting coding processes on the data that will be written to the memory devices MC (substantial write data). Depending on the method of generating the error-correcting code, data that is different from the substantial write data containing the information for error correction by the error-correcting coding may be generated. Data containing redundant data after the error-correcting coding is written to the memory devices MC as the write data. Also, in the error-correcting decoding process, the error correction circuit 26 detects errors in the data read from the memory devices MC, and if errors exist, attempts to correct the errors.

FIG. 2 illustrates functional blocks of the memory controller 2 according to the first embodiment. Each functional block is realizable by operations by the CPU 22 following firmware in the RAM 23, a portion of the memory space in the RAM 23, and/or dedicated hardware (or, a circuit).

As illustrated in FIG. 2, the memory controller 2 includes a data manager 211, a read controller 212, and a write controller 213. The data manager 211 manages logical addresses of data supplied from the host device 200 and positions (or, physical addresses) of the data in the memory devices MC. For this purpose, the data manager 211 includes an address conversion table 221.

The read controller 212 executes a process for reading data from the memory devices MC, on the basis of commands received from the host device 200 for example. Specifically, when requested to read particular data in the memory system 100 from the host device 200 for example, the read controller 212 references the logical address of the read-requested data and the address conversion table 221 to determine the physical address where the read-requested data is stored. The read controller 212 transmits a command set giving an instruction to read data from the determined physical address to the memory device MC through the memory interface 25.

The write controller 213 executes a process for writing data to the memory devices MC, on the basis of a command received from the host device 200 for example. Specifically, when requested to store certain data in the memory system 100 from the host device 200 for example, the write controller 213 determines the position in the memory device MC where the data that should be written (or, write data) is to be written, and stores the relationship between the logical address of the write data and the physical address of the write position in the address conversion table 221. Subsequently, the write controller 213 transmits a command set giving an instruction to write the write data to the determined physical address to the memory device MC through the memory interface 25.

<1.1.2. Memory Device>

Figure 3:
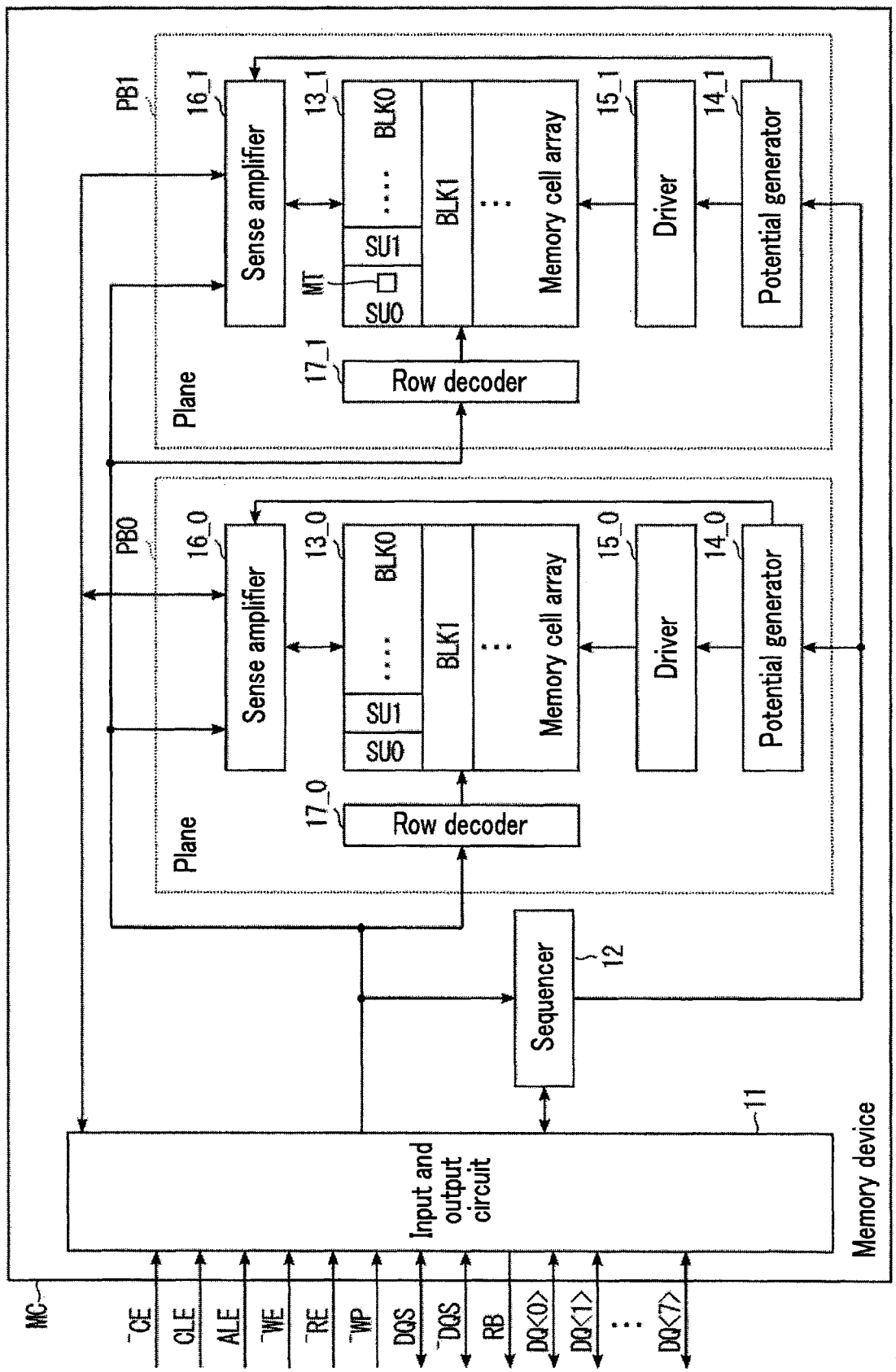
FIG. 3 illustrates components and connections in a memory device according to the first embodiment.

FIG. 3 illustrates functional blocks of the memory devices MC according to the first embodiment. Each memory device MC includes the functional blocks illustrated in FIG. 3. Each memory device MC includes components such as a plurality of planes (PB0 and PB1), an input and output circuit 11, and a sequencer 12. FIG. 3 illustrates an example in which the memory device MC includes two planes PB0 and PB1, but the first embodiment is not limited to this example, and three or more planes PB may also be provided.

The input and output circuit 11 is connected to the memory controller 2 through the NAND bus. The sequencer 12 receives commands and address signals from the input and output circuit 11, and controls the planes PB on the basis of the commands and address signals.

The planes PB are independent of each other, and can execute data read, write, and erase operations independently of each other. Each plane PB includes a memory cell array 13, a potential generator 14, a driver 15, a sense amplifier 16, and a row decoder 17. In other words, the plane PB0 includes a memory cell array 13_0, a potential generator 14_0, a driver 15_0, a sense amplifier 16_0, and a row decoder 17_0. The plane PB1 includes a memory cell array 13_1, a potential generator 14_1, a driver 15_1, a sense amplifier 16_1, and a row decoder 17_1.

Each memory cell array 13 includes a plurality of memory blocks (or, blocks) BLK (i.e., BLK0, BLK1, . . . ). Different planes PB include blocks BLK with different addresses. Each block BLK is a set of a plurality of string units SU (i.e., SU0, SU1, . . . ). Each string unit SU is a set of a plurality of NAND strings (or, strings) STR (i.e., STR0, STR1, . . . ), which are not illustrated. Each string STR includes a plurality of memory cell transistors MT.

The potential generator 14 generates various potentials necessary for various operations, including data write, read, and erase operations, under control by the sequencer 12. The potential generators 14_0 and 14_1 can operate independently of each other and generate potentials independently of each other.

The driver 15 receives a plurality of potentials from the potential generator 14 belonging to the same plane PB (or, corresponding potential generator 14), and supplies one or more potentials selected from among the received potentials to the corresponding row decoder 17. The row decoder 17 receives various potentials from the driver 15, receives an address signal from the input and output circuit 11, and transfers the potentials from the corresponding driver 15 to a block BLK selected on the basis of the received address signal from among the corresponding memory cell array 13.

The sense amplifier 16 senses the states of the memory cell transistors MT in the corresponding memory cell array 13, and on the basis of the sensed states, generates read data and transfers write data to the memory cell transistors MT.

<1.1.3. Memory Cell Array>

Figure 4:
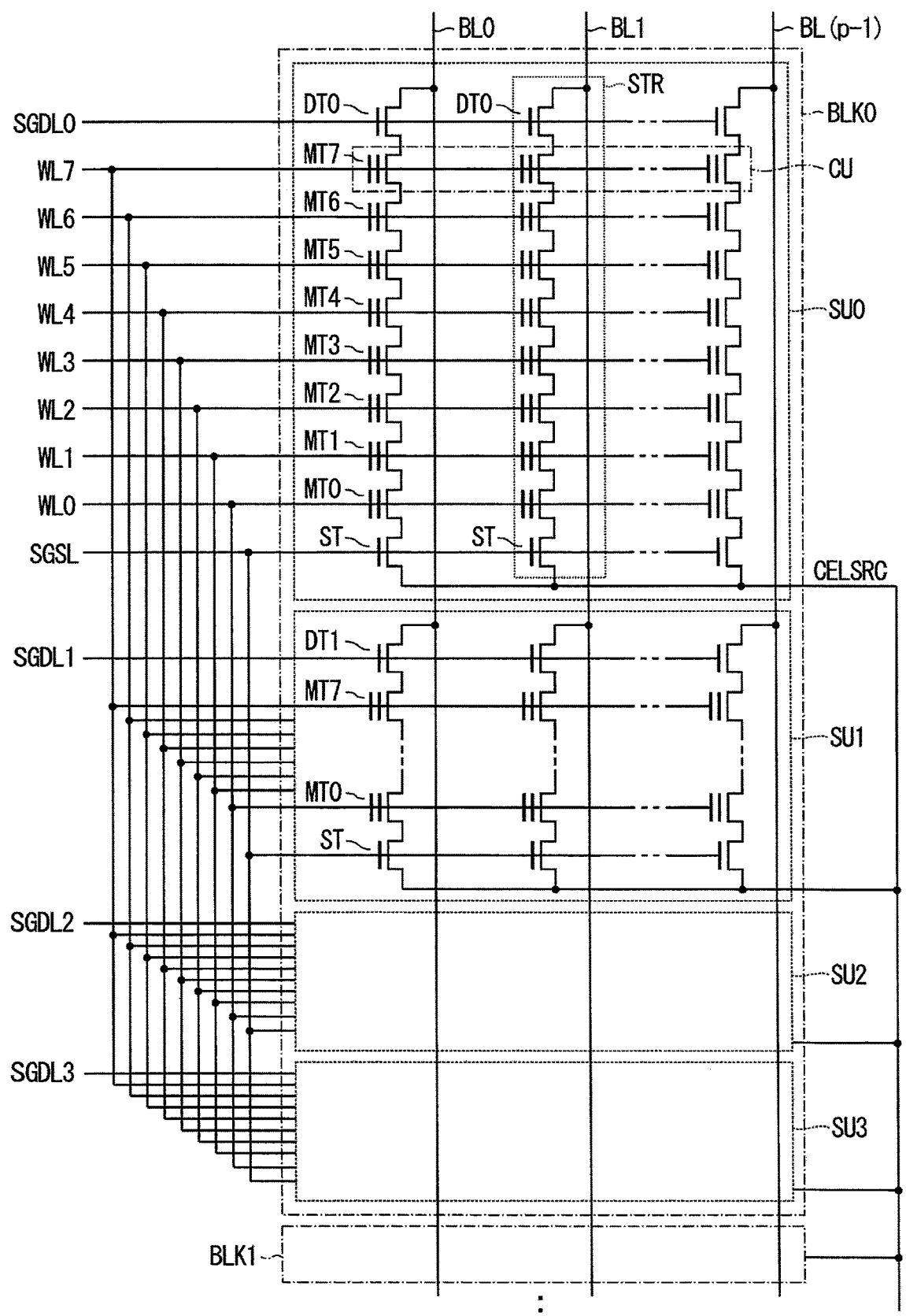
FIG. 4 illustrates an example of several components and connections in a memory cell array according to the first embodiment.

FIG. 4 illustrates an example of several components and connections in the memory cell array 13 according to the first embodiment, illustrating the components and connections of a single block BLK0, and related components. A plurality of the blocks BLK, such as all of the blocks BLK for example, include all of the components and connections illustrated in FIG. 4.

One block BLK includes a plurality of (for example, four) string units SU0 to SU3.

In each block BLK, each of p (where p is a natural number) bit lines BL0 to BL(p−1) is connected to one string STR from each of the string units SU0 to SU3.

Each string STR includes one select gate transistor ST, a plurality of (eight in the figure as an example) memory cell transistors MT such as MT0 to MT7, and one select gate transistor DT such as DT0, DT1, DT2, or DT3. The transistors ST, MT, and DT are serially coupled in this order between a source line CELSRC and one bit line BL. A memory cell transistor MT includes a control gate electrode (word line WL) and a charge storage layer insulated from the surroundings, and can store data in a nonvolatile manner based on the amount of charge in the charge storage layer.

Strings STR respectively coupled to different bit lines BL make one string unit SU. In each string unit SU, the control gate electrodes of the memory cell transistors MT0 to MT7 are respectively coupled to word lines WL0 to WL7. A set of memory cell transistors MT sharing a word line WL in one string unit SU is referred to as a cell unit (or, memory cell set) CU. Also, the gate electrodes of the respective select gate transistors DT of the plurality of strings STR in each string unit SU are coupled to each other.

The transistors DT0 to DT3 (in FIG. 4, DT2 and DT3 are not illustrated) belong to the string units SU0 to SU3, respectively. The gate of the transistor DT0 of each of the plurality of strings STR in the string unit SU0 is coupled to a select gate line SGDL0. Similarly, the gates of the transistors DT1, DT2, and DT3 of each of the plurality of strings STR in each of the string units SU1, SU2, and SU3 are coupled to select gate lines SGDL1, SGDL2, and SGDL3.

<1.1.4. Cell Transistors>

Figure 5:
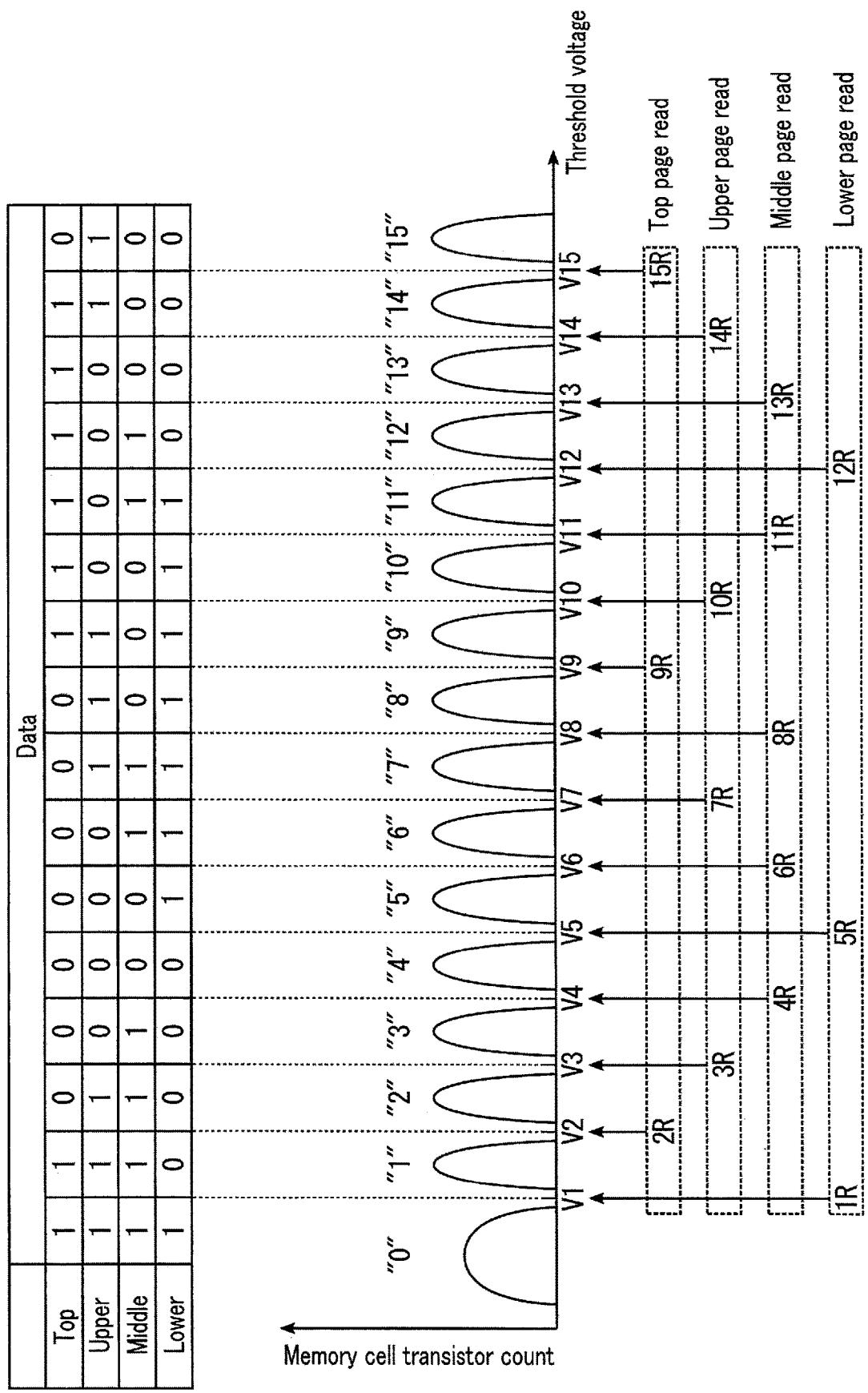
FIG. 5 illustrates a mapping between a threshold voltage distribution of memory cell transistors and data according to the first embodiment.

FIG. 5 will be referenced to describe the memory cell transistors MT. Each memory device MC can store two or more bits of data in each of the memory cell transistors MT. FIG. 5 illustrates a mapping between a threshold voltage distribution of memory cell transistors MT that store four bits of data per memory cell transistor MT and data in the memory system according to the first embodiment. The threshold voltage of each memory cell transistor MT has a magnitude according to the stored data. In the case of storing four bits per memory cell transistor MT, each memory cell transistor MT can be in a state corresponding to a threshold voltage from among 16 states. The 16 states are referred to as the "0", "1", "2", "3", "4", "5", "6", "7", "8", "9", "10", "11", "12", "13", "14", and "15" states. Memory cell transistors MT in the "0" state, "1" state, "2" state, "3" state, "4" state, "5" state, "6" state, "7" state, "8" state, "9" state, "10" state, "11" state, "12" state, "13" state, "14" state, and "15" state have threshold voltages ascending in that order. The "0" state corresponds to the erase state.

By a data write, a write-target memory cell transistor MT may be kept in the "0" state or changed to any of the "1" state, "2" state, "3" state, "4" state, "5" state, "6" state, "7" state, "8" state, "9" state, "10" state, "11" state, "12" state, "13" state, "14" state, or "15" state, on the basis of the data to be written. A memory cell transistor MT in the "0" state is a memory cell transistor MT whose threshold voltage is not raised even after a data write, but in the following, an operation in which a memory cell transistor MT is kept in the "0" state by a data write is also referred to as a write.

Four bits of data are assignable in any format to each state. In the first embodiment, each state is treated as having the following four-bit data. In the following "ABCD" notation, A, B, C, and D represent the values of the top, upper, middle, and lower bits, respectively.

"0" State: "1111"
"1" State: "1110"
"2" State: "0110"
"3" State: "0010"
"4" State: "0000"
"5" State: "0001"
"6" State: "0011"
"7" State: "0111"
"8" State: "0101"
"9" State: "1101"
"10" State: "1001"
"11" State: "1011"
"12" State: "1010"
"13" State: "1000"
"14" State: "1100"
"15" State: "0100"

Even a plurality of memory cell transistors MT that store identical four-bit data can have different threshold voltages due to variations in the characteristics of the memory cell transistors MT.

In order to determine the data stored in a data-read-target memory cell transistor (selected memory cell transistor) MT, the state of the selected memory cell transistor MT is determined. The range within which the threshold voltage of the selected memory cell transistor MT falls is used to determine the state of the selected memory cell transistor MT. To determine the range of the threshold voltage of the selected memory cell transistor MT, it is determined whether or not the selected memory cell transistor MT has a threshold voltage exceeding a particular read voltage VCGR. The memory cell transistor MT having a threshold voltage equal to or higher than the read voltage VCGR remains OFF even while receiving the read voltage VCGR at its control gate electrode. In contrast to this, the memory cell transistor MT having a threshold voltage lower than the read voltage VCGR remains ON while receiving the read voltage VCGR at its control gate electrode.

The reads for determining whether the selected memory cell transistor MT is in a state above the "0" state, "1" state, "2" state, "3" state, "4" state, "5" state, "6" state, "7" state, "8" state, "9" state, "10" state, "11" state, "12" state, "13" state, and "14" state are referred to as 1R (read), 2R, 3R, 4R, 5R, 6R, 7R, 8R, 9R, 10R, 11R, 12R, 13R, 14R, and 15R, respectively. In 1R, 2R, 3R, 4R, 5R, 6R, 7R, 8R, 9R, 10R, 11R, 12R, 13R, 14R, and 15R, read voltages V1, V2, V3, V4, V5, V6, V7, V8, V9, V10, V11, V12, V13, V14, and V15 may be used, respectively. The read voltages V1, V2, V3, V4, V5, V6, V7, V8, V9, V10, V11, V12, V13, V14, and V15 have default magnitudes, for example.

The read voltage V1 is higher than the highest threshold voltage of the memory cell transistor MT in the "0" state, and lower than the lowest threshold voltage of the memory cell transistor MT in the "1" state immediately after being written.

Similarly, for each of the cases of a (where a is a natural number) from 2 to 15, the read voltage Vα is higher than the highest threshold voltage of the memory cell transistor MT in the "(α−1)" state immediately after being written, and lower than the lowest threshold voltage of the memory cell transistor MT in the "α" state immediately after being written.

The group of data of the bits at the same positions (or, digits) of the memory cell transistors MT in a cell unit CU forms a page. The group of data of the most-significant (or, first-digit) bits (or, top bits) of the memory cell transistors MT in each cell unit CU is referred to as the top page. The group of data of the second most-significant bits (or, upper bits) of the memory cell transistors MT in each cell unit CU is referred to as the upper page. The group of data of the third most-significant bits (or, middle bits) of the memory cell transistors MT in each cell unit CU is referred to as the middle page. The group of data of the least-significant (or, fourth-digit) bits (or, lower bits) of the memory cell transistors MT in each cell unit CU is referred to as the lower page.

The data of each page is determined by reads using a plurality of read voltages VCGR with different magnitudes. Which magnitudes of the read voltage VCGR to use are determined on the basis of which combinations of four-bit data are mapped to each state from the "0" state to the "15" state. In the example of the mapping to the groups of bits (or, bit sets) of the states in FIG. 5, the state of each bit in the lower page is determined by 1R, 5R, and 12R. In other words, the selected memory cell transistor MT determined to be between the read voltage V1 and the read voltage V5 by 1R and 5R can be determined to be storing 0 in the lower bit. In a similar manner, by using 1R, 5R, and 12R to determine whether each selected memory cell is in the "0" state, in any of the "1", "2", "3", and "4" states, in any of the "5", "6", "7", "8", "9", "10", and "11" states, or in any of the "12", "13", "14", and "15" states, it is possible to determine whether each selected memory cell is storing "0" data or holding "1" data in the lower bit. The use of one or more read voltages to read (or, determine) the data in the lower page of the selected cell unit CU is referred to as a lower page read.

Reads of the middle page, the upper page, and the top page are similar, and are performed as follows based on the example of the mapping of states and bit sets in FIG. 5.

The value of the middle bit of each selected memory cell transistor MT can be determined by 4R, 6R, 8R, 11R, and 13R. The use of one or more read voltages to read the data in the middle page of the selected cell unit CU is referred to as a middle page read.

The value of the upper bit of each selected memory cell transistor MT can be determined by 3R, 7R, 10R, and 14R. The use of one or more read voltages to read the data in the upper page of the selected cell unit CU is referred to as an upper page read.

The value of the top bit of each selected memory cell transistor MT can be determined by 2R, 9R, and 15R. The use of one or more read voltages to read the data in the top page of the selected cell unit CU is referred to as a top page read.

In the mapping of states and bit sets in FIG. 5, three, five, four, and three read voltages VCGR are used for the lower, middle, upper, and top page reads, respectively. Such a mapping is referred to as a "3543 mapping" using the numbers of read voltages VCGR needed for the lower, middle, upper, and top page reads. In other words, the notation "HIJK mapping" (wherein H, I, J, and K are natural numbers) indicates mapping in which H, I, J, and K read voltages VCGR are used for the lower, middle, upper, and top page reads, respectively.

A page whose data can be determined by applying the smallest number of read voltages VCGR may be referred to as a fast page. Also, a page whose data can be determined by applying a number of read voltages VCGR other than the smallest number may be referred to as a non-fast page. In the example of the 3543 mapping in FIG. 5, the lower page and the top page correspond to fast pages, while the middle page and the upper page correspond to non-fast pages.

<1.2. Operations>
<1.2.1. Data Writes>

The memory controller 2 writes data to the memory devices MC as described below.

FIG. 6 illustrates an example of processing data for data writes in the memory controller 2 according to the first embodiment. As illustrated in the uppermost row of FIG. 6, the memory controller 2 receives a request (or, command) to store data of a certain size in the memory system 100, together with the target data of the store request, from the host device 200. The store-request-target data is referred to as the store-requested data.

When received by the memory controller 2, the store-requested data is held in the RAM 23. The write controller 213 generates a plurality of page data from the store-requested data as illustrated in the lowermost row of FIG. 6. Each piece of page data corresponds to one square on the lowermost row of FIG. 6, has a size equal to or less than the size of the page, and the write thereof is managed in data units of the page size. Hereinafter, data of the page size may be simply referred to as page data. When written, the page data corresponds to write data. Each piece of page data to be written (or, write page data) has a logical address assigned by the write controller 213. In the example of FIG. 6, each piece of write page data has a unique logical address from PG0 to PG7. Such generation of a plurality of write page data from store-requested data can be performed according to any method, an example of which is described below.

As illustrated on the second row of FIG. 6, by dividing the store-requested data into a plurality of parts (referred to as data units DU) and performing error-correcting coding on each data unit DU, the write controller 213 generates write page data derived from the data units DU. In the example of FIG. 6, the store-requested data is divided into eight data units DU (DU0 to DU7). The data units DU0 to DU7 can be arranged in that order or arranged at arbitrary positions in the store-requested data. Each data unit DU has a size enabling the set of one data unit DU and redundant data generated for that data unit DU to be equal to or smaller than the page size. The write controller 213 controls the error correction circuit 26 to generate redundant data RD0 to RD7 for each of the data units DU0 to DU7.

The write controller 213 assigns a logical address to the write page data containing the set of each data unit DU and the corresponding redundant data RD. In the example of FIG. 6, the logical address PG0 is assigned to the write page data containing the set of the data unit DU0 and the redundant data RD0. Similarly, for each of the cases of β from 1 to 7, the logical address PGβ, is assigned to the write page data containing the data unit DUβ and the redundant data RDβ. Hereinafter, the write page data assigned the logical address PG0 may be referred to as the write page data (or simply the page data) PG0. Similarly, the write page data assigned the logical address PGz (where z is a natural number) may be referred to as the write page data PGz.

Data processing as illustrated in FIG. 6 can be performed in order of ascending values of z in "DUz" for the data units DU0 to DU7, for example. However, the first embodiment is not limited to this example, and the data units DU0 to DU7 can be processed in any order.

The memory controller 2 (particularly, the write controller 213) writes the write page data PGz to the memory devices MC according to the method described below.

The memory controller 2 writes n pieces of page data PG having consecutive logical addresses one at a time to n planes PB capable of operating independently or to n memory devices MC, and additionally, writes one (first page data) from among the n pieces of page data PG to a certain fast page, and writes the remaining (n−1) pieces of page data PG to pages (fast pages or non-fast pages) other than the page to which the first page data is written. As an example, the write page data PG is written page by page to one cell unit CU, but an embodiment is not strictly limited thereto, and the write page data PG may also be written to only one memory cell transistor of one selected cell unit in one cell unit CU. A specific example according to the first embodiment of a write with features like the above is described below.

Figures 7, 8:
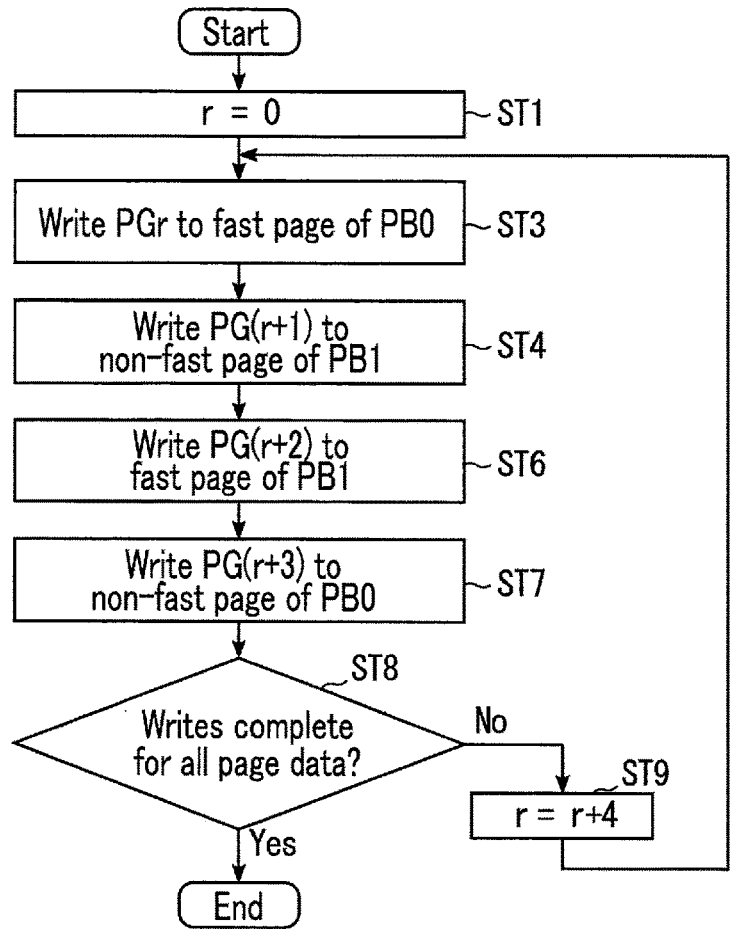
FIG. 7 illustrates a flow of data writes in the memory system according to the first embodiment.
FIG. 8 illustrates an example of positions where page data are written in the memory device according to the first embodiment.

FIG. 7 illustrates a flow of data writes in the memory system 100 according to the first embodiment. Particularly, FIG. 7 illustrates a flow for writing eight pieces of page data PG with consecutive logical addresses as illustrated in FIG. 6 to a certain memory device MCw (where w is 0 or a natural number). Hereinafter, the selected cell unit CU of the plane PBk of the memory device MCw is referred to as the "selected cell unit CUswk".

The eight pieces of page data PG are written to four pages of a selected cell unit CUsw0 in the plane PB0 and four pages of a selected cell unit CUsw1 in the plane PB1 of a certain memory device MC. Hereinafter, the memory device MC0 is used as an example. The area where the page data PG is written is referred to as a memory area unit MA. The addresses of the two selected cell units CUs forming a memory area unit MA (the addresses of the connected word lines WL) may be same or different between the planes PB0 and PB1. Hereinafter, in the current example of a certain number (in this example, eight) of consecutive logical addresses, the memory area unit MA is the set of the lower, middle, upper and top pages of the cell unit CUs00 in the plane PB0 and the lower, middle, upper, and top pages of the cell unit CUs01 in the plane PB1. Hereinafter, the case of writing write page data PG0 to PG7 like in FIG. 6 will be described as an example. The same applies to any other eight pieces of page data PGz to PG(z+7) with consecutive logical addresses, and the write of the page data PG0 to PG7 described below respectively applies.

The write controller 213 divides the plurality of page data PG into a plurality of groups according to the rules described below, and writes the page data PG in each group to the memory devices MC according to the rules described below. Hereinafter, a group of page data PG is referred to as a data set.

The write controller 213 forms a data set from two pieces of page data PG with consecutive logical addresses. Specifically, the write controller 213 forms a data set from page data PGx (where x is 0 or a natural number) and PG(x+1). Subsequently, the write controller 213 writes one of the two pieces of write data in the data set to the plane PB0, and writes the other piece to the plane PB1. Furthermore, the write controller 213 writes the page data PGx having the lower logical address out of the page data PGx and PG(x+1) to a fast page among the four pages, and writes the write page data PG(x+1) having the higher logical address out of the page PGx and PG(x+1) to a non-fast page among the four pages.

As illustrated in FIG. 7, the memory controller 2 sets a parameter r to the lowest logical address among the plurality of page data PG that will be written to a single memory area unit MA (step ST1). In the example illustrated in FIG. 7, r is set to 0. The write controller 213 writes the data set of the page data PGr and PG(r+1). The write of a data set is repeated multiple times, and in the first loop, r is 0. First, the write controller 213 writes the page data PGr to a free (or, erased) fast page of the plane PB0 in the memory area unit MA (step ST3). Next, the write controller 213 writes the page data PG(r+1) to a free non-fast page of the plane PB1 in the memory area unit MA (step ST4). The write controller 213 writes the data set of the page data PG(r+2) and PG(r+3). Specifically, first, the write controller 213 writes the page data PG(r+2) to a free fast page of the plane PB1 in the memory area unit MA (step ST6). Next, the write controller 213 writes the page data PG(r+3) to a free non-fast page of the plane PB0 in the memory area unit MA (step ST7).

The write controller 213 determines whether or not the write of all of the page data PG that will be written to the memory area unit MA has been completed (step ST8). In this example, it is determined whether r=7. If completed (Yes branch), the flow in FIG. 7 ends. If the write of all page data PG has not been completed (No branch), the process proceeds to step ST9.

In step ST9, the write controller 213 sets r=r+4. In other words, 4 is added to the current value of r. Step ST9 continues to step ST3.

FIG. 8 illustrates an example of positions where the page data PG is written in the memory device MC according to the first embodiment. Specifically, FIG. 8 illustrates an example of the positions where the page data PG is written by the write in FIG. 7, and illustrates the memory device MC0 as an example.

As illustrated in FIG. 8, the page data PG0 is written to a fast page, such as the lower page for example, of the plane PB0, while the page data PG1 is written to a non-fast page, such as the middle page for example, of the plane PB1.

The page data PG2 is written to a fast page, such as the lower page for example, of the plane PB1, while the page data PG3 is written to a non-fast page, such as the middle page for example, of the plane PB0.

The page data PG4 is written to a fast page, such as the top page for example, of the plane PB0, while the page data PG5 is written to a non-fast page, such as the upper page for example, of the plane PB1.

The page data PG6 is written to a fast page, such as the top page for example, of the plane PB1, while the page data PG7 is written to a non-fast page, such as the upper page for example, of the plane PB0.

The write in FIG. 8 is an example, and the first embodiment is not limited to this example. For example, page data having a lower logical address (for example, the page data PG0 and/or PG2) may be written to the top page, while the page data PG1 and PG3 may be written to the upper page. In this case, page data having a higher logical address (for example, the page data PG4 and/or PG5) may be written to the lower page, while the page data PG6 and PG7 may be written to the middle page.

Figure 9:
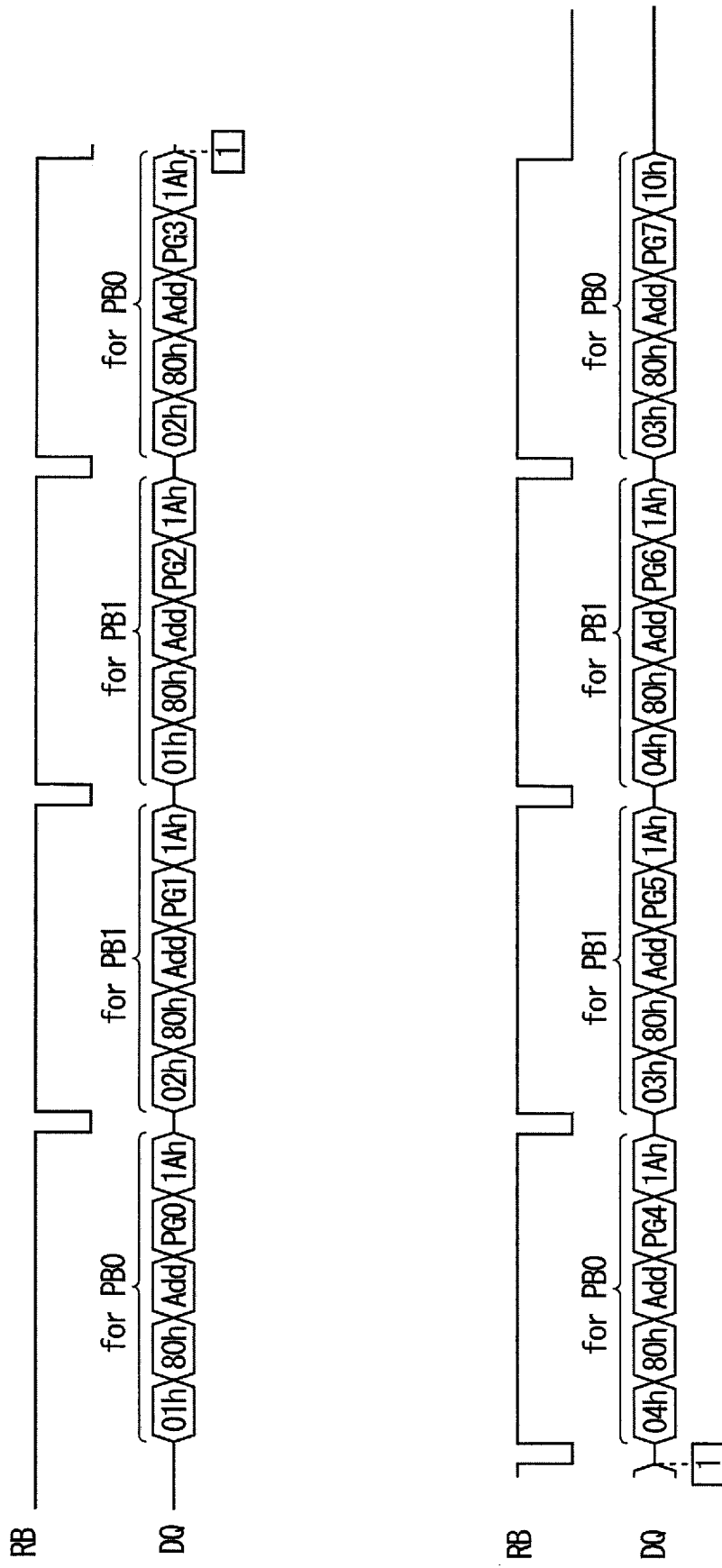
FIG. 9 illustrates a flow of an input and output signal for data writes and ready/busy states in the memory system according to the first embodiment.

FIG. 9 illustrates a flow of the input and output signal DQ for data write and ready/busy states in the memory system 100 according to the first embodiment. More specifically, FIG. 9 illustrates an example of the input and output signal DQ flowing from the memory controller 2 to the memory device MC0 for performing the data write in FIG. 8.

For example, the memory controller 2 instructs the memory device MC0 to write the page data PG0 to PG7 in order of ascending logical address. FIG. 9 is based on this example.

As illustrated in FIG. 9, first, the memory controller 2 transmits the signal DQ for writing the page data PG0. In other words, the memory controller 2 transmits the page data PG0 and a command set giving an instruction to write the page data PG0 to the lower page of the selected cell unit CUs00 of the plane PB0. For this purpose, the memory controller 2 transmits a command 01*h*, a command 80*h*, an address Add, the page data PG0, and a command 1Ah, in that order, for example. The command 01*h* designates the lower page. In other words, the command 01*h* designates that the target of the instruction indicated by the set of commands following the command 01*h* is the lower page. The command 80*h* indicates a write, and the command 1Ah indicates that the data that will be written to the selected cell unit CUs follows. The address Add designates the plane PB0 while also designating the block BLK and string unit SU containing the cell unit CUs00 as well as the word line (selected word line) WL coupled to the cell unit CUs00. The address Add is transmitted over five cycles for example, and is illustrated as one cycle in the diagram. Upon receiving the command 1Ah, the memory device MC0 temporarily enters a busy state, and after that enters a ready state.

Thereafter, the memory controller 2 sequentially transmits signals DQ for writing the page data PG1 to PG7 in a similar manner to the signal DQ for writing the page data PG0. The differences between the signals DQ for writing the page data PG1 to PG7 and the signal DQ for writing the page data PG0 are the designated plane PB, the designated page, and the page data PG. The differences between the signal DQ for writing the page data PG7 and the signal DQ for writing the page data PG0 are the designated plane PB and the designated page data, and in addition, a command 10*h* is included instead of the command 1Ah. To designate the middle page, the upper page, and the top page, the memory controller 2 transmits the commands 02*h*, 03*h*, and 04*h*, respectively, instead of the command 01*h*.

Specifically, to write the page data PG1, the memory controller 2 transmits the page data PG1 and a command set giving an instruction to write the page data PG1 to the middle page of the plane PB1.

After transmitting the signal DQ for writing the page data PG1, the memory controller 2 transmits the page data PG2 and a command set giving an instruction to write the page data PG2 to the lower page of the plane PB1.

After transmitting the signal DQ for writing the page data PG2, the memory controller 2 transmits the page data PG3 and a command set giving an instruction to write the page data PG3 to the middle page of the plane PB0.

After transmitting the signal DQ for writing the page data PG3, the memory controller 2 transmits the page data PG4 and a command set giving an instruction to write the page data PG4 to the top page of the plane PB0.

After transmitting the signal DQ for writing the page data PG4, the memory controller 2 transmits the page data PG5 and a command set giving an instruction to write the page data PG5 to the upper page of the plane PB1.

After transmitting the signal DQ for writing the page data PG5, the memory controller 2 transmits the page data PG6 and a command set giving an instruction to write the page data PG6 to the top page of the plane PB1. The memory device MC0 receives the command 10h in the command set designating the write of the page data PG6, and writes the page data PG0, PG3, PG4, and PG7 to the cell unit CUs00 of the plane PB0.

After transmitting the signal DQ for writing the page data PG6, the memory controller 2 transmits the page data PG7 and a command set giving an instruction to write the page data PG7 to the upper page of the plane PB0. When the memory device MC0 receives the command 10h in the command set designating the write of the page data PG7, the memory device MC0 writes the page data PG1, PG2, PG5, and PG6 to the cell unit CUs00 of the plane PB1. During the writes, the memory device MC0 stays in the busy state. When the writes is completed, the memory device MC0 returns to the ready state.

<1.2.2. Data Read>

Figure 10:
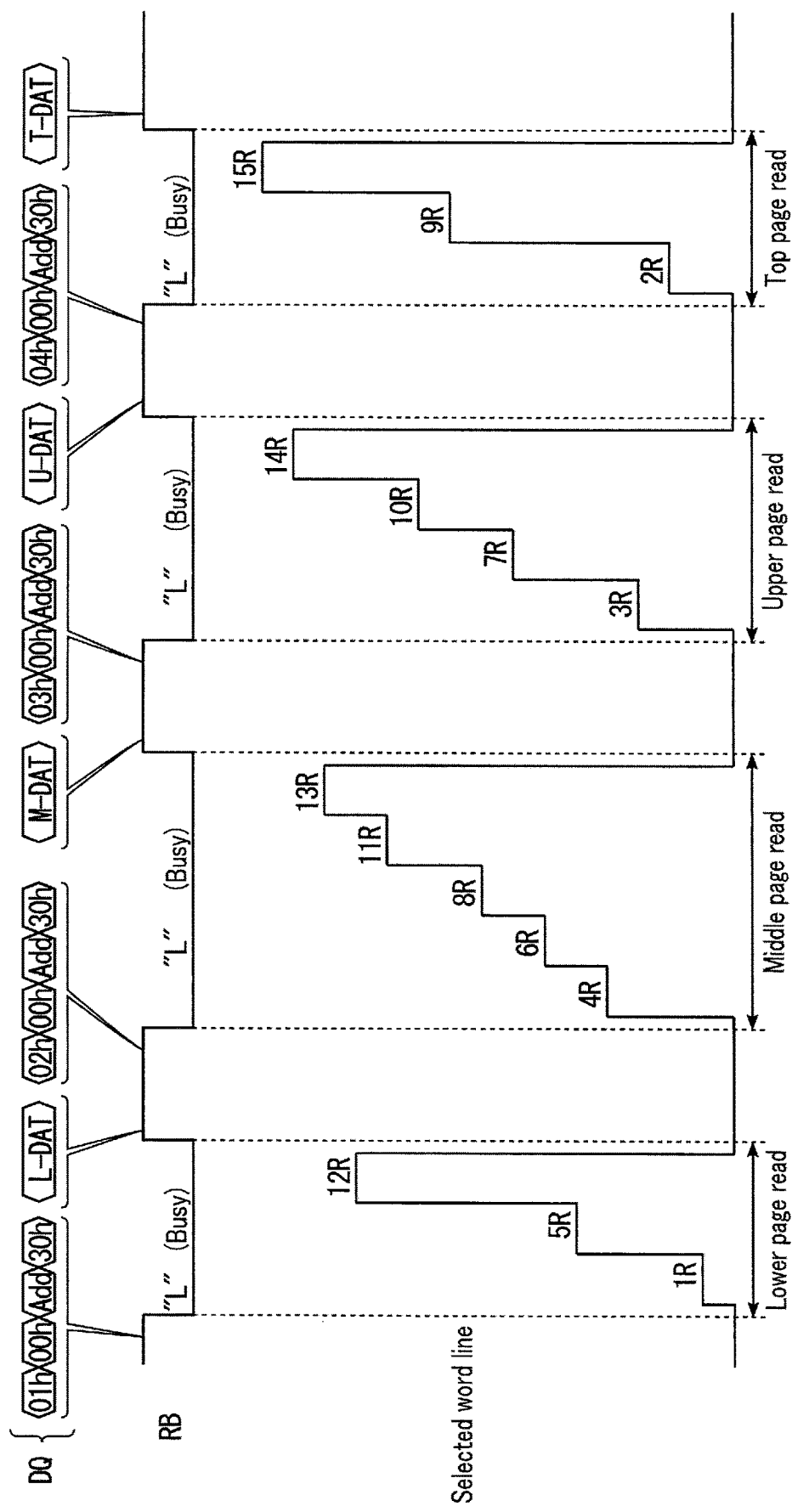
FIG. 10 illustrates an input and output signal, a ready/busy signal, and the potential of a selected word line over time in a data read in the memory system according to the first embodiment.

FIG. 10 illustrates the input and output signal DQ, the ready/busy signal RB, and the potentials of the selected word lines WL over time in data reads in the memory system 100 according to the first embodiment. FIG. 10 successively illustrates data reads from the lower page, the middle page, the upper page, and the top page of the selected cell unit CUs in a certain plane PB. However, FIG. 10 is intended to merely illustrate data reads from the lower page, the middle page, the upper page, and the top page of the selected cell unit CUs, and the illustrated order of the data-read-target pages has no significance.

As illustrated in FIG. 10, to read from the lower page, the memory controller 2 transmits a command set giving an instruction to read data from the lower page of the selected cell unit CUs. For this purpose, the memory controller 2 transmits the command 01h, a command 00h, the address Add, and a command 30h, in that order, for example. The command 00h declares that the transmission of an address follows, and the command 30h gives an instruction to read data from the page of the designated address. An address Add designates the plane PB, the block BLK and string unit SU that contain the selected cell unit CUs, and the selected word line WL. Upon receiving the command 30h, the memory device MC starts a lower page read.

To read data from the designated page, the memory device MC applies a plurality of read voltages VCGR determined according to the designated page to the selected word line WL. Subsequently, the memory device performs a single-level reads using respective read voltages VCGR, and hold the results in the latch in the sense amplifier 16. A single-level read refers to obtaining a set of one-bit data determined on the basis of whether or not the selected memory cell transistor MT has a threshold voltage equal to or higher than the read voltage VCGR. By taking a single-level read at each read voltage VCGR, a result of the single-level read with the read voltage VCGR is obtained, and by performing logical operations on the single-level read data respectively based on the plurality of single-level reads obtained in this way, page data is obtained. Details are as follows.

As illustrated in FIG. 10 and also described with reference to FIG. 5, to perform a lower page read, the memory device MC successively applies the read voltages V1, V5, and V12. The memory device MC performs a single-level read (1R, 5R, or 12R) while each of the read voltages V1, V5, and V12 is applied, holds the results in a data latch, and performs logical operations on the results of the single-level reads to obtain the lower page data. The memory device MC, following an instruction (the signal ⁻RE) from the memory controller 2, transmits the obtained lower page data (L-DAT) to the memory controller 2.

The middle page read, the upper page read, and the top page read are similar. For the middle page read, the memory device MC successively applies the read voltages V4, V6, V8, V11, and V13. The memory device MC performs a single-level read (4R, 6R, 8R, 11R, or 13R) while corresponding one of the read voltages V4, V6, V8, V11, and V13 is applied, holds the results in a data latch, and performs logical operations on the results of the single-level reads to obtain the middle page data. The memory device MC, following an instruction from the memory controller 2, transmits the obtained middle page data (M-DAT) to the memory controller 2.

For the upper page read, the memory device MC successively applies the read voltages V3, V7, V10, and V14. Additionally, the memory device MC performs a single-level read (3R, 7R, 10R, or 14R) while corresponding one of the read voltages V3, V7, V10, and V14 is applied, holds the results in a data latch, and performs logical operations on the results of the single-level reads to obtain the upper page data. The memory device MC, following an instruction from the memory controller 2, transmits the obtained upper page data (U-DAT) to the memory controller 2.

For the top page read, the memory device MC successively applies the read voltages V2, V9, and V15. The memory device MC performs a single-level read (2R, 9R, or 15R) while corresponding one of the read voltages V2, V9, and V15 is applied, holds the results in a data latch, and performs logical operations on the results of the single-level reads to obtain the top page data. The memory device MC, following an instruction from the memory controller 2, transmits the obtained top page data (T-DAT) to the memory controller 2.

FIG. 11 illustrates an example of a flow of data reads in the memory system 100 according to the first embodiment. Particularly, FIG. 11 illustrates a data read from one memory area unit MA of a certain memory device MC. The memory area unit MA is inside the memory device MC0, for example.

As illustrated in FIG. 11, in step ST11, the memory controller 2 transmits a command set giving an instruction to read page data PGt (where t is 0 or an even natural number) to the memory device MC0. When the memory device MC0 receives the command set, the memory device MC0 in step ST12 starts the read of the page data PGt.

In step ST13, the memory controller 2 instructs the memory device MC to read the page data PG(t+1). When the memory device MC0 receives the command set, the memory device MC0 in step ST14 starts the read of the page data PG(t+1).

In step ST16, the read of the page data PGt in the memory device MC0 is completed. In step ST17, the memory controller 2 instructs the memory device MC0 to output the page data PGt.

In step ST18, the read of the page data PG(t+1) in the memory device MC0 is completed. In step ST19, the memory controller 2 instructs the memory device MC0 to output the page data PG(t+1).

In step ST21, the memory controller 2 determines whether data reads from all pages in the read-target memory area unit MA have been completed. In the current example, this determination corresponds to determining whether t is 7.

In the case where the data reads from all pages in the read-target memory area unit MA have not been completed (No branch), the memory controller 2 sets t=t+2 in step ST22. Step ST22 continues to step ST11. In the case where the data reads from all pages in the read-target memory area unit MA have been completed (Yes branch), the process ends.

Figure 12:
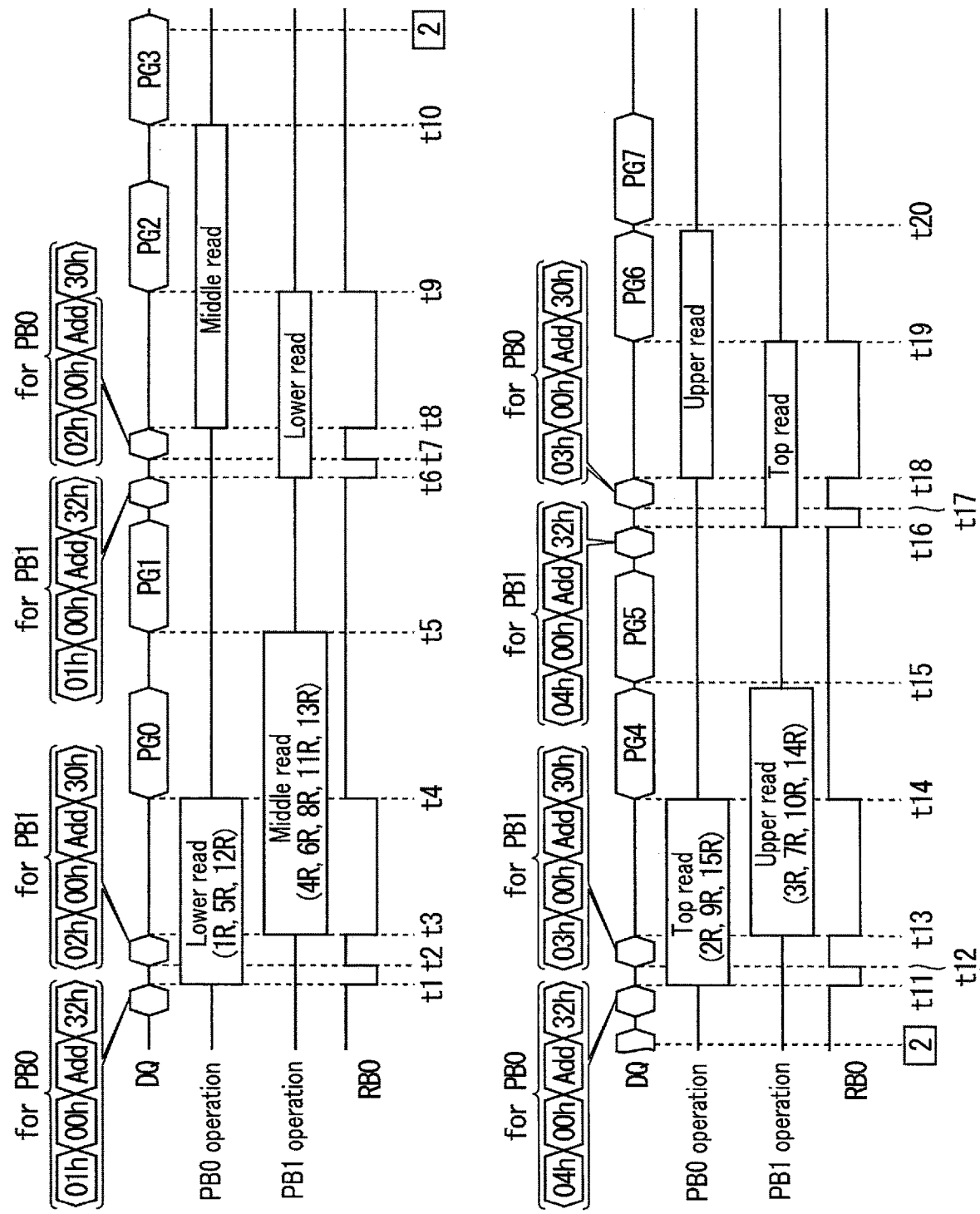
FIG. 12 illustrates the input and output signal during data reads over time in the memory system according to the first embodiment.

FIG. 12 illustrates the flow of the input and output signal DQ during data reads over time in the memory system 100 according to the first embodiment. Particularly, FIG. 12 illustrates the states between the operations in FIG. 11, and illustrates reads from the memory area unit MA, or in other words, data reads from the four pages of each of the selected cell units CUs00 and CUs01, which are respectively from the plane PB0 and the plane PB1.

The memory controller 2 reads data in units of data sets from a memory area unit MA, and reads some page data PG in parallel from each data set. Data sets can be read in any order, but reads can be performed in order of ascending logical address of the page data PG for example. Hereinafter, a specific example is described.

As illustrated in FIG. 12, the memory controller 2 instructs the memory device MC0 to read the data sets of the page data PG0 and PG1 in parallel. For this purpose, the memory controller 2 transmits a command set giving an instruction for a lower page read to the selected cell unit CUs00 of the plane PB0, and also transmits a command set giving an instruction for a middle page read to the selected cell unit CUs01 of the plane PB1. The lower page read with respect to the selected cell unit CUs00 of the plane PB0 and the middle page read with respect to the selected cell unit CUs01 of the plane PB1 are performed in parallel. The transmitted command sets give an instruction for such a parallel read (multi-plane read) from the planes PB0 and PB1.

As an example, the memory controller 2 transmits a command set giving an instruction for a multi-plane read of the data in the lower page of the selected cell unit CUs00 of the plane PB0. Such a command includes the command 01$h$ specifying the lower page, the command 00$h$, the address Add specifying the read-target plane PB0 and selected cell unit CUs00, and the command 32$h$, for example. The command 32$h$ indicates that a command set for a multi-plane read follows. Upon receiving the command set, the memory device MC0 enters the busy state from a time t1. Because the command set indicates the data read indicated by the command set as well as indicating that a command set for a multi-plane read follows, after entering the busy state for a short time from the time t1, the memory device MC0 returns to the ready state at a time t2.

Also, in response to the receipt of the command set by the time t1, the memory device MC0 starts a lower page read (in the diagram, "lower read") with respect to the selected cell unit CUs00 of the plane PB0 from the time t1. As described above, the lower page read includes 1R, 5R, and 12R.

The memory controller 2 transmits a command set for performing a middle page read as well as a multi-plane read with respect to the selected cell unit CUs01 of the plane PB1 from the time t2. In other words, the memory device MC0 transmits a command set giving an instruction for a middle page read with respect to the selected cell unit CUs01 of the plane PB1 from the time t2. The command set indicates that a command set designating a data read of the target of the multi-plane read does not follow, and includes the command 02$h$ indicating the middle page, the command 00$h$, the address Add, and the command 30$h$, for example. Upon receiving the command set, the memory device MC0 remains in the busy state.

Also, in response to the receipt of the command set by a time t3, the memory device MC0 starts a middle page read (in the diagram, "middle read") with respect to the selected cell unit CUs01 of the plane PB1 from the time t3. The middle page read with respect to the selected cell unit CUs01 of the plane PB1 and the ongoing lower page read with respect to the selected cell unit CUs00 of the plane PB0 are performed in parallel. As described above, the middle page read includes 4R, 6R, 8R, 11R, and 13R.

The lower page read with respect to the selected cell unit CUs00 of the plane PB0 is completed at a time t4, and the lower page data, that is, the page data PG0, can be output from the memory device MC0. The memory device MC0 (particularly, the sequencer 12) detects the completion of the read and enters the ready state from the time t4. The memory controller 2 detects the transition to the ready state, instructs the memory device MC0 to output the page data PG0, and receives the page data PG0. At the time t4, the middle page read in the plane PB1 is not yet completed.

While the page data PG0 is being output, the middle page read in the plane PB1 proceeds. The middle page read is completed at a time t5, and the middle page data, that is, the page data PG1, can be output from the memory device MC0. For example, after the receipt of the page data PG0 is completed, the memory controller 2 transmits a status read command to the memory device MC0 and checks the completion of the middle page read. The status read command is a command instructing the memory device MC to transmit information related to the internal state of the memory device MC. Upon receiving the status read command, the memory device MC can transmit a status indicating whether the process according to the last-received command (in the current example, the middle page read) is completed or not, for example. The memory controller 2 learns of the completion of the middle page read through the status read command, and from a time t5, instructs the memory device MC0 to output the page data PG1, and receives the page data PG1.

Thereafter, in a similar manner to the page data PG0 and PG1, the memory device MC0 performs multi-plane reads of the remaining data sets in the selected cell units CUs00 and CUs01. An overview of this process is described below.

When the receipt of the page data PG1 is completed, the memory controller 2 reads the page data in the next data set in parallel. As an example, the memory controller 2 performs a multi-plane read to read the data set of the page data PG2 and PG3 in parallel. For this purpose, the memory controller 2 transmits a command set giving an instruction for a multi-plane read of the data in the lower page of the selected cell unit CUs01 of the plane PB1, for example. Upon receiving the command set, the memory device MC0 starts a lower page read with respect to the selected cell unit CUs01 of the plane PB1 from a time t6.

The memory controller 2 transmits a command set giving an instruction to perform a multi-plane read of the data in the middle page of the selected cell unit CUs00 of the plane PB0 from a time t7. Upon receiving the command set, the memory device MC0 starts a middle page read with respect to the selected cell unit CUs00 of the plane PB0 from a time t8. The middle page read in the plane PB0 proceeds in parallel with the ongoing lower page read in the plane PB1.

The lower page read in the plane PB1 is completed at a time t9, and the lower page data, that is, the page data PG2, can be output from the memory device MC0. The memory controller 2 instructs the memory device MC0 to output the page data PG2, and receives the page data PG2 from a time t9.

While the page data PG2 is being output, the middle page read in the plane PB0 continues. After that, the middle page read is completed, and the middle page data, that is, the page data PG3, can be output from the memory device MC0. The memory controller 2 uses a status read to learn of the completion of the middle page read, and from a time t10, instructs the memory device MC0 to output the page data PG3, and receives the page data PG3.

When the receipt of the page data PG3 is completed, the memory controller 2 reads the page data in the next data set in parallel. As an example, the memory controller 2 performs a multi-plane read to read the data set of the page data PG4 and PG5 in parallel. For this purpose, the memory controller 2 transmits a command set giving an instruction for a multi-plane read of the data in the top page of the selected cell unit CUs00 of the plane PB0, for example. Upon receiving the command set, the memory device MC0 starts a top page read with respect to the selected cell unit CUs00 of the plane PB0 from a time t11.

The memory controller 2 transmits a command set giving an instruction to perform a multi-plane read of the data in the upper page of the selected cell unit CUs01 of the plane PB1 from a time t12. Upon receiving the command set, the memory device MC0 starts an upper page read with respect to the selected cell unit CUs01 of the plane PB1 from a time t13. The upper page read in the plane PB1 proceeds in parallel with the ongoing top page read in the plane PB0.

The top page read in the plane PB0 is completed at a time t14, and the top page data, that is, the page data PG4, can be output from the memory device MC0. The memory controller 2 instructs the memory device MC0 to output the page data PG4, and receives the page data PG4 from a time t14.

While the page data PG4 is being output, the upper page read in the plane PB0 continues. After that, the upper page read is completed, and the upper page data, that is, the page data PG5, can be output from the memory device MC0. The memory controller 2 uses a status read to learn of the completion of the upper page read, and from a time t15, instructs the memory device MC0 to output the page data PG5, and receives the page data PG5.

When the receipt of the page data PG5 is completed, the memory controller 2 reads the page data in the next data set in parallel. As an example, the memory controller 2 performs a multi-plane read to read the data set of the page data PG6 and PG7 in parallel. For this purpose, the memory controller 2 transmits a command set giving an instruction for a multi-plane read of the data in the top page of the selected cell unit CUs01 of the plane PB1, for example. Upon receiving the command set, the memory device MC0 starts a top page read with respect to the selected cell unit CUs01 of the plane PB1 from a time t16.

The memory controller 2 transmits a command set giving an instruction to perform a multi-plane read of the data in the upper page of the selected cell unit CUs00 of the plane PB0 from a time t17. Upon receiving the command set, the memory device MC0 starts an upper page read with respect to the selected cell unit CUs00 of the plane PB0 from a time t18. The upper page read in the plane PB0 proceeds in parallel with the ongoing top page read in the plane PB1.

The top page read in the plane PB1 is completed at a time t19, and the top page data, that is, the page data PG6, can be output from the memory device MC0. The memory controller 2 instructs the memory device MC0 to output the page data PG6, and receives the page data PG6 from a time t19.

While the page data PG6 is being output, the upper page read in the plane PB0 continues. After that, the upper page read is completed, and the upper page data, that is, the page data PG7, can be output from the memory device MC0. The memory controller 2 uses a status read to learn of the completion of the upper page read, and from a time t20, instructs the memory device MC0 to output the page data PG7, and receives the page data PG7.

<1.3. Advantages (Advantageous Effects)>

According to the memory system 100 of the first embodiment, the memory controller 2 is capable of obtaining data in a short time as described below.

The page data PG0 to PG7 are assumed to be written to a certain memory device MC (for example, MC0), as illustrated in FIG. 13 and also described below. FIG. 13 illustrates an example for reference of the positions where the page data PG is written in the memory device MC0.

As illustrated in FIG. 13, as the simplest form of writes, each data set of the page data PG0 to PG7 is written to the same pages from among the lower pages, middle pages, upper pages, and top pages in different planes PB. In other words, the page data PG0 is written to the lower page of the plane PB0, while the page data PG1 is written to the lower page of the plane PB1. The page data PG2 is written to the middle page of the plane PB0, while the page data PG3 is written to the middle page of the plane PB1. The page data PG4 is written to the upper page of the plane PB0, while the page data PG5 is written to the upper page of the plane PB1. The page data PG6 is written to the top page of the plane PB0, while the page data PG7 is written to the top page of the plane PB1.

As a result of such a write, it is anticipated that reads of the page data PG0 to PG7 will be performed as follows. In other words, the page data PG0 and PG1 are read in parallel, the page data PG2 and PG3 are read in parallel, the page data PG4 and PG5 are read in parallel, and the page data PG6 and PG7 are read in parallel. The command sets, flow of data, and transitions of the ready/busy signal RB during the above series of reads are illustrated in FIG. 14. FIG. 14 illustrates an example for reference of the input and output signal DQ during data reads over time in the memory system 100.

As illustrated in FIG. 14, the memory controller 2 instructs the memory device MC0 to read the page data PG0 and PG1. Upon receiving the command set, the memory device MC0 starts a lower page read with respect to the selected cell unit CUs00 of the plane PB0, and subsequently starts a lower page read with respect to the selected cell unit CUs01 of the plane PB1. The two reads are both reads from the lower page, and therefore are completed at substantially the same timings. Upon reaching a state where the page data PG0 and PG1 can be output, the memory controller 2 instructs the memory device MC0 to output one piece of the data, such as the page data PG0 for example, and receives the page data PG0. When the receipt of the page data PG0 is completed, the memory controller 2 instructs the memory device MC0 to output the page data PG1. Therefore, the data reads from the two planes PB0 and PB1 require an amount of time equal to the operating time of the plane PB0 or PB1, the time to output the page data PG0, and the time to output the page data PG1.

Because it is necessary to apply three or four different read voltages VCGR for each page read, reading data from many pieces of page data is time-consuming, such as in the case of reading data from all pages in the memory area unit MA.

On the other hand, the page data PG1 cannot be output while the page data PG0 is being output even if the preparations for outputting the page data PG1 are completed, and effective utilization of such time is a consideration.

The memory controller 2 according to the first embodiment determines a write destination for each group of first page data and second page data having consecutive logical addresses, and writes the first page data to a fast page in a first plane PB out of two planes PB capable of operating independently in parallel, while writing the second page data to a non-fast page in the other of the two planes, namely a second plane PB. The memory controller 2 reads in parallel the first and second page data written in this way. With this operation, the read of the first page data from the memory cell array 13 is completed first, and while the first page data is being output from the memory device MC, the read of the second page data from the memory cell array 13 can proceed. Therefore, the output of the first page data and part of the read of the second page data are performed in parallel, and the wait time until the output preparations are completed and the data can be output like in the reference example (FIG. 14) is greatly reduced. For this reason, by proceeding with the read of the second page data during the output of the first page data, the first and second page data can be read and output efficiently.

Such an advantage of the first embodiment is obtained by configuring the memory area unit MA such that the following conditions are satisfied. Namely, it is necessary to make it possible to read from both a non-fast page and a fast page in parallel. To achieve the above, page data PG with consecutive ascending logical addresses of a number equal to y (or, the number of pages per cell unit CU)/b (or, the number of fast pages per cell unit CU) form a data set, and the memory area unit MA is formed over independently operable planes PB of a number equal to the number of pieces of page data PG in the data set. In the first embodiment, a cell unit CU has a memory area of four pages in size, and a cell unit CU has two fast pages. For this reason, in the first embodiment, the memory area unit MA needs two independently operable planes PB, and the memory area unit MA spreads over the two independently operable planes PB0 and PB1 in a single memory device MC.

Second Embodiment

The second embodiment is similar to the first embodiment, but the mapping is different from the first embodiment. Hereinafter, the features that differ from the first embodiment will be described mainly.

The configuration of the memory system 100 and the memory devices MC according to the second embodiment is the same as that of the first embodiment.

<2.1. Mapping>

Figure 15:
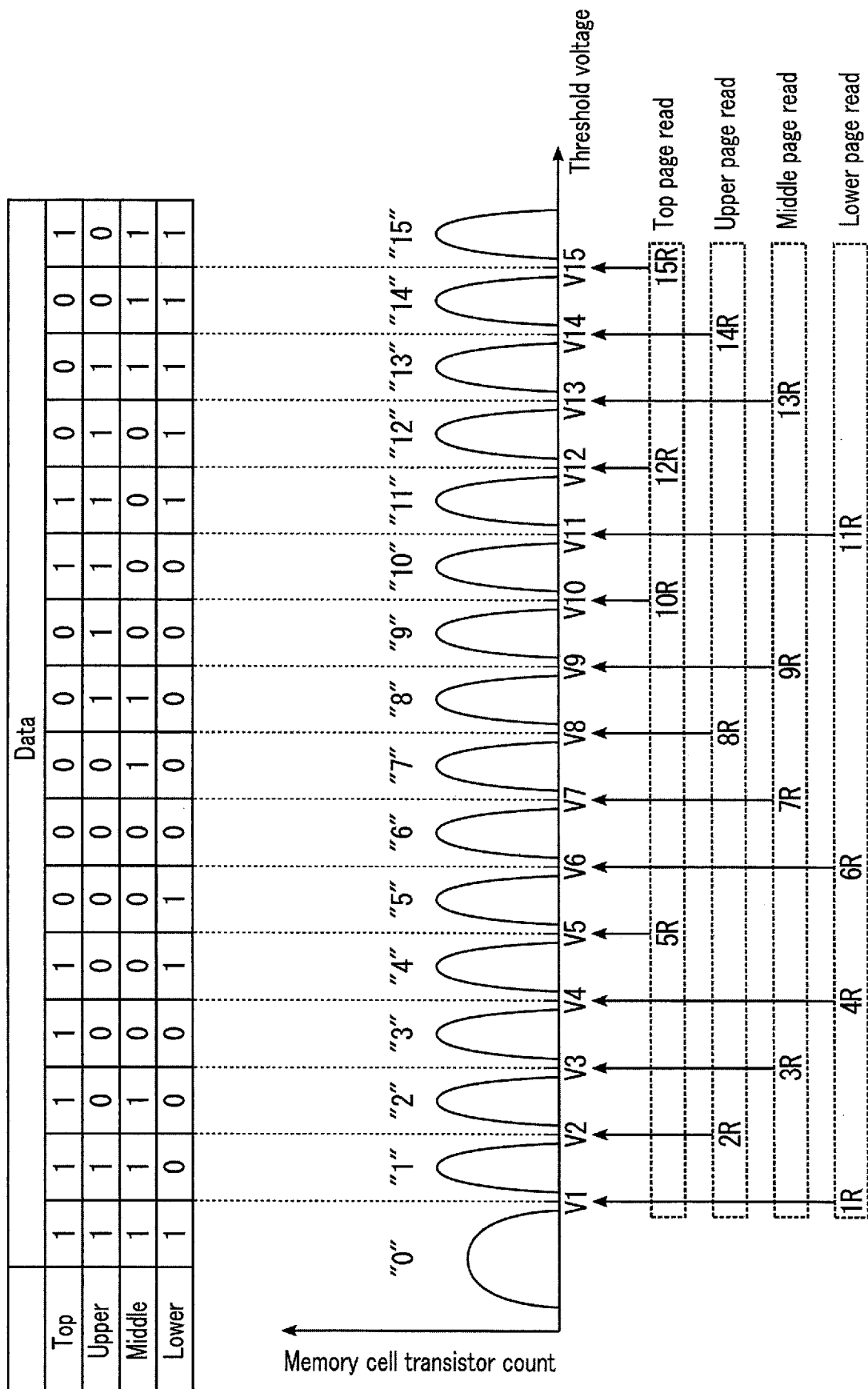
FIG. 15 illustrates a mapping between a threshold voltage distribution of memory cell transistors and data according to a second embodiment.

In the second embodiment, a 4434 mapping is used. FIG. 15 illustrates a mapping between a threshold voltage distribution of memory cell transistors MT that store four bits of data per memory cell transistor MT and data in the memory system according to the second embodiment. As illustrated in FIG. 15, in the second embodiment, each memory device MC is treated as having the following four-bit data for each state.

"0" State: "1111"
"1" State: "1110"
"2" State: "1010"
"3" State: "1000"
"4" State: "1001"
"5" State: "0001"
"6" State: "0000"
"7" State: "0010"
"8" State: "0110"
"9" State: "0100"
"10" State: "1100"
"11" State: "1101"
"12" State: "0101"
"13" State: "0111"
"14" State: "0011"
"15" State: "1011"

In the 4434 mapping, the data of each page is determined using the following read voltages.
Lower page read: 1R, 4R, 6R, and 11R
Middle page read: 3R, 7R, 9R, and 13R
Upper page read: 2R, 8R, and 14R
Top page read: 5R, 10R, 12R, and 15R In the 4434 mapping, the upper page corresponds to the fast page, while the lower page, the middle page, and the top page correspond to non-fast pages.

<2.2. Data Writies>

In the second embodiment, each cell unit CU stores data of four pages in size, and the four pages include just one fast page. Based on this configuration, in the second embodiment, the memory area unit MA spreads over four independently operable planes PB. For this reason, y (the number of pages per cell unit CU)/b (the number of fast pages per cell unit CU)=4, and therefore four pieces of write page data PG with consecutive logical addresses form a data set, and the memory area unit MA is formed over four independently operable planes PB.

Specifically, the memory area unit MA according to the second embodiment spreads over the planes PB0 and PB1 of the memory device MC0 and the planes PB0 and PB1 of the memory device MC1. Hereinafter, the memory area unit MA according to the second embodiment is referred to as the memory area unit MA2.

FIG. 16 illustrates an example of the memory area unit MA2 and positions where page data are written in the memory devices MC according to the second embodiment. As illustrated in FIG. 16, the memory area unit MA2 is the set of the lower, middle, upper, and top pages of a cell unit CUs00 in a plane PB0 of a memory device MC0, the lower, middle, upper, and top pages of a cell unit CUs01 in a plane PB1 of the memory device MC0, the lower, middle, upper, and top pages of a cell unit CUs10 in a plane PB0 of a memory device MC1, and the lower, middle, upper, and top pages of a cell unit CUs11 in a plane PB1 of the memory device MC1.

Based on such features of the memory area unit MA2, 16 pieces of page data PG with consecutive logical addresses are stored in a single memory area unit MA2. As a specific example, FIG. 16 illustrates an example of the positions where 16 pieces of page data PG0 to PG15 with consecutive logical addresses are written in the memory area unit MA2.

For each of the cases where γ is 0, 4, 8, and 12, the page data PGγ, PG(γ+1), PG(γ+2), and PG(γ+3) form a data set. As illustrated in FIG. 16, the page data PGγ, PG(γ+1), PG(γ+2), and PG(γ+3) in each data set are written one by one to the planes PB0 and PB1 of each of the memory devices MC0 and MC1, and in addition, one of the page data PGγ, PG(γ+1), PG(γ+2), and PG(γ+3) is written to a fast page (upper page) while the remaining three are written to non-fast pages. Also, each piece of page data included in a data set and written to a non-fast page is written to any of the lower, middle, and top pages. Furthermore, the pages to which the page data PG0 to PG15 are written are determined such that four data sets are written to the memory area unit MA2. Insofar as writes are performed in this way, the positions where the page data PG0 to PG15 are written are not limited to the example in FIG. 16. As an example, the page data PG written to the non-fast pages can be written to different one of lower, middle, and top pages.

As illustrated in FIG. 16, the page data PG0 is written to the upper page of the selected cell unit CUs00 in the plane PB0 of the memory device MC0. The page data PG1 is written to the middle page of the selected cell unit CUs01 in the plane PB1 of the memory device MC0. The page data PG2 is written to the lower page of the selected cell unit CUs10 in the plane PB0 of the memory device MC1. The page data PG3 is written to the top page of the selected cell unit CUs11 in the plane PB1 of the memory device MC1.

The page data PG4 is written to the upper page of the selected cell unit CUs00 in the plane PB1 of the memory device MC0. The page data PG5 is written to the middle page of the selected cell unit CUs00 in the plane PB0 of the memory device MC0. The page data PG6 is written to the lower page of the selected cell unit CUs11 in the plane PB1 of the memory device MC1. The page data PG7 is written to the top page of the selected cell unit CUs10 in the plane PB0 of the memory device MC1.

The page data PG8 is written to the upper page of the selected cell unit CUs10 in the plane PB0 of the memory device MC1. The page data PG9 is written to the middle page of the selected cell unit CUs11 in the plane PB1 of the memory device MC1. The page data PG10 is written to the top page of the selected cell unit CUs00 in the plane PB0 of the memory device MC0. The page data PG11 is written to the lower page of the selected cell unit CUs01 in the plane PB1 of the memory device MC0.

The page data PG12 is written to the upper page of the selected cell unit CUs11 in the plane PB1 of the memory device MC1. The page data PG13 is written to the middle page of the selected cell unit CUs10 in the plane PB0 of the memory device MC1. The page data PG14 is written to the top page of the selected cell unit CUs01 in the plane PB1 of the memory device MC0. The page data PG15 is written to the lower page of the selected cell unit CUs00 in the plane PB0 of the memory device MC0.

<2.3. Data reads>

Figure 17:
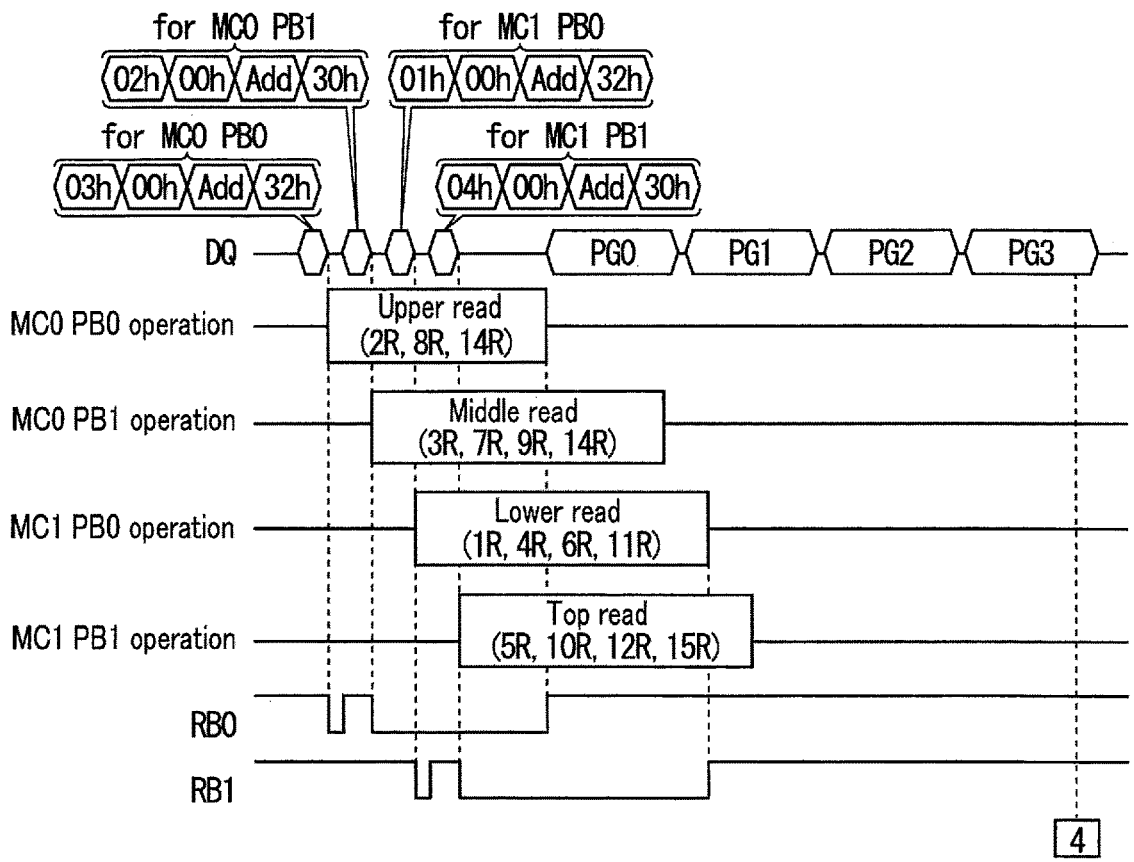
FIG. 17 illustrates an input and output signal during data reads over time in the memory system according to the second embodiment.
Figure 17:
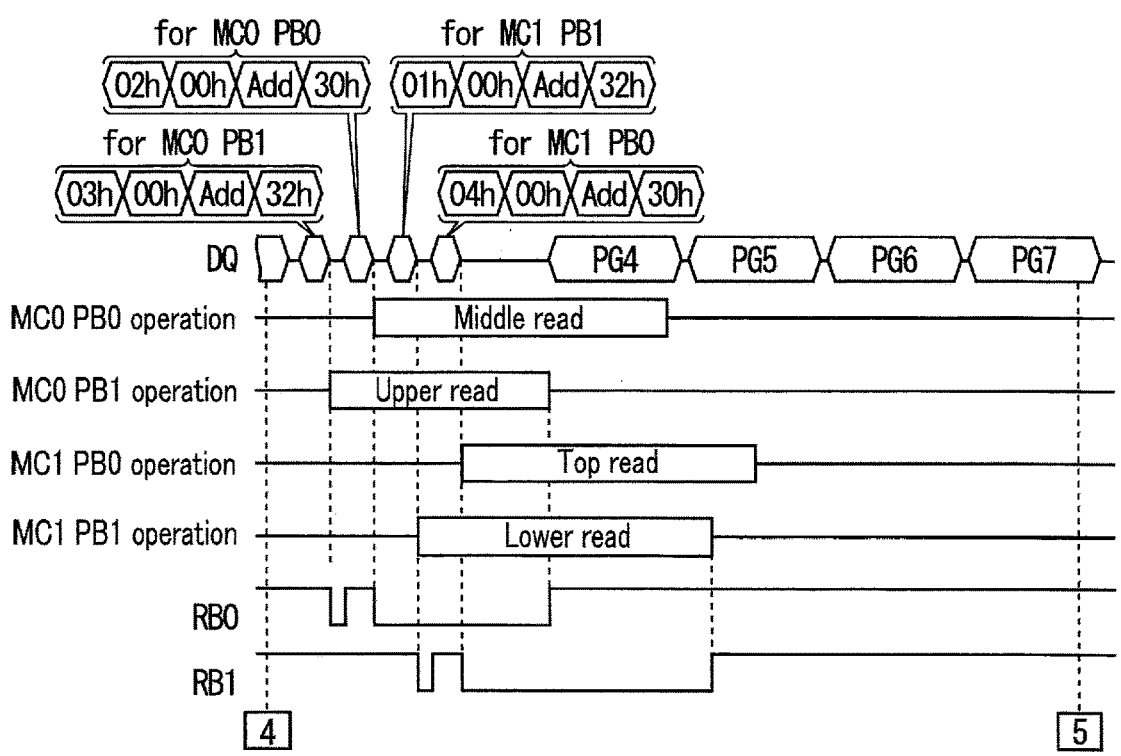
Figure 18:
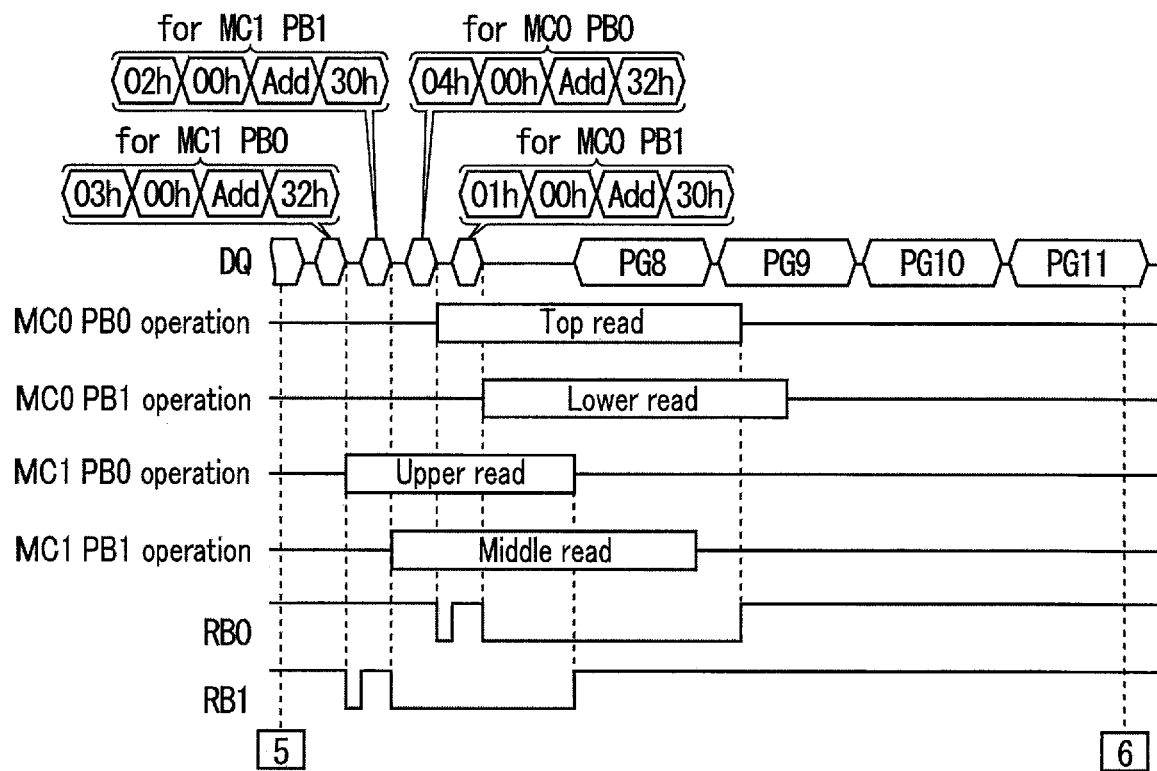
FIG. 18 illustrates an input and output signal during data reads over time in the memory system according to the second embodiment.
Figure 18:
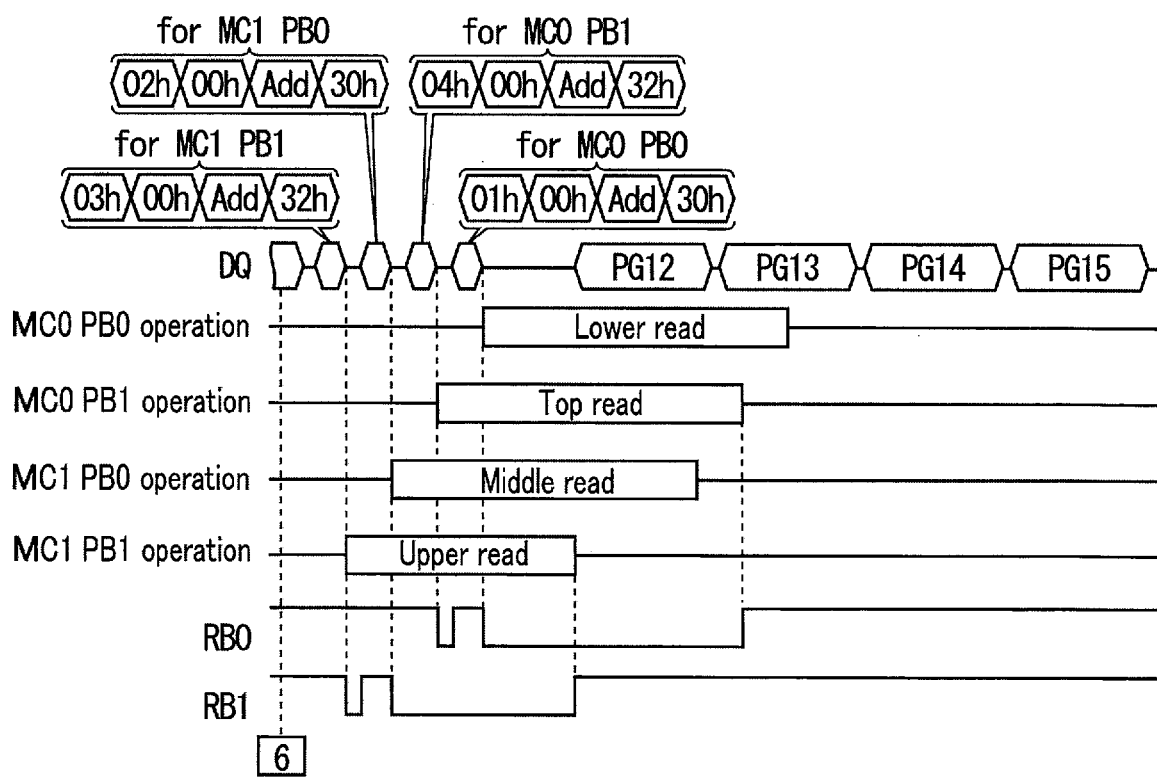

FIGS. 17 and 18 illustrate the flow of the input and output signal DQ during data reads over time in the memory system 100 according to the second embodiment. FIG. 18 illustrates the state following FIG. 17.

As illustrated in FIGS. 17 and 18, a data read from any of the non-fast pages proceeds in parallel with a data read of a fast page (upper page).

To read the data set containing the page data PG0 to PG3, the memory controller 2 first instructs the memory device MC0 to read the page data PG0 stored in the fast page. The memory device MC0 receives the instruction and starts an upper page read in the plane PB0 of the memory device MC0 for obtaining the page data PG0. Next, the memory controller 2 instructs the memory devices MC0 and MC1 to read the page data PG1, PG2, and PG3. The middle page read in the plane PB1 of the memory device MC0 for obtaining the page data PG1, the lower page read in the plane PB0 of the memory device MC1 for obtaining the page data PG2, and the top page read in the plane PB1 of the memory device MC1 for obtaining the page data PG3 proceed in parallel with the top page read in the plane PB0 of the memory device MC0.

When the read of the page data PG0 is completed, the memory device MC0 outputs the page data PG0 in accordance with the instruction from the memory controller 2. While the memory device MC0 is outputting the page data PG0, the middle page read in the plane PB1 of the memory device MC0, the lower page read in the plane PB0 of the memory device MC1, and the top page read in the plane PB1 of the memory device MC1 can proceed.

Thereafter, the memory controller 2 similarly reads the data set containing the page data PG4 to PG7, reads the data set containing the page data PG8 to PG11, and reads the data set containing the page data PG12 to PG15. For reading any of the data sets, a data read from the fast page of each data set is started first, and after that, data reads from the non-fast pages are started. Subsequently, in each data set, a lower page read, a middle page read, an upper page read, and a top page read proceed in parallel over the planes PB0 and PB1 of each of the memory devices MC0 and MC1.

<2.4. Another Example of Writes>

An example of data writes includes write as illustrated in FIG. 19. FIG. 19 illustrates a second example of positions where page data are written in the memory devices MC according to the second embodiment.

As illustrated in FIG. 19, the page data PG0 is written to the upper page of the selected cell unit CUs00 in the plane PB0 of the memory device MC0. The page data PG1 is written to the top page of the selected cell unit CUs01 in the plane PB1 of the memory device MC0. The page data PG2 is written to the lower page of the selected cell unit CUs10 in the plane PB0 of the memory device MC1. The page data PG3 is written to the middle page of the selected cell unit CUs11 in the plane PB1 of the memory device MC1.

The page data PG4 is written to the upper page of the selected cell unit CUs01 in the plane PB1 of the memory device MC0. The page data PG5 is written to the top page of the selected cell unit CUs10 in the plane PB0 of the memory device MC1. The page data PG6 is written to the lower page of the selected cell unit CUs11 in the plane PB1 of the memory device MC1. The page data PG7 is written to the middle page of the selected cell unit CUs00 in the plane PB0 of the memory device MC0.

The page data PG8 is written to the upper page of the selected cell unit CUs10 in the plane PB0 of the memory device MC1. The page data PG9 is written to the top page of the selected cell unit CUs11 in the plane PB1 of the memory device MC1. The page data PG10 is written to the lower page of the selected cell unit CUs00 in the plane PB0 of the memory device MC0. The page data PG11 is written to the middle page of the selected cell unit CUs01 in the plane PB1 of the memory device MC0.

The page data PG12 is written to the upper page of the selected cell unit CUs11 in the plane PB1 of the memory device MC1. The page data PG13 is written to the top page of the selected cell unit CUs00 in the plane PB0 of the memory device MC0. The page data PG14 is written to the lower page of the selected cell unit CUs01 in the plane PB1 of the memory device MC0. The page data PG15 is written to the middle page of the selected cell unit CUs10 in the plane PB0 of the memory device MC1.

<2.5. Advantages>

According to the second embodiment, the memory area unit MA2 spreads over two memory devices MC including independently operable planes PB, first page data out of a data set containing four pieces of page data having four consecutive logical addresses is written to a fast page (upper page), while the remaining page data are written to different pages than the page where the first page data is written from among the lower, middle, upper, and top pages. During reads of a data set written in this way, reads of the page data other than the first page data of the data set can proceed while the first page data is being output. For this reason, in the case of the 4434 mapping, data can be read and output with the same efficiency as the first embodiment.

Third Embodiment

The third embodiment resembles the second embodiment. In the third embodiment, the 4434 mapping is used like in the second embodiment. Hereinafter, the features that differ from the second embodiment will be described mainly.

The configuration of the memory system 100 according to the third embodiment is the same as that of the first embodiment. On the other hand, the third embodiment differs from the first embodiment in the details of the memory devices MC.

<3.1. Configuration of Memory Devices>

In the third embodiment, unlike the first embodiment, the plurality of planes PB in each memory device MC cannot operate independently.

Figure 20:
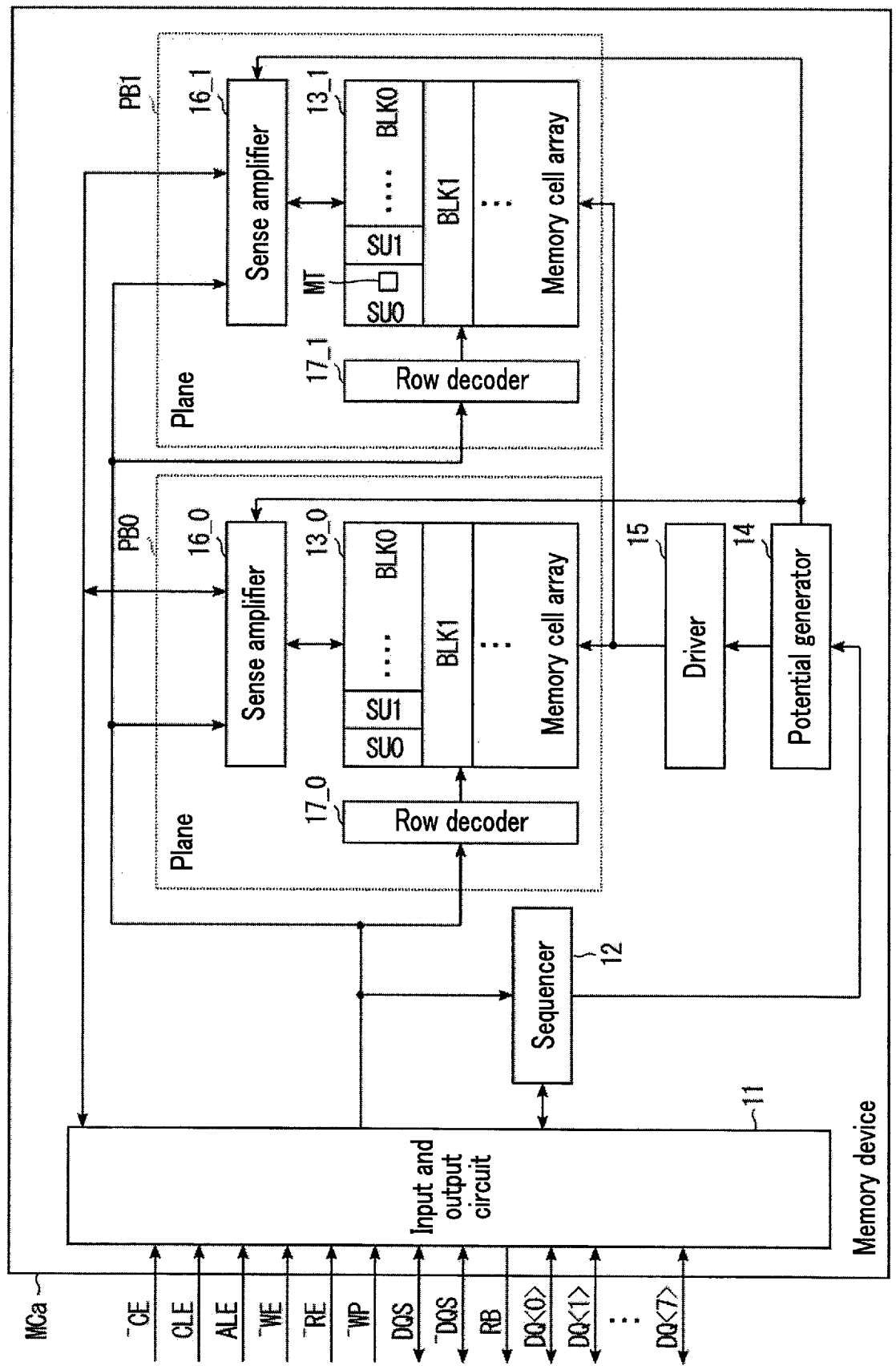
FIG. 20 illustrates components and connections in a memory device according to a third embodiment.

FIG. 20 illustrates functional blocks of a memory device MC according to the third embodiment. The memory devices MC according to the third embodiment may be referred to as the memory devices MCa. As illustrated in FIG. 20, unlike the first embodiment (FIG. 3), each memory device MCa does not include the potential generator 14_0 and the driver 15_0 for the plane PB0 and also does not include the potential generator 14_1 and the driver 15_1 for the plane PB1. Instead, each memory device MCa shares a potential generator 14 and a driver 15.

Based on such a configuration of the memory device MCa, for a multi-plane read from the planes PB0 and PB1, the same read voltage VCGR is applied to the planes PB0 and PB1. Therefore, in the planes PB0 and PB1, the same pages from among the lower, middle, upper, and top pages become the targets of the parallel data reads.

<3.2. Data Writes>

In the third embodiment, each cell unit CU stores data of four pages in size, and the four pages include just one fast page. Based on this configuration, in the third embodiment, the memory area unit MA needs to spread over four independently operable planes PB. In the third embodiment, the planes PB0 and PB1 in each memory device MC cannot operate independently. For this reason, the memory area unit MA needs to spread over four memory devices MC.

To this end, the memory area unit MA according to the third embodiment spreads over a plane PB of the memory device MC0, a plane PB of the memory device MC1, a plane PB of the memory device MC2, and a plane PB of the memory device MC3. The memory area unit MA according to the third embodiment is referred to as the memory area unit MA3.

FIG. 21 illustrates an example of the memory area unit MA3 and positions where page data are written in the memory devices MC according to the third embodiment. As illustrated in FIG. 21, the memory area unit MA3 is the set of the lower, middle, upper, and top pages of a selected cell unit CUs0w in a plane PBw of the memory device MC0, the lower, middle, upper, and top pages of a cell unit CUs1w in a plane PBw of the memory device MC1, the lower, middle, upper, and top pages of a cell unit CUs2w in a plane PBw of a memory device MC2, and the lower, middle, upper, and top pages of a cell unit CUs3w in a plane PBw of the memory device MC3.

Based on such features of the memory area unit MA3, 16 pieces of page data PG with consecutive logical addresses are stored in a single memory area unit MA3. As a specific example, FIG. 21 illustrates the positions where 16 pieces of page data PG0 to PG15 with consecutive logical addresses are written in the memory area unit MA3.

For each of the cases where y is 0, 4, 8, and 12, the page data PGγ, the page data PG(γ+1), the page data PG(γ+2), and the page data PG(γ+3) form a data set.

As illustrated in FIG. 21, the page data PGγ, PG(γ+1), PG(γ+2), and PG(γ+3) in each data set are written one by one to the memory devices MC0 to MC3, and in addition, one of the page data PGγ, PG(γ+1), PG(γ+2), and PG(γ+3) is written to a fast page while the remaining three are written to non-fast pages. Also, the page data included in a data set and written to a non-fast page is written to any of the lower, middle, and top pages. Furthermore, the pages to which the page data PG0 to PG15 are written are determined such that four data sets are written to the memory area unit MA3. Insofar as writes are performed in this way, the positions where the page data PG0 to PG15 are written are not limited to the example in FIG. 21. As an example, the page data written to the non-fast pages can be written to different one of lower, middle, and top pages.

As illustrated in FIG. 21, the page data PG0 is written to the upper page of the selected cell unit CUs0w of the memory device MC0. The page data PG1 is written to the middle page of the selected cell unit CUs1w of the memory device MC1. The page data PG2 is written to the lower page of the selected cell unit CUs2w of the memory device MC2. The page data PG3 is written to the top page of the selected cell unit CUs3w of the memory device MC3.

The page data PG4 is written to the upper page of the selected cell unit CUs1w of the memory device MC1. The page data PG5 is written to the middle page of the selected cell unit CUs0w of the memory device MC0. The page data PG6 is written to the lower page of the selected cell unit CUs3w of the memory device MC3. The page data PG7 is written to the top page of the selected cell unit CUs2w of the memory device MC2.

The page data PG8 is written to the upper page of the selected cell unit CUs2w of the memory device MC2. The page data PG9 is written to the middle page of the selected cell unit CUs3w of the memory device MC3. The page data PG10 is written to the top page of the selected cell unit CUs0w of the memory device MC0. The page data PG11 is written to the lower page of the selected cell unit CUs1w of the memory device MC1.

The page data PG12 is written to the upper page of the selected cell unit CUs3w of the memory device MC3. The page data PG13 is written to the middle page of the selected cell unit CUs2w of the memory device MC2. The page data PG14 is written to the top page of the selected cell unit CUs1w of the memory device MC1. The page data PG15 is written to the lower page of the selected cell unit CUs0w of the memory device MC0.

<3.3. Data Reads>

Figure 22:
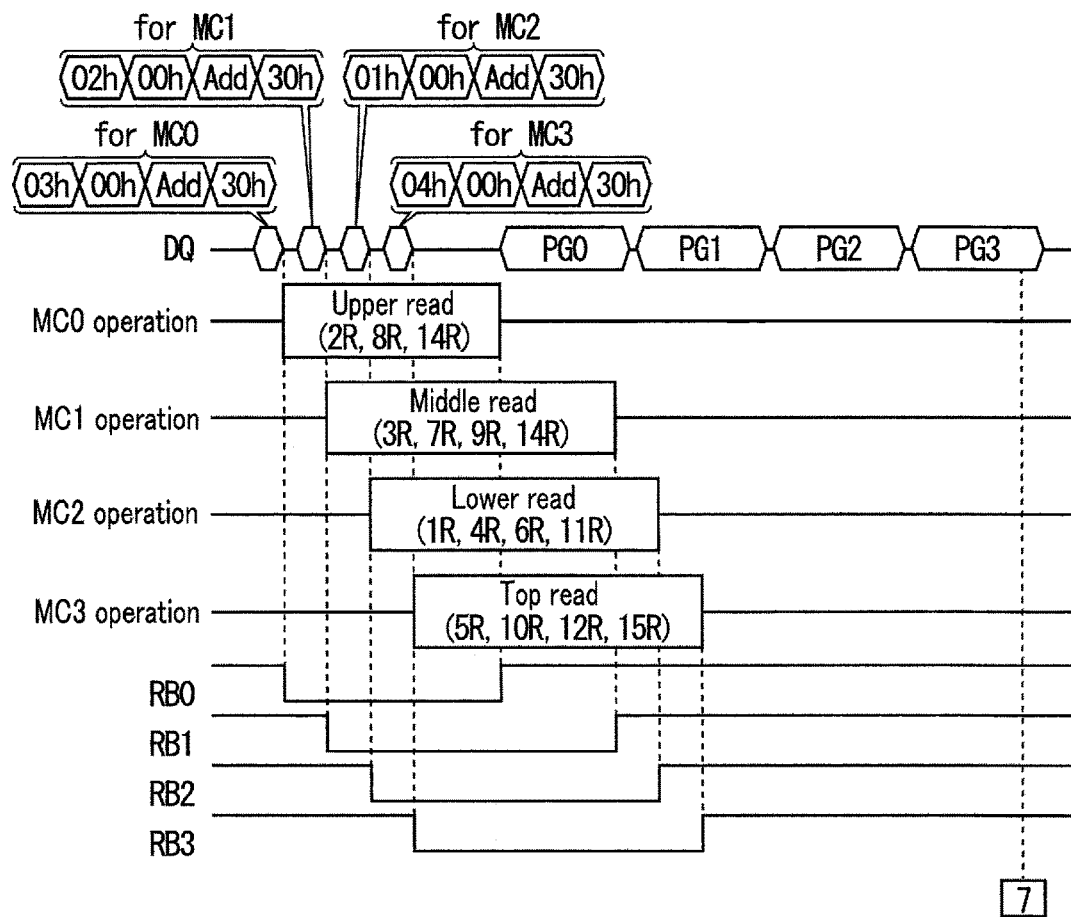
FIG. 22 illustrates an input and output signal during data reads over time in the memory system according to the third embodiment.
Figure 22:
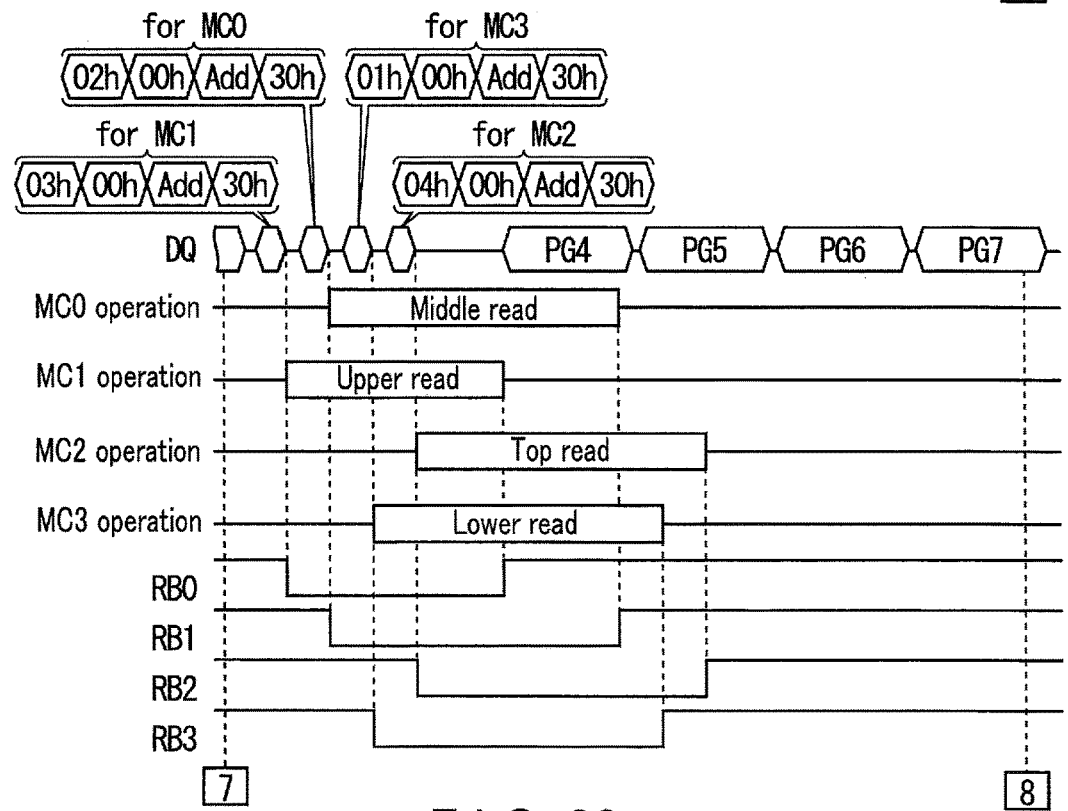
Figure 23:
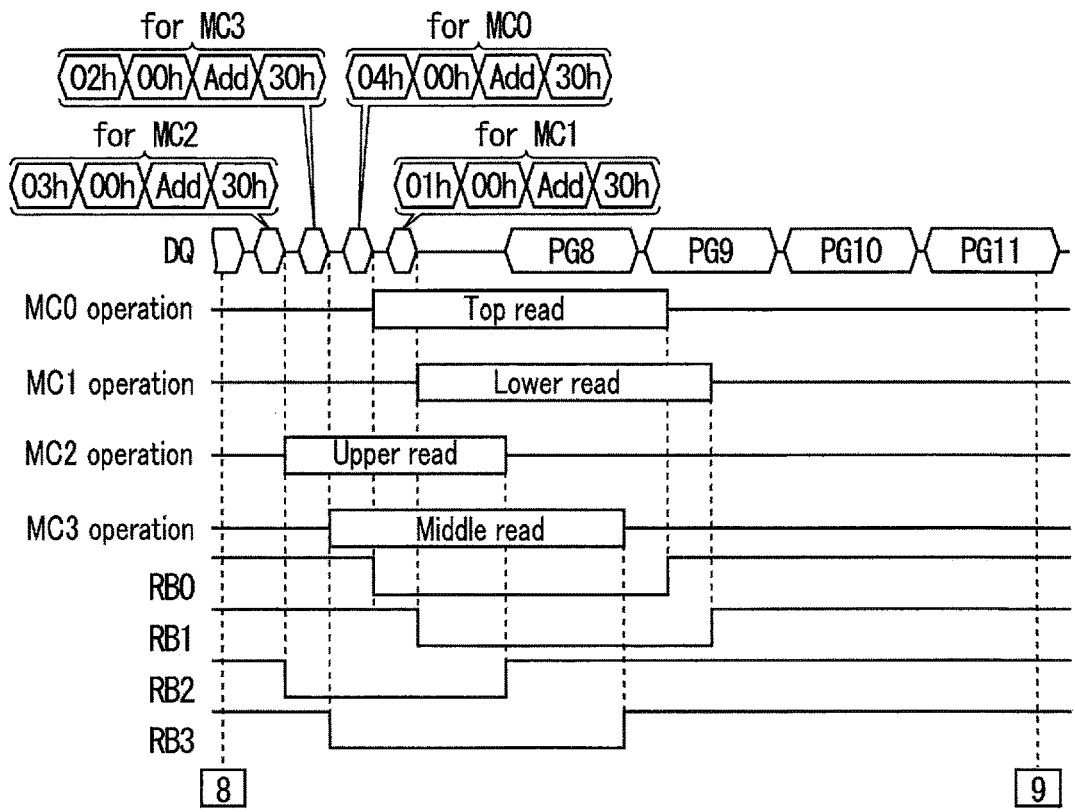
FIG. 23 illustrates an input and output signal during data reads over time in the memory system according to the third embodiment.
Figure 23:
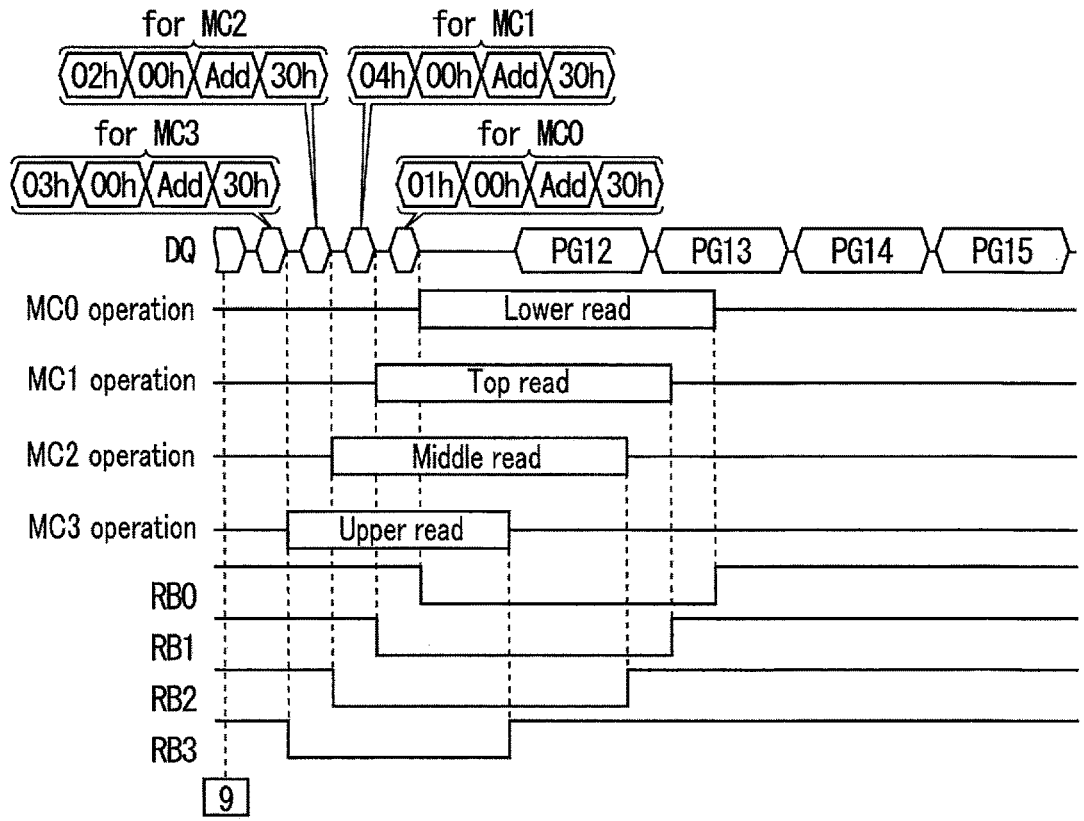
Figure 29:
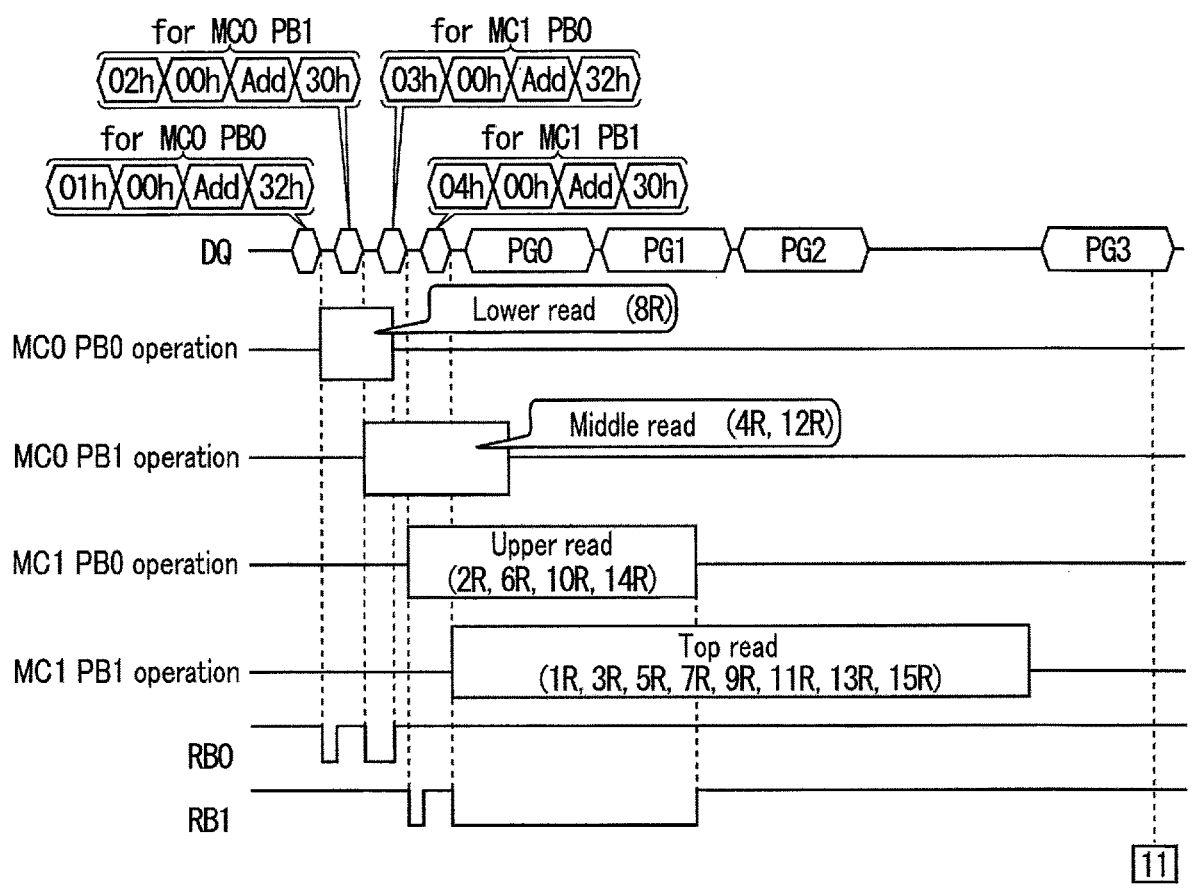
FIG. 29 illustrates an input and output signal during data reads over time in the memory system according to the fourth embodiment.
Figure 30:
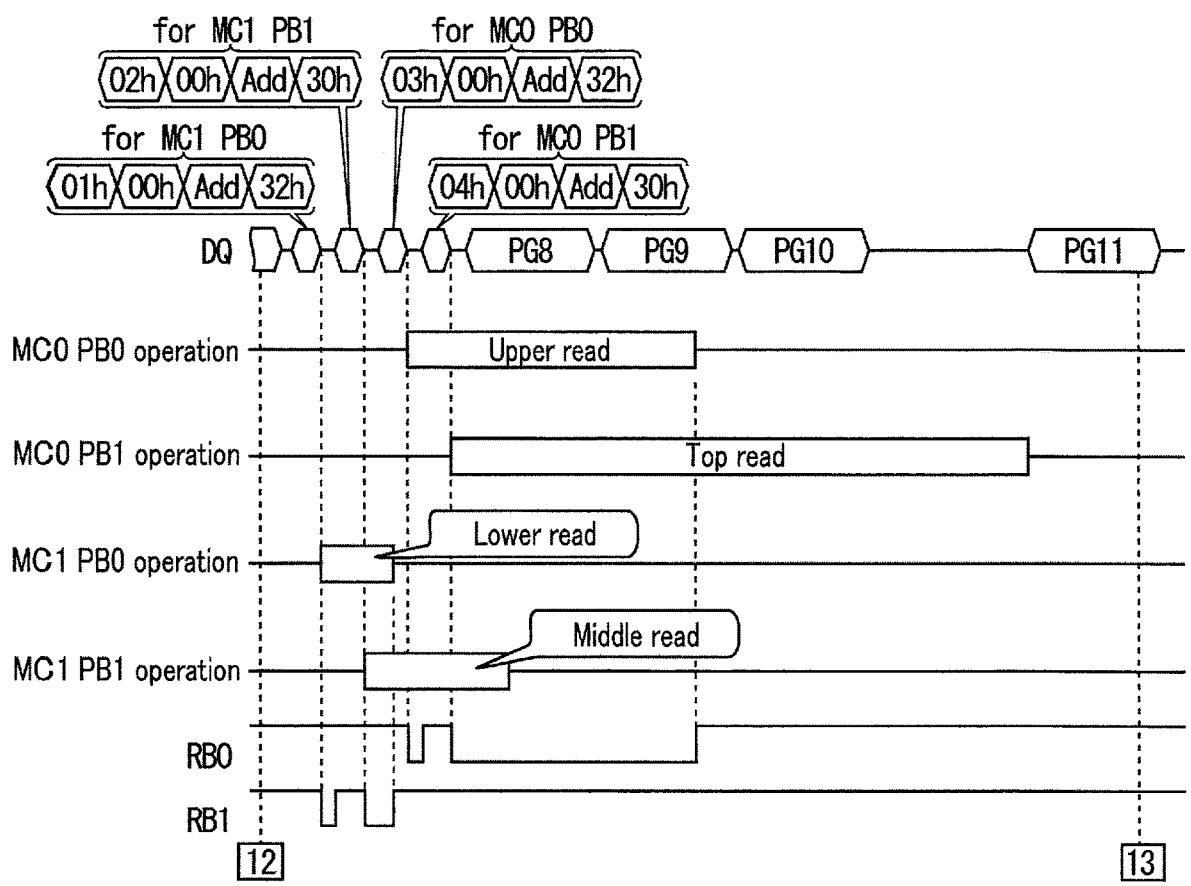
FIG. 30 illustrates an input and output signal during data reads over time in the memory system according to the fourth embodiment.

FIGS. 22 and 23 illustrate the flow of the input and output signal DQ during data reads over time in the memory system 100 according to the third embodiment. FIG. 23 illustrates the state following FIG. 22.

As illustrated in FIGS. 22 and 23, a data read from any of the non-fast pages proceeds in parallel with a data read of a fast page (upper page).

To read the data set containing the page data PG0 to PG3, the memory controller 2 first instructs the memory device MC0 to read the page data PG0 stored in the fast page. The memory device MC0 receives the instruction and starts an upper page read of the memory device MC0 for obtaining the page data PG0. Next, the memory controller 2 instructs the memory device MC1 to perform a middle page read for the page data PG1, instructs the memory device MC2 to perform a lower page read for the page data PG2, and instructs the memory device MC3 to perform a top page read for the page data PG3. The upper page read in the memory device MC0, the middle page read in the memory device MC1, the lower page read in the memory device MC2, and the top page read in the memory device MC3 proceed in parallel.

When the read of the page data PG0 is completed, the memory device MC0 outputs the page data PG0 in accordance with the instruction from the memory controller 2. While the memory device MC0 is outputting the page data PG0, the middle page read in the memory device MC1, the lower page read in the memory device MC2, and the top page read in the memory device MC3 can proceed.

Thereafter, the memory controller 2 similarly reads the data set containing the page data PG4 to PG7, reads the data set containing the page data PG8 to PG11, and reads the data set containing the page data PG12 to PG15. For reading any of the data sets, a data read from the fast page of each data set is started first, and after that, data reads from the non-fast pages are started. Thus, in each data set, a lower page read, a middle page read, an upper page read, and a top page read proceed in parallel over the memory devices MC0, MC1, MC2, and MC3.

<3.4. Another Example of Data Writes>

An example of data writes includes writes as illustrated in FIG. 24. FIG. 24 illustrates a second example of positions where page data are written in the memory devices MC according to the third embodiment.

As illustrated in FIG. 24, the page data PG0 is written to the upper page of the selected cell unit CUs0$w$ of the memory device MC0. The page data PG1 is written to the top page of the selected cell unit CUs1$w$ of the memory device MC1. The page data PG2 is written to the lower page of the selected cell unit CUs2$w$ of the memory device MC2. The page data PG3 is written to the middle page of the selected cell unit CUs3$w$ of the memory device MC3.

The page data PG4 is written to the upper page of the selected cell unit CUs1$w$ of the memory device MC1. The page data PG5 is written to the top page of the selected cell unit CUs2$w$ of the memory device MC2. The page data PG6 is written to the lower page of the selected cell unit CUs3$w$ of the memory device MC3. The page data PG7 is written to the middle page of the selected cell unit CUs0$w$ of the memory device MC0.

The page data PG8 is written to the upper page of the selected cell unit CUs2$w$ of the memory device MC2. The page data PG9 is written to the top page of the selected cell unit CUs3$w$ of the memory device MC3. The page data PG10 is written to the lower page of the selected cell unit CUs0$w$ of the memory device MC0. The page data PG11 is written to the middle page of the selected cell unit CUs1$w$ of the memory device MC1.

The page data PG12 is written to the upper page of the selected cell unit CUs3$w$ of the memory device MC3. The page data PG13 is written to the top page of the selected cell unit CUs0$w$ of the memory device MC0. The page data PG14 is written to the lower page of the selected cell unit CUs1$w$ of the memory device MC1. The page data PG15 is written to the middle page of the selected cell unit CUs2$w$ of the memory device MC2.

<3.5. Advantages>

According to the third embodiment, the memory area unit MA3 spreads over four memory devices MC, first page data out of a data set containing four pieces of page data having four consecutive logical addresses is written to a fast page (upper page), while the remaining page data are written to different pages than the page where the first page data is written from among the lower, middle, upper, and top pages. During reads of a data set written in this way, reads of the page data other than the first page data of the data set can proceed while the first page data is being output. For this reason, data can be read and output with the same efficiency as the first embodiment, even in the case where the memory devices MC do not include a plurality of independently operable planes PB.

<3.6. Modification>

The third embodiment may also be applied to multi-plane operations. However, in each memory device MC according to the third embodiment, the planes PB0 and PB1, although capable of operating in parallel, are not capable of operating independently, and therefore data reads are performed in parallel from the same pages of cell units CU with the same address in the blocks BLK of the same address in each of the planes PB0 and PB1. Based on the above, two pieces of page data PG with consecutive logical addresses are written to the same pages in the planes PB0 and PB1 of the same memory device MC.

A memory area unit MA3$a$ according to a modification of the third embodiment spreads over the planes PB0 and PB1 of the memory device MC0, the planes PB0 and PB1 of the memory device MC1, the planes PB0 and PB1 of the memory device MC2, and the planes PB0 and PB1 of the memory device MC3.

FIG. 25 illustrates an example of the memory area unit MA3$a$ and positions where page data are written in the memory devices MC according to the modification of the third embodiment. For each of the cases where γ is 0, 4, 8, and 12, the page data PGγ, the page data PG(γ+1), the page data PG(γ+2), the page data PG(γ+3), the page data PG(γ+4), the page data PG(γ+5), the page data PG(γ+6), and the page data PG(γ+7) form a data set.

As illustrated in FIG. 25, the memory area unit MA3$a$ is the set of the lower, middle, upper, and top pages of a cell unit CUs00 in a plane PB0 of a memory device MC0, the lower, middle, upper, and top pages of a cell unit CUs01 in a plane PB1 of the memory device MC0, the lower, middle, upper, and top pages of a cell unit CUs10 in a plane PB0 of a memory device MC1, the lower, middle, upper, and top pages of a cell unit CUs11 in a plane PB1 of the memory device MC1, the lower, middle, upper, and top pages of a cell unit CUs20 in a plane PB0 of a memory device MC2, the lower, middle, upper, and top pages of a cell unit CUs21 in a plane PB1 of a memory device MC2, the lower, middle, upper, and top pages of a cell unit CUs30 in a plane PB0 of a memory device MC3, and the lower, middle, upper, and top pages of a cell unit CUs31 in a plane PB1 of a memory device MC3.

Based on such features of the memory area unit MA3a, 32 pieces of page data PG with consecutive logical addresses are stored in a single memory area unit MA3a. As a specific example, FIG. 25 illustrates the positions where 32 pieces of write page data PG0 to PG31 with consecutive logical addresses are written in the memory area unit MA3a.

For each of the cases where γ is 0, 8, 16, and 24, the page data PGγ, PG(γ+1), PG(γ+2), PG(γ+3), PG(γ+4), PG(γ+5), PG(γ+6), and PG(γ+7) form a data set. In addition, the page data PGγ and PG(γ+1) form a pair, the page data PG(γ+2) and PG(γ+3) form a pair, the page data PG(γ+4) and PG(γ+5) form a pair, and the page data PG(γ+6) and PG(γ+7) form a pair. The two pieces of page data PG that form a pair are written to the same page in different planes PB of the same memory device MC.

As illustrated in FIG. 25, the pairs of page data PG in each data set are written one by one to the memory devices MC0 to MC3, and one of the pairs of page data PG in each data is written to fast pages while the remaining three pairs are written to non-fast pages.

Also, the pairs of page data PG included in a data set and written to non-fast pages are written to any of the lower, middle, and top pages. Furthermore, the pages to which the page data PG0 to PG31 is written are determined such that four data sets are written to the memory area unit MA3a. Insofar as writes are performed in this way, the positions where the page data PG0 to PG31 are written is not limited to the example in FIG. 25. As an example, the page data PG written to the non-fast pages can be written to different one of lower, middle, and top pages.

As illustrated in FIG. 25, the page data PG0 is written to the upper page of the selected cell unit CUs00 in the plane PB0 of the memory device MC0. The page data PG1 is written to the upper page of the selected cell unit CUs01 in the plane PB1 of the memory device MC0.

The page data PG2 is written to the middle page of the selected cell unit CUs10 in the plane PB0 of the memory device MC1. The page data PG3 is written to the middle page of the selected cell unit CUs11 in the plane PB1 of the memory device MC1.

The page data PG4 is written to the lower page of the selected cell unit CUs20 in the plane PB0 of the memory device MC2. The page data PG5 is written to the lower page of the selected cell unit CUs21 in the plane PB1 of the memory device MC2.

The page data PG6 is written to the top page of the selected cell unit CUs30 in the plane PB0 of the memory device MC3. The page data PG7 is written to the top page of the selected cell unit CUs31 in the plane PB1 of the memory device MC3.

The page data PG8 is written to the upper page of the selected cell unit CUs10 in the plane PB0 of the memory device MC1. The page data PG9 is written to the upper page of the selected cell unit CUs11 in the plane PB1 of the memory device MC1.

The page data PG10 is written to the middle page of the selected cell unit CUs00 in the plane PB0 of the memory device MC0. The page data PG11 is written to the middle page of the selected cell unit CUs01 in the plane PB1 of the memory device MC0.

The page data PG12 is written to the lower page of the selected cell unit CUs30 in the plane PB0 of the memory device MC3. The page data PG13 is written to the lower page of the selected cell unit CUs31 in the plane PB1 of the memory device MC3.

The page data PG14 is written to the top page of the selected cell unit CUs20 in the plane PB0 of the memory device MC2. The page data PG15 is written to the top page of the selected cell unit CUs21 in the plane PB1 of the memory device MC2.

The page data PG16 is written to the upper page of the selected cell unit CUs20 in the plane PB0 of the memory device MC2. The page data PG17 is written to the upper page of the selected cell unit CUs21 in the plane PB1 of the memory device MC2.

The page data PG18 is written to the middle page of the selected cell unit CUs30 in the plane PB0 of the memory device MC3. The page data PG19 is written to the middle page of the selected cell unit CUs31 in the plane PB1 of the memory device MC3.

The page data PG20 is written to the top page of the selected cell unit CUs00 in the plane PB0 of the memory device MC0. The page data PG21 is written to the top page of the selected cell unit CUs01 in the plane PB1 of the memory device MC0.

The page data PG22 is written to the lower page of the selected cell unit CUs10 in the plane PB0 of the memory device MC1. The page data PG23 is written to the lower page of the selected cell unit CUs11 in the plane PB1 of the memory device MC1.

The page data PG24 is written to the upper page of the selected cell unit CUs30 in the plane PB0 of the memory device MC3. The page data PG25 is written to the upper page of the selected cell unit CUs31 in the plane PB1 of the memory device MC3.

The page data PG26 is written to the middle page of the selected cell unit CUs20 in the plane PB0 of the memory device MC2. The page data PG27 is written to the middle page of the selected cell unit CUs21 in the plane PB1 of the memory device MC2.

The page data PG28 is written to the top page of the selected cell unit CUs10 in the plane PB0 of the memory device MC1. The page data PG29 is written to the top page of the selected cell unit CUs11 in the plane PB1 of the memory device MC1.

The page data PG30 is written to the lower page of the selected cell unit CUs00 in the plane PB0 of the memory device MC0. The page data PG31 is written to the lower page of the selected cell unit CUs01 in the plane PB1 of the memory device MC0.

For data reads, the basic principle is the same as the data reads according to the third embodiment described with reference to FIGS. 22 and 23, the difference being that pairs of page data PG are read in parallel. In other words, when each read command set illustrated in FIGS. 22 and 23 is received by each memory device MC, the memory device MC reads data in parallel from the same pages of cell units CU with the same address instructed by the read command set in each of the planes PB0 and PB1. The data obtained by such reads is a pair of page data PG. The memory controller 2 instructs each memory device MC to output a pair of page data PG, and receives the pair of page data PG.

Fourth Embodiment

The fourth embodiment is similar to the second embodiment, and is different from the second embodiment in the mapping. Hereinafter, the features that differ from the second embodiment will be described mainly.

The configuration of the memory system 100 and the memory devices MC according to the fourth embodiment is the same as that of the first embodiment.

<4.1. Mapping>

In the fourth embodiment, a 1248 mapping is used. FIG. 26 illustrates a mapping between a threshold voltage distribution of memory cell transistors MT that store four bits of data per memory cell transistor MT and data in the memory system according to the fourth embodiment. As illustrated in FIG. 26, in the fourth embodiment, each memory device MC treats each state as having the following four-bit data.

"0" State: "1111"
"1" State: "0111"
"2" State: "0011"
"3" State: "1011"
"4" State: "1001"
"5" State: "0001"
"6" State: "0101"
"7" State: "1101"
"8" State: "1100"
"9" State: "0100"
"10" State: "0000"
"11" State: "1000"
"12" State: "1010"
"13" State: "0010"
"14" State: "0110"
"15" State: "1110"

In the 1248 mapping, the data of each page is determined using the following read voltages.

Lower page read: 8R
Middle page read: 4R and 12R
Upper page read: 2R, 6R, 10R, and 14R
Top page read: 1R, 3R, 5R, 7R, 9R, 11R, 13R, and 15R In the 1248 mapping, the lower page corresponds to the fast page, while the middle page, the upper page, and the top page correspond to non-fast pages.

<4.2. Data Writes>

In the fourth embodiment, each cell unit CU stores data of four pages in size, and the four pages include just one fast page. Based on this configuration, in the fourth embodiment, the memory area unit MA2 of the second embodiment is used.

FIG. 27 illustrates an example of positions where page data are written in the memory devices MC according to the fourth embodiment. As a specific example, FIG. 27 illustrates the positions where 16 pieces of write page data PG0 to PG15 with consecutive logical addresses are written in the memory area unit MA2.

For each of the cases where γ is 0, 4, 8, and 12, the page data PGγ, PG(γ+1), PG(γ+2), and PG(γ+3) form a data set.

As illustrated in FIG. 27, the page data PGγ, PG(γ+1), PG(γ+2), and PG(γ+3) in each data set are written one by one to the planes PB0 and PB1 of each of the memory devices MC0 and MC1, and in addition, one of the page data PGγ, PG(γ+1), PG(γ+2), and PG(γ+3) is written to a fast page (lower page) while the remaining three are written to non-fast pages. Also, each piece of page data PG included in a data set and written to a non-fast page is written to any of the middle, upper, and top pages. Furthermore, the pages to which the page data PG0 to PG15 are written are determined such that four data sets are written to the memory area unit MA2. Insofar as writes are performed in this way, the positions where the page data PG0 to PG15 are written are not limited to the example in FIG. 27. As an example, the page data PG written to the non-fast pages can be written to different one of middle, upper, and top pages.

As illustrated in FIG. 27, the page data PG0 is written to the lower page of the selected cell unit CUs00 in the plane PB0 of the memory device MC0. The page data PG1 is written to the middle page of the selected cell unit CUs01 in the plane PB1 of the memory device MC0. The page data PG2 is written to the upper page of the selected cell unit CUs10 in the plane PB0 of the memory device MC1. The page data PG3 is written to the top page of the selected cell unit CUs11 in the plane PB1 of the memory device MC1.

The page data PG4 is written to the lower page of the selected cell unit CUs01 in the plane PB1 of the memory device MC0. The page data PG5 is written to the middle page of the selected cell unit CUs10 in the plane PB0 of the memory device MC1. The page data PG6 is written to the upper page of the selected cell unit CUs11 in the plane PB1 of the memory device MC1. The page data PG7 is written to the top page of the selected cell unit CUs00 in the plane PB0 of the memory device MC0.

The page data PG8 is written to the lower page of the selected cell unit CUs10 in the plane PB0 of the memory device MC1. The page data PG9 is written to the middle page of the selected cell unit CUs11 in the plane PB1 of the memory device MC1. The page data PG10 is written to the upper page of the selected cell unit CUs00 in the plane PB0 of the memory device MC0. The page data PG11 is written to the top page of the selected cell unit CUs01 in the plane PB1 of the memory device MC0.

The page data PG12 is written to the lower page of the selected cell unit CUs11 in the plane PB1 of the memory device MC1. The page data PG13 is written to the middle page of the selected cell unit CUs00 in the plane PB0 of the memory device MC0. The page data PG14 is written to the upper page of the selected cell unit CUs01 in the plane PB1 of the memory device MC0. The page data PG15 is written to the top page of the selected cell unit CUs10 in the plane PB0 of the memory device MC1.

<4.3. Data Reads>

FIGS. 28 to 31 illustrate the flow of the input and output signal DQ during data reads over time in the memory system 100 according to the fourth embodiment. FIGS. 28 to 31 illustrate temporally successive states in order.

Figures 31, 32:
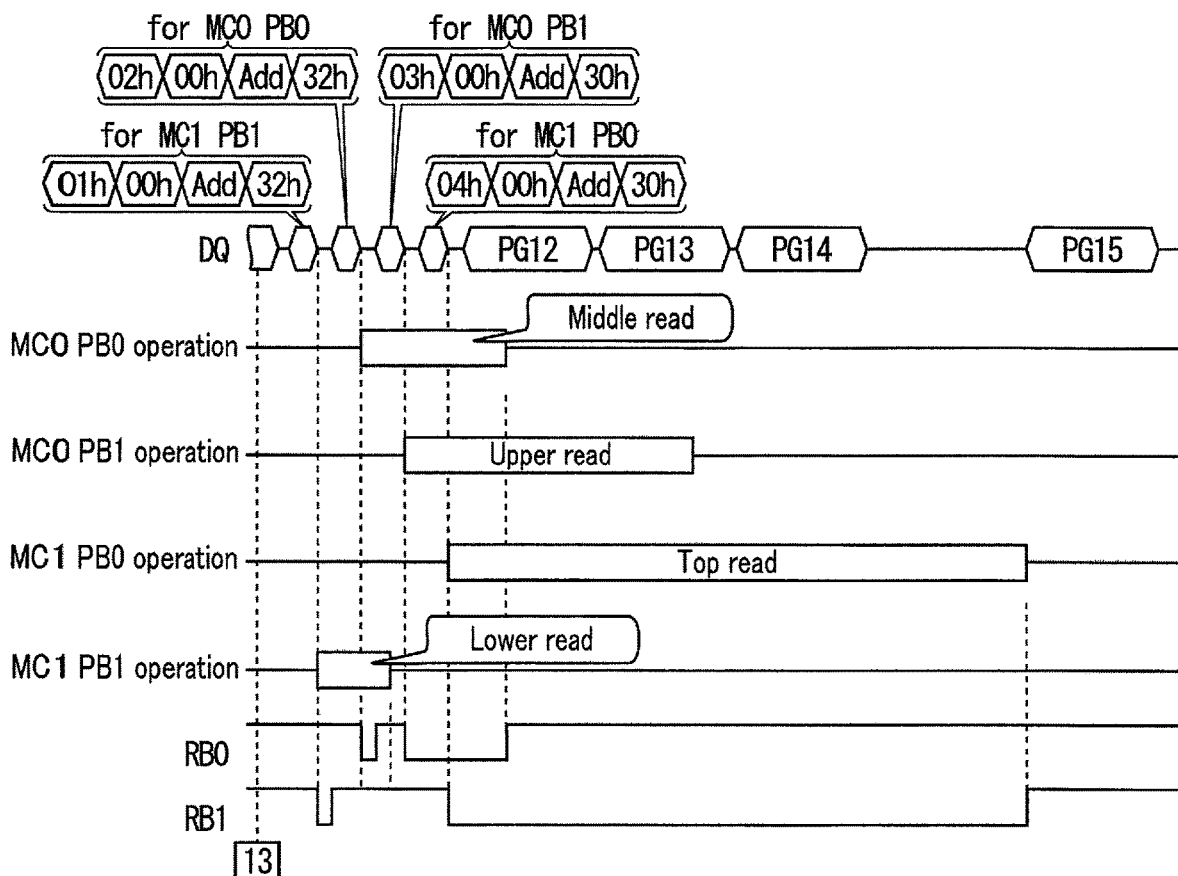
FIG. 31 illustrates an input and output signal during data reads over time in the memory system according to the fourth embodiment.
FIG. 32 illustrates a second example of positions where page data are written in the memory devices according to the fourth embodiment.

As illustrated in FIGS. 28 and 31, a data read from any of the non-fast pages proceeds in parallel with a data read of a fast page (lower page).

To read the data set containing the page data PG0 to PG3, the memory controller 2 first instructs the memory device MC0 to read the page data PG0 stored in the fast page. The memory device MC0 receives the instruction and starts a lower page read in the plane PB0 of the memory device MC0 for obtaining the page data PG0. Next, the memory controller 2 instructs the memory device MC0 to perform a middle page read for the page data PG1, instructs the memory device MC1 to perform an upper page read for the page data PG2, and instructs the memory device MC1 to perform a top page read for the page data PG3. The lower page read in the plane PB0 of the memory device MC0, the middle page read in the plane PB1 of the memory device MC0, the upper page read in the plane PB0 of the memory device MC1, and the top page read in the plane PB1 of the memory device MC1 proceed in parallel.

When the read of the page data PG0 is completed, the memory device MC0 outputs the page data PG0 in accordance with the instruction from the memory controller 2. While the memory device MC0 is outputting the page data PG0, the middle page read in the memory device MC0, the upper page read in the memory device MC1, and the top page read in the memory device MC1 can proceed.

Thereafter, the memory controller 2 similarly reads the data set containing the page data PG4 to PG7, reads the data set containing the page data PG8 to PG11, and reads the data set containing the page data PG12 to PG15. For reading any of the data sets, a data read from the fast page of each data set is started first, and after that, data reads from the non-fast pages are started. Thus, in each data set, a lower page read, a middle page read, an upper page read, and a top page read proceed in parallel over the planes PB0 and PB1 of each of the memory devices MC0 and MC1.

<4.4. Another Example of Writes>

An example of data writes includes writes as illustrated in FIG. 32. FIG. 32 illustrates a second example of positions where page data are written in the memory devices MC according to the fourth embodiment.

As illustrated in FIG. 32, the page data PG0 is written to the lower page of the selected cell unit CUs00 in the plane PB0 of the memory device MC0. The page data PG1 is written to the middle page of the selected cell unit CUs01 in the plane PB1 of the memory device MC0. The page data PG2 is written to the upper page of the selected cell unit CUs10 in the plane PB0 of the memory device MC1. The page data PG3 is written to the top page of the selected cell unit CUs11 in the plane PB1 of the memory device MC1.

The page data PG4 is written to the lower page of the selected cell unit CUs01 in the plane PB1 of the memory device MC0. The page data PG5 is written to the middle page of the selected cell unit CUs00 in the plane PB0 of the memory device MC0. The page data PG6 is written to the upper page of the selected cell unit CUs11 in the plane PB1 of the memory device MC1. The page data PG7 is written to the top page of the selected cell unit CUs10 in the plane PB0 of the memory device MC1.

The page data PG8 is written to the lower page of the selected cell unit CUs10 in the plane PB0 of the memory device MC1. The page data PG9 is written to the middle page of the selected cell unit CUs11 in the plane PB1 of the memory device MC1. The page data PG10 is written to the upper page of the selected cell unit CUs01 in the plane PB1 of the memory device MC0. The page data PG11 is written to the top page of the selected cell unit CUs00 in the plane PB0 of the memory device MC0.

The page data PG12 is written to the lower page of the selected cell unit CUs11 in the plane PB1 of the memory device MC1. The page data PG13 is written to the middle page of the selected cell unit CUs10 in the plane PB0 of the memory device MC1. The page data PG14 is written to the upper page of the selected cell unit CUs00 in the plane PB0 of the memory device MC0. The page data PG15 is written to the top page of the selected cell unit CUs01 in the plane PB1 of the memory device MC0.

<4.5. Advantages>

According to the fourth embodiment, the 1248 mapping is used instead of the 4434 mapping in the second embodiment, but other than the features based on this point, the fourth embodiment has the same features as the second embodiment. The same advantages as the second embodiment are also obtained with the 1248 mapping.

Fifth Embodiment

The fifth embodiment is similar to the third embodiment, and is different from the third embodiment in the mapping.

The configuration of the memory system 100 and the memory devices MC according to the fifth embodiment is the same as that of the first embodiment.

In the fifth embodiment, the 1248 mapping is used like in the fourth embodiment.

<5.1. Data Writes>

In the fifth embodiment, like the third embodiment, each cell unit CU stores data of four pages in size, and the four pages include just one fast page. Based on this configuration, in the fifth embodiment, the memory area unit MA3 spreads over four memory devices MC as in the third embodiment.

FIG. 33 illustrates an example of the memory area unit MA3 and positions where page data are written in the memory devices MC according to the fifth embodiment.

For each of the cases where $\gamma$ is 0, 4, 8, and 12, the page data PG$\gamma$, the page data PG($\gamma$+1), the page data PG($\gamma$+2), and the page data PG($\gamma$+3) form a data set.

As illustrated in FIG. 33, the page data PG$\gamma$, PG($\gamma$+1), PG($\gamma$+2), and PG($\gamma$+3) in each data set are written one by one to the memory devices MC0 to MC3, and one of the page data PG$\gamma$, PG($\gamma$+1), PG($\gamma$+2), and PG($\gamma$+3) is written to a fast page (lower page) while the remaining three are written to non-fast pages. In addition, each piece of page data PG included in a data set and written to a non-fast page is written to any of the middle, upper, and top pages. Furthermore, the pages to which the page data PG0 to PG15 are written are determined such that four data sets are written to the memory area unit MA3. Insofar as writes are performed in this way, the positions where the page data PG0 to PG15 are written are not limited to the example in FIG. 33. As an example, the page data written to the non-fast pages can be written to different one of middle, upper, and top pages.

As illustrated in FIG. 33, the page data PG0 is written to the lower page of the selected cell unit CUs0$w$ of the memory device MC0. The page data PG1 is written to the middle page of the selected cell unit CUs1$w$ of the memory device MC1. The page data PG2 is written to the upper page of the selected cell unit CUs2$w$ of the memory device MC2. The page data PG3 is written to the top page of the selected cell unit CUs3$w$ of the memory device MC3.

The page data PG4 is written to the lower page of the selected cell unit CUs1$w$ of the memory device MC1. The page data PG5 is written to the middle page of the selected cell unit CUs2$w$ of the memory device MC2. The page data PG6 is written to the upper page of the selected cell unit CUs3$w$ of the memory device MC3. The page data PG7 is written to the top page of the selected cell unit CUs0$w$ of the memory device MC0.

The page data PG8 is written to the lower page of the selected cell unit CUs2$w$ of the memory device MC2. The page data PG9 is written to the middle page of the selected cell unit CUs3$w$ of the memory device MC3. The page data PG10 is written to the upper page of the selected cell unit CUs0$w$ of the memory device MC0. The page data PG11 is written to the top page of the selected cell unit CUs1$w$ of the memory device MC1.

The page data PG12 is written to the lower page of the selected cell unit CUs3$w$ of the memory device MC3. The page data PG13 is written to the middle page of the selected cell unit CUs0$w$ of the memory device MC0. The page data PG14 is written to the upper page of the selected cell unit CUs1$w$ of the memory device MC1. The page data PG15 is written to the top page of the selected cell unit CUs2$w$ of the memory device MC2.

<5.2. Data reads>

Data reads follow the basic principle described for the other embodiments, and particularly resembles the third embodiment. In other words, data are read in parallel for each data set, and a data read from any of the non-fast pages proceeds in parallel with a data read of a fast page (lower page).

To read the data set containing the page data PG0 to PG3, the memory controller 2 first instructs the memory device MC0 to read the page data PG0 stored in the fast page. Next, the memory controller 2 instructs the memory device MC1 to perform a middle page read for the page data PG1, instructs the memory device MC2 to perform an upper page read for the page data PG2, and instructs the memory device MC3 to perform a top page read for the page data PG3.

When the read of the page data PG0 is completed, the memory device MC0 outputs the page data PG0 in accordance with the instruction from the memory controller 2. While the memory device MC0 is outputting the page data PG0, the middle page read in the memory device MC1, the upper page read in the memory device MC2, and the top page read in the memory device MC3 can proceed.

Thereafter, the memory controller 2 similarly reads the data set containing the page data PG4 to PG7, reads the data set containing the page data PG8 to PG11, and reads the data set containing the page data PG12 to PG15. For reading any of the data sets, a data read from the fast page of each data set is started first, and after that, data reads from the non-fast pages are started.

<5.3. Advantages>

According to the fifth embodiment, the 1248 mapping is used instead of the 4434 mapping in the third embodiment, but other than the features based on this point, the fifth embodiment has the same features as the third embodiment. The same advantages as the third embodiment are also obtained with the 1248 mapping.

<5.4. Modification>

Like the modification of the third embodiment, the fifth embodiment may also be applied to multi-plane operations in which independent operation is unavailable. In this modification, like the modification of the third embodiment, the memory area unit MA3$a$ is used. Hereinafter, the features that differ from the modification of the third embodiment will be described mainly.

FIG. 34 illustrates an example of positions where page data are written in the memory devices MC according to the modification of the fifth embodiment. For each of the cases where γ is 0, 4, 8, and 12, the page data PGγ, the page data PG(γ+1), the page data PG(γ+2), the page data PG(γ+3), the page data PG(γ+4), the page data PG(γ+5), the page data PG(γ+6), and the page data PG(γ+7) form a data set.

As illustrated in FIG. 34, the page data PG0 is written to the lower page of the selected cell unit CUs00 in the plane PB0 of the memory device MC0. The page data PG1 is written to the lower page of the selected cell unit CUs01 in the plane PB1 of the memory device MC0.

The page data PG2 is written to the middle page of the selected cell unit CUs10 in the plane PB0 of the memory device MC1. The page data PG3 is written to the middle page of the selected cell unit CUs11 in the plane PB1 of the memory device MC1.

The page data PG4 is written to the upper page of the selected cell unit CUs20 in the plane PB0 of the memory device MC2. The page data PG5 is written to the upper page of the selected cell unit CUs21 in the plane PB1 of the memory device MC2.

The page data PG6 is written to the top page of the selected cell unit CUs30 in the plane PB0 of the memory device MC3. The page data PG7 is written to the top page of the selected cell unit CUs31 in the plane PB1 of the memory device MC3.

The page data PG8 is written to the lower page of the selected cell unit CUs10 in the plane PB0 of the memory device MC1. The page data PG9 is written to the lower page of the selected cell unit CUs11 in the plane PB1 of the memory device MC1.

The page data PG10 is written to the middle page of the selected cell unit CUs20 in the plane PB0 of the memory device MC2. The page data PG11 is written to the middle page of the selected cell unit CUs21 in the plane PB1 of the memory device MC2.

The page data PG12 is written to the upper page of the selected cell unit CUs30 in the plane PB0 of the memory device MC3. The page data PG13 is written to the upper page of the selected cell unit CUs31 in the plane PB1 of the memory device MC3.

The page data PG14 is written to the top page of the selected cell unit CUs00 in the plane PB0 of the memory device MC0. The page data PG15 is written to the top page of the selected cell unit CUs01 in the plane PB1 of the memory device MC0.

The page data PG16 is written to the lower page of the selected cell unit CUs20 in the plane PB0 of the memory device MC2. The page data PG17 is written to the lower page of the selected cell unit CUs21 in the plane PB1 of the memory device MC2.

The page data PG18 is written to the middle page of the selected cell unit CUs30 in the plane PB0 of the memory device MC3. The page data PG19 is written to the middle page of the selected cell unit CUs31 in the plane PB1 of the memory device MC3.

The page data PG20 is written to the upper page of the selected cell unit CUs00 in the plane PB0 of the memory device MC0. The page data PG21 is written to the upper page of the selected cell unit CUs01 in the plane PB1 of the memory device MC0.

The page data PG22 is written to the top page of the selected cell unit CUs10 in the plane PB0 of the memory device MC1. The page data PG23 is written to the top page of the selected cell unit CUs11 in the plane PB1 of the memory device MC1.

The page data PG24 is written to the lower page of the selected cell unit CUs30 in the plane PB0 of the memory device MC3. The page data PG25 is written to the lower page of the selected cell unit CUs31 in the plane PB1 of the memory device MC3.

The page data PG26 is written to the middle page of the selected cell unit CUs00 in the plane PB0 of the memory device MC0. The page data PG27 is written to the middle page of the selected cell unit CUs01 in the plane PB1 of the memory device MC0.

The page data PG28 is written to the upper page of the selected cell unit CUs10 in the plane PB0 of the memory device MC1. The page data PG29 is written to the upper page of the selected cell unit CUs11 in the plane PB1 of the memory device MC1.

The page data PG30 is written to the top page of the selected cell unit CUs20 in the plane PB0 of the memory device MC2. The page data PG31 is written to the top page of the selected cell unit CUs21 in the plane PB1 of the memory device MC2.

For data reads, the basic principle is the same as data reads according to the fifth embodiment, the difference being that pairs of page data PG are read in parallel, like the modification of the third embodiment.

Sixth Embodiment

The sixth embodiment resembles the third embodiment. In the sixth embodiment, each memory device MC stores three bits of data per memory cell transistor MT.

The configuration of the memory system 100 and the memory devices MC according to the sixth embodiment is the same as that of the third embodiment.

<6.1. Mapping>

In the sixth embodiment, a 133 mapping is used. The notation "HIJ mapping" indicates that H, I, and J read voltages VCGR are used for the lower, middle, and upper page reads, respectively.

Figure 35:
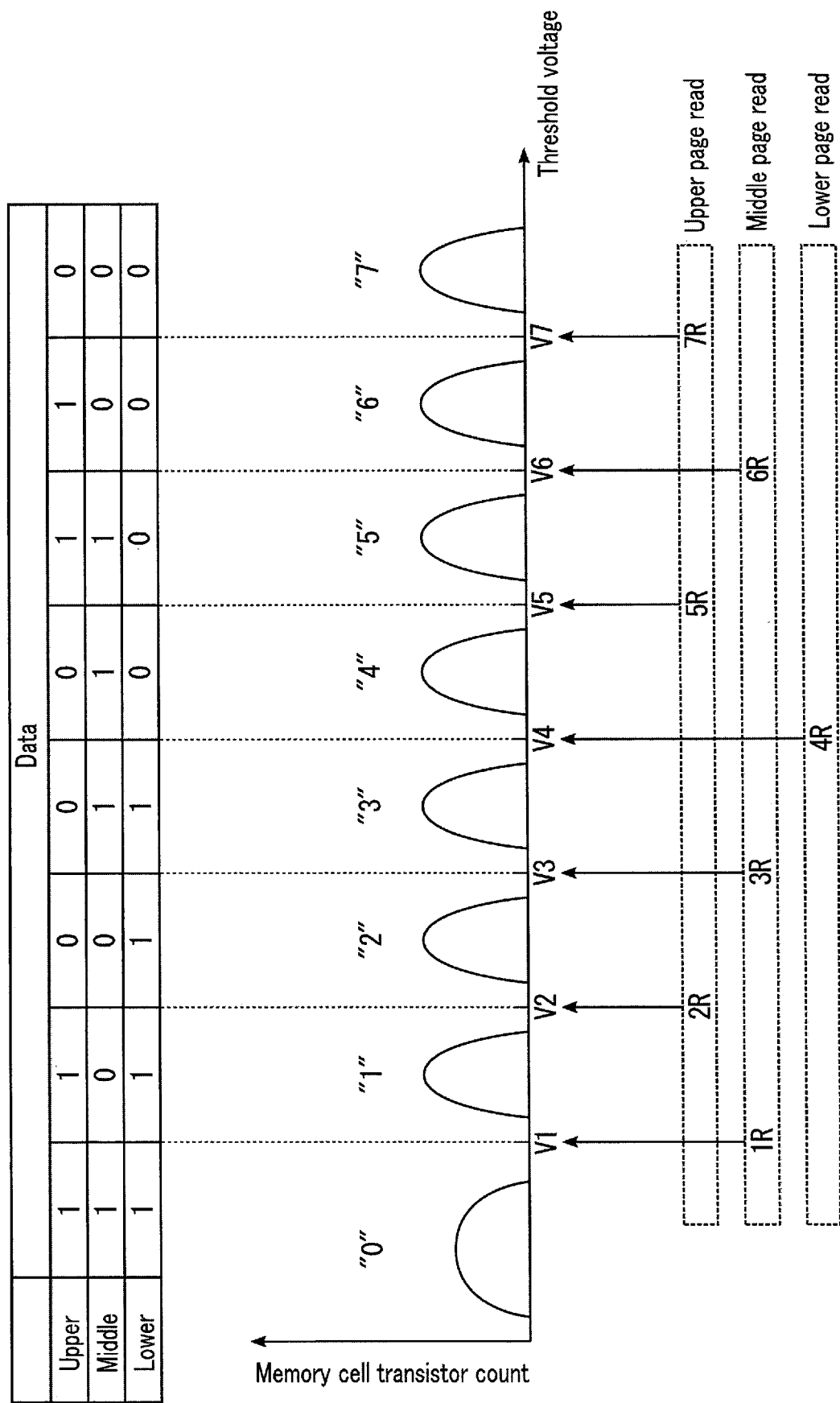
FIG. 35 illustrates a mapping between a threshold voltage distribution of memory cell transistors and data according to a sixth embodiment.

FIG. 35 illustrates a mapping between a threshold voltage distribution of memory cell transistors MT that store three bits of data per memory cell transistor MT and data according to the sixth embodiment. As illustrated in FIG. 35, in the sixth embodiment, each memory device MC treats each state as having the following three-bit data. In the following "ABC" notation, A, B, and C represent the values of the upper, middle, and lower bits, respectively.

"0" State: "111"
"1" State: "101"
"2" State: "001"
"3" State: "011"
"4" State: "010"
"5" State: "110"
"6" State: "100"
"7" State: "000"

In the 133 mapping, the data of each page is determined using the following read voltages.

Lower page read: 4R
Middle page read: 1R, 3R, and 6R
Upper page read: 2R, 5R, and 7R In the 133 mapping, the lower page corresponds to the fast page, while the middle page and the upper page correspond to non-fast pages.

<6.2. Data Writes>

In the sixth embodiment, each cell unit CU stores data of three pages in size, and the three pages include just one fast page. Based on this configuration, in the sixth embodiment, the memory area unit MA needs to spread over three independently operable planes PB. In the sixth embodiment, the planes PB0 and PB1 in each memory device MC cannot operate independently. For this reason, the memory area unit MA needs to spread over three memory devices MC.

To this end, the memory area unit MA according to the sixth embodiment spreads over a plane PB of the memory device MC0, a plane PB of the memory device MC1, and a plane PB of the memory device MC2. The memory area unit MA according to the sixth embodiment is referred to as the memory area unit MA4.

FIG. 36 illustrates an example of the memory area unit MA4 and positions where page data are written in the memory devices MC according to the sixth embodiment. As illustrated in FIG. 36, the memory area unit MA4 is the set of the lower, middle, and upper pages of a cell unit CUs0w in a plane PBw of the memory device MC0, the lower, middle, and upper pages of a cell unit CUs1w in a plane PBw of the memory device MC1, and the lower, middle, and upper pages of a cell unit CUs2w in a plane PBw of a memory device MC2.

Based on such features of the memory area unit MA4, nine pieces of page data PG with consecutive logical addresses are stored in a single memory area unit MA4. As a specific example, FIG. 36 illustrates the positions where nine pieces of page data PG0 to PG8 with consecutive logical addresses are written in the memory area unit MA4.

For each of the cases where y is 0, 3, and 6, the page data PGγ, the page data PG(γ+1), and the page data PG(γ+2) form a data set.

As illustrated in FIG. 36, the page data PGγ, PG(γ+1), and PG(γ+2) in each data set are written one by one to the memory devices MC0 to MC2, and in addition, one of the page data PGγ, PG(γ+1), and PG(γ+2) is written to a fast page while the remaining two are written to non-fast pages. Also, the page data included in a data set and written to a non-fast page is written to any of the middle and upper pages. Furthermore, the pages to which the page data PG0 to PG8 are written are determined such that three data sets are written to the memory area unit MA4. Insofar as writes are performed in this way, the positions where the page data PG0 to PG8 are written is not limited to the example in FIG. 36. As an example, the page data written to the non-fast pages are written to different one of middle and upper pages.

As illustrated in FIG. 36, the page data PG0 is written to the lower page of the selected cell unit CUs0w of the memory device MC0. The page data PG1 is written to the middle page of the selected cell unit CUs1w of the memory device MC1. The page data PG2 is written to the upper page of the selected cell unit CUs2w of the memory device MC2.

The page data PG3 is written to the lower page of the selected cell unit CUs1w of the memory device MC1. The page data PG4 is written to the middle page of the selected cell unit CUs2w of the memory device MC2. The page data PG5 is written to the upper page of the selected cell unit CUs0w of the memory device MC0.

The page data PG6 is written to the lower page of the selected cell unit CUs2w of the memory device MC2. The page data PG7 is written to the middle page of the selected cell unit CUs0w of the memory device MC0. The page data PG8 is written to the upper page of the selected cell unit CUs1w of the memory device MC1.

<6.3. Data Reads>

Figure 37:
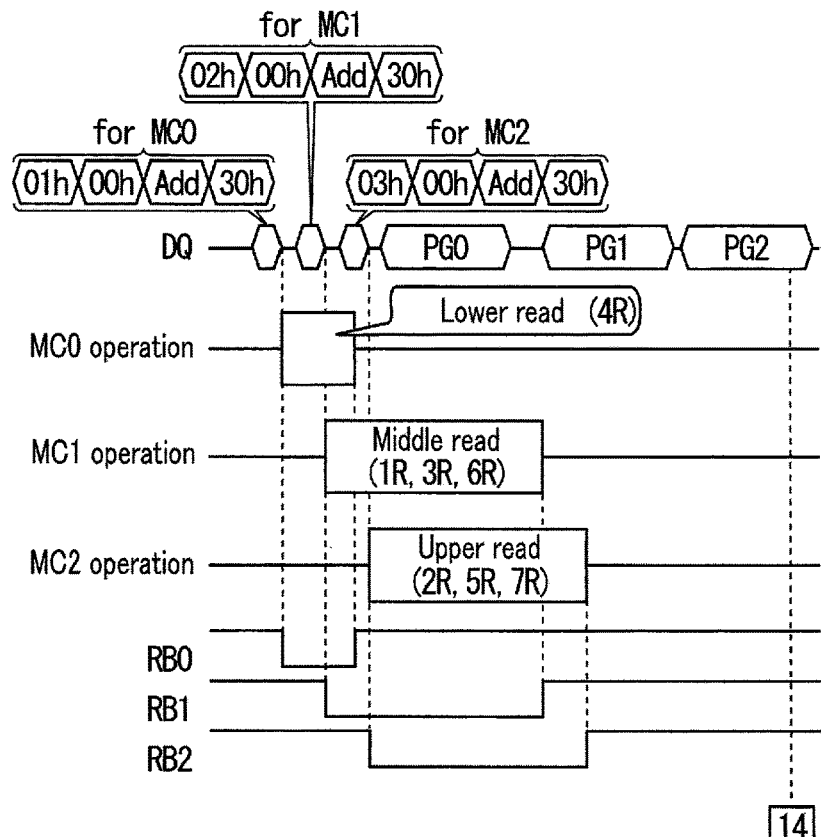
FIG. 37 illustrates an input and output signal during data reads over time in the memory system according to the sixth embodiment.
Figure 37:
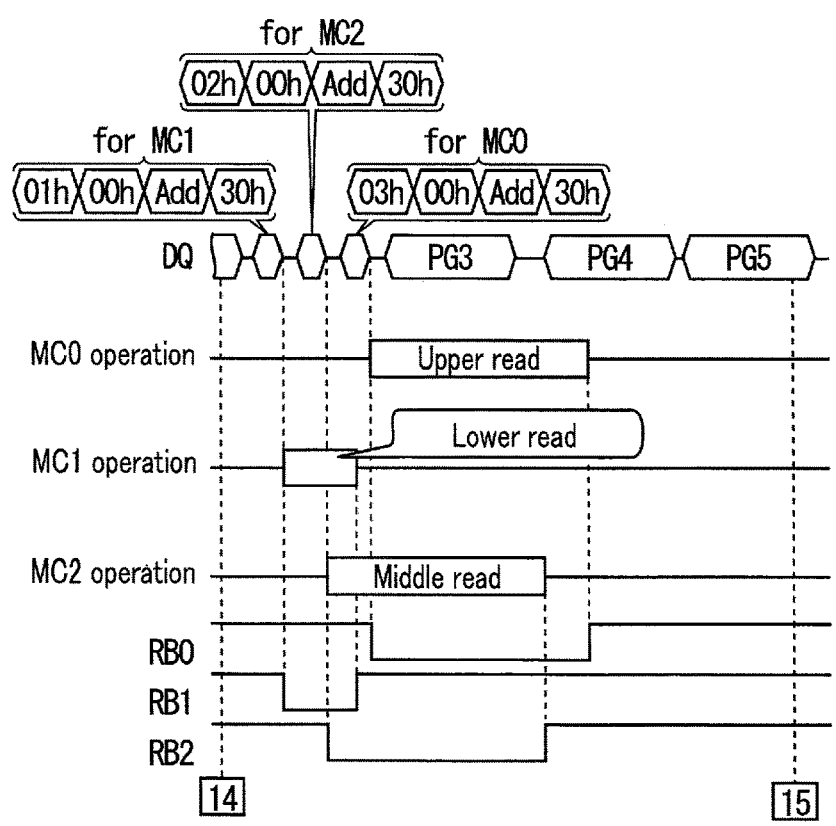

FIGS. 37 and 38 illustrate the flow of the input and output signal DQ during data reads over time in the memory system 100 according to the sixth embodiment. FIG. 38 illustrates the state following FIG. 37.

As illustrated in FIGS. 37 and 38, a data read from any of the non-fast pages proceeds in parallel with a data read of a fast page (lower page).

To read the data set containing the page data PG0 to PG2, the memory controller 2 first instructs the memory device MC0 to read the page data PG0 stored in the fast page. The memory device MC0 receives the instruction and starts a lower page read of the memory device MC0 for obtaining the page data PG0. Next, the memory controller 2 instructs the memory device MC1 to perform a middle page read for the page data PG1, and instructs the memory device MC2 to perform an upper page read for the page data PG2. The lower page read in the memory device MC0, the middle page read in the memory device MC1, and the upper page read in the memory device MC2 proceed in parallel.

When the read of the page data PG0 is completed, the memory device MC0 outputs the page data PG0 in accordance with the instruction from the memory controller 2. While the memory device MC0 is outputting the page data PG0, the middle page read in the memory device MC1 and the upper page read in the memory device MC2 can proceed.

Thereafter, the memory controller 2 similarly reads the data set containing the page data PG3 to PG5, and reads the data set containing the page data PG6 to PG8. For reading any of the data sets, a data read from the fast page of each data set is started first, and after that, data reads from the non-fast pages are started. Thus, in each data set, a lower page read, a middle page read, and an upper page read proceed in parallel over the memory devices MC0, MC1, and MC2.

<6.4. Another Example of Mapping>

In the sixth embodiment, other mappings may be used. Such mappings include a 124 mapping. FIG. 39 illustrates a second example of a mapping between a threshold voltage distribution of memory cell transistors MT that store three bits of data per memory cell transistor MT and data according to the sixth embodiment. As illustrated in FIG. 39, in the second example, each memory device MC treats each state as having the following three-bit data.

"0" State: "111"
"1" State: "011"
"2" State: "001"
"3" State: "101"
"4" State: "100"
"5" State: "000"
"6" State: "010"
"7" State: "110"

In the 124 mapping, the data of each page is determined using the following read voltages.
Lower page read: 4R
Middle page read: 2R and 6R
Upper page read: 1R, 3R, 5R, and 7R Also in the 124 mapping, the lower page corresponds to the fast page, while the middle page and the upper page correspond to non-fast pages.

Data writes and reads are the same as for the 133 mapping, the difference being only in the time taken for the middle page read and the upper page read.

<6.5. Advantages>

According to the sixth embodiment, the memory area unit MA4 spreads over three memory devices MC, first page data out of a data set containing three pieces of page data having three consecutive logical addresses is written to a fast page (lower page), while the remaining page data are written to different pages than the page where the first page data is written from among the lower, middle, and upper pages. During reads of a data set written in this way, reads of the page data other than the first page data of the data set can proceed while the first page data is being output. For this reason, even in the case of storing three bits of data per memory cell transistor MT, data can be read and output efficiently according to the same basic principle as the first embodiment.

<6.6. Modification>

Like the modification of the third embodiment, the sixth embodiment may also be applied to multi-plane operations in which independent operation is unavailable.

In this modification, a memory area unit MA4a is used. The memory area unit MA4a according to a modification of the sixth embodiment spreads over the planes PB0 and PB1 of the memory device MC0, the planes PB0 and PB1 of the memory device MC1, and the planes PB0 and PB1 of the memory device MC2.

FIG. 40 illustrates an example of the memory area unit MA4a and positions where page data are written in the memory devices MC according to the modification of the sixth embodiment. For each of the cases where γ is 0, 6, and 12, the page data PGγ, the page data PG(γ+1), the page data PG(γ+2), the page data PG(γ+3), the page data PG(γ+4), and the page data PG(γ+5) form a data set.

As illustrated in FIG. 40, the page data PG0 is written to the lower page of the selected cell unit CUs00 in the plane PB0 of the memory device MC0. The page data PG1 is written to the lower page of the selected cell unit CUs01 in the plane PB1 of the memory device MC0.

The page data PG2 is written to the middle page of the selected cell unit CUs10 in the plane PB0 of the memory device MC1. The page data PG3 is written to the middle page of the selected cell unit CUs11 in the plane PB1 of the memory device MC1.

The page data PG4 is written to the upper page of the selected cell unit CUs20 in the plane PB0 of the memory device MC2. The page data PG5 is written to the upper page of the selected cell unit CUs21 in the plane PB1 of the memory device MC2.

The page data PG6 is written to the lower page of the selected cell unit CUs10 in the plane PB0 of the memory device MC1. The page data PG7 is written to the lower page of the selected cell unit CUs11 in the plane PB1 of the memory device MC1.

The page data PG8 is written to the middle page of the selected cell unit CUs20 in the plane PB0 of the memory device MC2. The page data PG9 is written to the middle page of the selected cell unit CUs21 in the plane PB1 of the memory device MC2.

The page data PG10 is written to the upper page of the selected cell unit CUs00 in the plane PB0 of the memory device MC0. The page data PG11 is written to the upper page of the selected cell unit CUs01 in the plane PB1 of the memory device MC0.

The page data PG12 is written to the lower page of the selected cell unit CUs20 in the plane PB0 of the memory device MC2. The page data PG13 is written to the lower page of the selected cell unit CUs21 in the plane PB1 of the memory device MC2.

The page data PG14 is written to the middle page of the selected cell unit CUs00 in the plane PB0 of the memory device MC0. The page data PG15 is written to the middle page of the selected cell unit CUs01 in the plane PB1 of the memory device MC0.

The page data PG16 is written to the upper page of the selected cell unit CUs10 in the plane PB0 of the memory device MC1. The page data PG17 is written to the upper page of the selected cell unit CUs11 in the plane PB1 of the memory device MC1.

For data reads, the basic principle is the same as data reads according to the sixth embodiment, the difference being that pairs of page data PG are read in parallel, like the modification of the fifth embodiment.

The modification may also be applied to the 124 mapping.

Seventh Embodiment

The seventh embodiment resembles the first embodiment and the sixth embodiment. In the seventh embodiment, like the sixth embodiment, each memory device MC stores three bits of data per memory cell transistor MT.

The configuration of the memory system 100 and the memory devices MC according to the seventh embodiment is the same as that of the first embodiment.

<7.1. Data Writes>

In the seventh embodiment, like the sixth embodiment, the 133 mapping or the 124 mapping is used, and the memory area unit MA needs to spread over three independently operable planes PB. To this end, the memory area unit MA according to the seventh embodiment spreads over the plane PB0 of the memory device MC0, the plane PB1 of the memory device MC0, and any plane PB (for example, PB0) of the memory device MC1. The memory area unit MA according to the seventh embodiment is referred to as the memory area unit MA5.

FIG. 41 illustrates an example of the memory area unit MA5 and positions where page data are written in the memory devices MC according to the seventh embodiment.

As illustrated in FIG. 41, the memory area unit MA5 is the set of the lower, middle, and upper pages of the cell unit CUs00 in the plane PB0 of the memory device MC0, the lower, middle, and upper pages of the cell unit CUs01 in the plane PB1 of the memory device MC0, and the lower, middle, and upper pages of the cell unit CUs10 in the plane PB0 for example of the memory device MC1.

The page data PG0 is written to the lower page of the selected cell unit CUs00 in the plane PB0 of the memory device MC0. The page data PG1 is written to the middle page of the selected cell unit CUs01 in the plane PB1 of the memory device MC0. The page data PG2 is written to the upper page of the selected cell unit CUs10 in the plane PB0 of the memory device MC1.

The page data PG3 is written to the lower page of the selected cell unit CUs01 in the plane PB1 of the memory device MC0. The page data PG4 is written to the middle page of the selected cell unit CUs10 in the plane PB0 of the memory device MC1. The page data PG5 is written to the upper page of the selected cell unit CUs00 in the plane PB0 of the memory device MC0.

The page data PG6 is written to the lower page of the selected cell unit CUs10 in the plane PB0 of the memory device MC1. The page data PG7 is written to the middle page of the selected cell unit CUs00 in the plane PB0 of the memory device MC0. The page data PG8 is written to the upper page of the selected cell unit CUs01 in the plane PB1 of the memory device MC0.

<7.2. Data Reads>

Data reads follow the basic principle described for the other embodiments, and particularly resembles the sixth embodiment. In other words, data are read in parallel for each data set, and a data read from any of the non-fast pages proceeds in parallel with a data read of a fast page (lower page). A feature that differs from the sixth embodiment is that the command set for data reads is different on the basis of three independent planes PB that store the three pieces of page data PG of a data set spreading over two memory devices MC.

<7.3. Advantages>

According to the seventh embodiment, the memory area unit MA5 spreads over two memory devices MC, and, like the sixth embodiment, first page data out of a data set containing three pieces of page data having three consecutive logical addresses is written to a fast page (lower page), while the remaining page data are written to different pages than the page where the first page data is written from among the lower, middle, and upper pages. Therefore, like the sixth embodiment, even in the case of storing three bits of data per memory cell transistor MT, data can be read and output efficiently according to the same basic principle as the first embodiment.

<7.4. Modification>

The memory area unit MA may also be formed over six planes PB with three memory devices MC. This modification relates to such an example.

In this modification, a memory area unit MA6 is used. The memory area unit MA6 spreads over the planes PB0 and PB1 of the memory device MC0, the planes PB0 and PB1 of the memory device MC1, and the planes PB0 and PB1 of the memory device MC2.

FIG. 42 illustrates an example of the memory area unit MA6 and positions where page data are written in the memory devices MC according to the modification of the seventh embodiment. As illustrated in FIG. 42, the memory area unit MA6 is the set of the lower, middle, and upper pages of a cell unit CUs00 in a plane PB0 of a memory device MC0, the lower, middle, and upper pages of a cell unit CUs01 in a plane PB1 of the memory device MC0, the lower, middle, and upper pages of a cell unit CUs10 in a plane PB0 of a memory device MC1, the lower, middle, and upper pages of a cell unit CUs11 in a plane PB1 of the memory device MC1, the lower, middle, and upper pages of a cell unit CUs20 in a plane PB0 of a memory device MC2, and the lower, middle, and upper pages of a cell unit CUs21 in a plane PB1 of the memory device MC2.

The page data PG0 is written to the lower page of the selected cell unit CUs00 in the plane PB0 of the memory device MC0. The page data PG1 is written to the middle page of the selected cell unit CUs01 in the plane PB1 of the memory device MC0. The page data PG2 is written to the upper page of the selected cell unit CUs10 in the plane PB0 of the memory device MC1.

The page data PG3 is written to the lower page of the selected cell unit CUs11 in the plane PB1 of the memory device MC1. The page data PG4 is written to the middle page of the selected cell unit CUs20 in the plane PB0 of the memory device MC2. The page data PG5 is written to the upper page of the selected cell unit CUs21 in the plane PB1 of the memory device MC2.

The page data PG6 is written to the lower page of the selected cell unit CUs01 in the plane PB1 of the memory device MC0. The page data PG7 is written to the middle page of the selected cell unit CUs10 in the plane PB0 of the memory device MC1. The page data PG8 is written to the upper page of the selected cell unit CUs11 in the plane PB1 of the memory device MC1.

The page data PG9 is written to the lower page of the selected cell unit CUs20 in the plane PB0 of the memory device MC2. The page data PG10 is written to the middle page of the selected cell unit CUs21 in the plane PB1 of the memory device MC2. The page data PG11 is written to the upper page of the selected cell unit CUs00 in the plane PB0 of the memory device MC0.

The page data PG12 is written to the lower page of the selected cell unit CUs10 in the plane PB0 of the memory device MC1. The page data PG13 is written to the middle page of the selected cell unit CUs11 in the plane PB1 of the memory device MC1. The page data PG14 is written to the upper page of the selected cell unit CUs20 in the plane PB0 of the memory device MC2.

The page data PG15 is written to the lower page of the selected cell unit CUs21 in the plane PB1 of the memory device MC2. The page data PG16 is written to the middle page of the selected cell unit CUs00 in the plane PB0 of the memory device MC0. The page data PG17 is written to the upper page of the selected cell unit CUs01 in the plane PB1 of the memory device MC0.

Eighth Embodiment

The eighth embodiment resembles the first embodiment and the sixth embodiment, and relates to an example in which each memory device MC includes three independently operable planes PB. In the eighth embodiment, like the sixth embodiment, each memory device MC stores three bits of data per memory cell transistor.

The configuration of the memory system 100 and the memory devices MC according to the eighth embodiment is the same as that of the first embodiment, except that the memory devices MC include three planes PB. Hereinafter, the features that differ from the sixth embodiment will be described mainly.

<8.1. Configuration of Memory Devices>

Each memory device MC includes a plane PB2 in addition to the components and connections illustrated in FIG. 3. The plane PB2 is independent from the planes PB0 and PB1, and can execute data read, write, and erase operations independently. To this end, the plane PB2 includes a memory cell array 13_2, a potential generator 14_2, a driver 15_2, a sense amplifier 16_2, and a row decoder 17_2 (not illustrated). The memory cell array 13_2, the potential generator 14_2, the driver 15_2, the sense amplifier 16_2, and the row decoder 17_2 include the same components and connections as the memory cell array 13_0, the potential generator 14_0, the driver 15_0, the sense amplifier 16_0, and the row decoder 17_0 of the plane PB0, respectively.

<8.2. Data Writes>

In the eighth embodiment, like the sixth embodiment, the 133 mapping or the 124 mapping is used, and the memory area unit MA needs to spread over three independently operable planes PB. To this end, the memory area unit MA according to the eighth embodiment spreads over the plane PB0 of a certain memory device MCw, the plane PB1 of the memory device MCw, and the plane PB2 of the memory device MCw. The memory area unit MA according to the eighth embodiment is referred to as the memory area unit MA7.

FIG. 43 illustrates an example of the memory area unit MA7 and positions where page data are written in the memory device MC according to the eighth embodiment, and illustrates the memory device MC0 as an example. As illustrated in FIG. 43, the memory area unit MA7 is the set of the lower, middle, and upper pages of the cell unit CUs00 in the plane PB0 of the memory device MC0, the lower, middle, and upper pages of the cell unit CUs01 in the plane PB1 of the memory device MC0, and the lower, middle, and upper pages of a cell unit CUs02 in the plane PB2 of the memory device MC0.

The page data PG0 is written to the lower page of the selected cell unit CUs00 in the plane PB0 of the memory device MC0. The page data PG1 is written to the middle page of the selected cell unit CUs01 in the plane PB1 of the memory device MC0. The page data PG2 is written to the upper page of the selected cell unit CUs02 in the plane PB2 of the memory device MC0.

The page data PG3 is written to the lower page of the selected cell unit CUs01 in the plane PB1 of the memory device MC0. The page data PG4 is written to the middle page of the selected cell unit CUs02 in the plane PB2 of the memory device MC0. The page data PG5 is written to the upper page of the selected cell unit CUs00 in the plane PB0 of the memory device MC0.

The page data PG6 is written to the lower page of the selected cell unit CUs02 in the plane PB2 of the memory device MC0. The page data PG7 is written to the middle page of the selected cell unit CUs00 in the plane PB0 of the memory device MC0. The page data PG8 is written to the upper page of the selected cell unit CUs01 in the plane PB1 of the memory device MC0.

<8.3. Data Reads>

Data reads follow the basic principle described for the other embodiments, and particularly resembles the sixth embodiment. In other words, data are read in parallel for each data set, and a data read from any of the non-fast pages proceeds in parallel with a data read of a fast page (lower page). A feature that differs from the sixth embodiment is that the command set for data reads is different on the basis of three independent planes PB that store the three pieces of page data of a data set being included in a single memory device MC.

<8.4. Advantages>

According to the eighth embodiment, the memory area unit MA7 spreads over three independently operable planes PB in a single memory device MC, and, like the sixth embodiment, first page data out of a data set containing three pieces of page data having three consecutive logical addresses is written to a fast page (lower page), while the remaining page data are written to different pages than the page where the first page data is written from among the lower, middle, and upper pages. Therefore, like the sixth embodiment, even in the case of storing three bits of data per memory cell transistor MT, data can be read and output efficiently according to the same basic principle as the first embodiment.

Ninth Embodiment

The ninth embodiment resembles the first embodiment and the sixth embodiment. In the ninth embodiment, like the sixth embodiment, the memory devices MC store three bits of data per memory cell transistor.

The configuration of the memory system 100 and the memory devices MC according to the ninth embodiment is the same as that of the sixth embodiment.

<9.1. Mapping>

Figure 44:
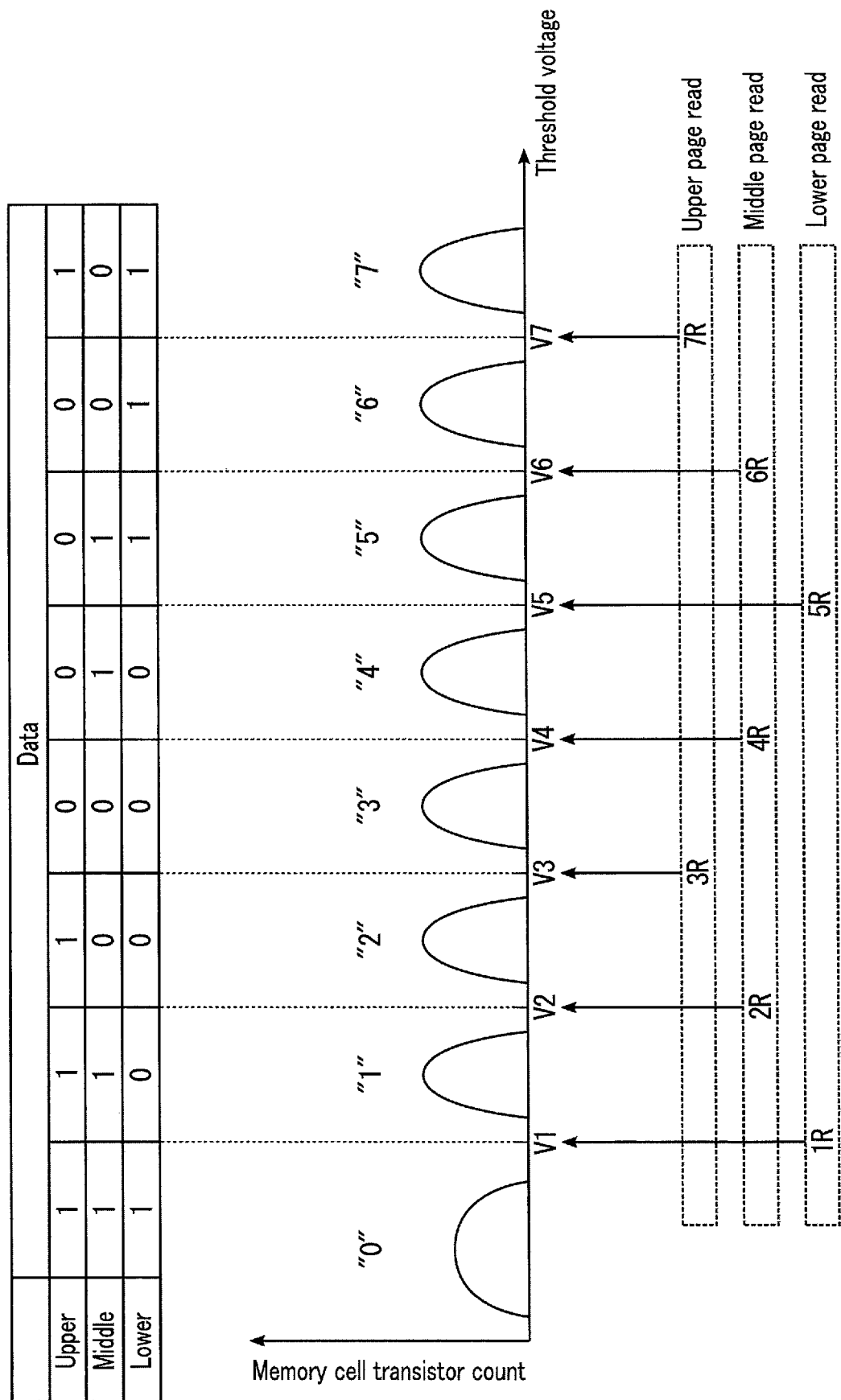
FIG. 44 illustrates a mapping between a threshold voltage distribution of memory cell transistors and data according to a ninth embodiment.

In the ninth embodiment, a 232 mapping is used. FIG. 44 illustrates an example of a mapping between eight states of the memory cell transistors MT in the memory devices MC and three-bit data according to the ninth embodiment. As illustrated in FIG. 44, in the ninth embodiment, the memory devices MC treats each state as having the following three-bit data.

"0" State: "111"
"1" State: "110"
"2" State: "100"
"3" State: "000"
"4" State: "010"
"5" State: "011"
"6" State: "001"
"7" State: "101"

In the 232 mapping, the data of each page is determined using the following read voltages.
Lower page read: 1R and 5R
Middle page read: 2R, 4R, and 6R
Upper page read: 3R and 7R In the 232 mapping, the lower page and the upper page correspond to fast pages, while the middle page corresponds to the non-fast page.

<9.2. Data Writes>

In the ninth embodiment, each cell unit CU stores data of three pages in size, and the three pages include two fast pages. Based on this configuration, in the ninth embodiment, the memory area unit MA needs to spread over three independently operable planes PB. Like the sixth embodiment, the memory area unit MA4 is used.

FIG. 45 illustrates an example of positions where page data are written in the memory devices MC according to the ninth embodiment.

As illustrated in FIG. 45, the page data PG0 is written to the upper page of the selected cell unit CUs0w of the memory device MC0. The page data PG1 is written to the lower page of the selected cell unit CUs1w of the memory device MC1. The page data PG2 is written to the middle page of the selected cell unit CUs2w of the memory device MC2.

The page data PG3 is written to the upper page of the selected cell unit CUs1w of the memory device MC1. The page data PG4 is written to the lower page of the selected cell unit CUs2w of the memory device MC2. The page data PG5 is written to the middle page of the selected cell unit CUs0w of the memory device MC0. The page data PG6 is written to the upper page of the selected cell unit CUs2w of the memory device MC2. The page data PG7 is written to the lower page of the selected cell unit CUs0w of the memory device MC0. The page data PG8 is written to the middle page of the selected cell unit CUs1w of the memory device MC1.

The writes in FIG. 45 are an example, are the lower page may also be used as the fast page.

<9.3. Data Reads>

Data reads follow the basic principle described for the other embodiments, and particularly resembles the sixth embodiment. In other words, data is read in parallel for each data set, and a data read from any of the non-fast pages proceeds in parallel with a data read of a fast page (lower or upper page). A feature that differs from the sixth embodiment is that the command set for data reads is different on the basis of three independent planes PB that store the three pieces of page data of a data set extending over three memory devices MC.

<9.4. Advantages>

According to the ninth embodiment, like the sixth embodiment, the memory area unit MA4 spreads over three memory devices MC, first page data out of a data set containing three pieces of page data having three consecutive logical addresses is written to a fast page, while the remaining page data are written to different pages than the page where the first page data is written from among the lower, middle, and upper pages. Therefore, like the sixth embodiment, even in the case of storing three bits of data per memory cell transistor MT, data can be read and output efficiently according to the same basic principle as the first embodiment.

<9.5. Modification>

Like the modification of the sixth embodiment, the ninth embodiment may also be applied to multi-plane operations in which independent operation is unavailable.

10th Embodiment

The 10th embodiment resembles the eighth embodiment and the ninth embodiment, and relates to an example in which each memory device MC includes three independently operable planes. In the 10th embodiment, like the sixth embodiment, the memory devices MC store three bits of data per memory cell transistor.

The configuration of the memory system 100 and the memory devices MC according to the 10th embodiment is the same as the eighth embodiment.

<10.1. Data Writing>

In the 10th embodiment, the 232 mapping is used like the ninth embodiment, and the memory area unit MA7 is used like the eighth embodiment.

FIG. 46 illustrates an example of positions where page data are written in the memory device MC according to the 10th embodiment, and illustrates the memory device MC0 as an example. As illustrated in FIG. 46, the page data PG0 is written to the upper page of the selected cell unit CUs00 in the plane PB0 of the memory device MC0. The page data PG1 is written to the lower page of the selected cell unit CUs01 in the plane PB1 of the memory device MC0. The page data PG2 is written to the middle page of the selected cell unit CUs02 in the plane PB2 of the memory device MC0.

The page data PG3 is written to the upper page of the selected cell unit CUs01 in the plane PB1 of the memory device MC0. The page data PG4 is written to the lower page of the selected cell unit CUs02 in the plane PB2 of the memory device MC0. The page data PG5 is written to the middle page of the selected cell unit CUs00 in the plane PB0 of the memory device MC0.

The page data PG6 is written to the upper page of the selected cell unit CUs02 in the plane PB2 of the memory device MC0. The page data PG7 is written to the lower page of the selected cell unit CUs00 in the plane PB0 of the memory device MC0. The page data PG8 is written to the middle page of the selected cell unit CUs01 in the plane PB1 of the memory device MC0.

<10.2. Data Reads>

Data reads follow the basic principle described for the other embodiments, and particularly resembles the sixth embodiment. In other words, data are read in parallel for each data set, and a data read from any of the non-fast pages proceed in parallel with a data read of a fast page (upper page). A feature that differs from the sixth embodiment is that the page read first in the reads of each data set is different.

<10.3. Advantages>

According to the 10th embodiment the memory area unit MA7 spreads over three independently operable planes PB in a single memory device MC, and, like the sixth embodiment, first page data out of a data set containing three pieces of page data having three consecutive logical addresses is written to a fast page (upper page), while the remaining page data are written to different pages than the page where the first page data is written from among the lower, middle, and upper pages. Therefore, like the sixth embodiment, even in the case of storing three bits of data per memory cell transistor MT, data can be read and output efficiently according to the same basic principle as the first embodiment.

11th Embodiment

The 11th embodiment resembles the third embodiment. In the 11th embodiment, the memory devices MC store two bits of data per memory cell transistor.

The configuration of the memory system 100 and the memory devices MC according to the 11th embodiment is the same as that of the third embodiment.

<11.1. Mapping>

In the 11th embodiment, a 12 mapping is used. The notation "HI mapping" indicates that H and I read voltages VCGR are used for the lower and upper page reads, respectively.

Figure 47:
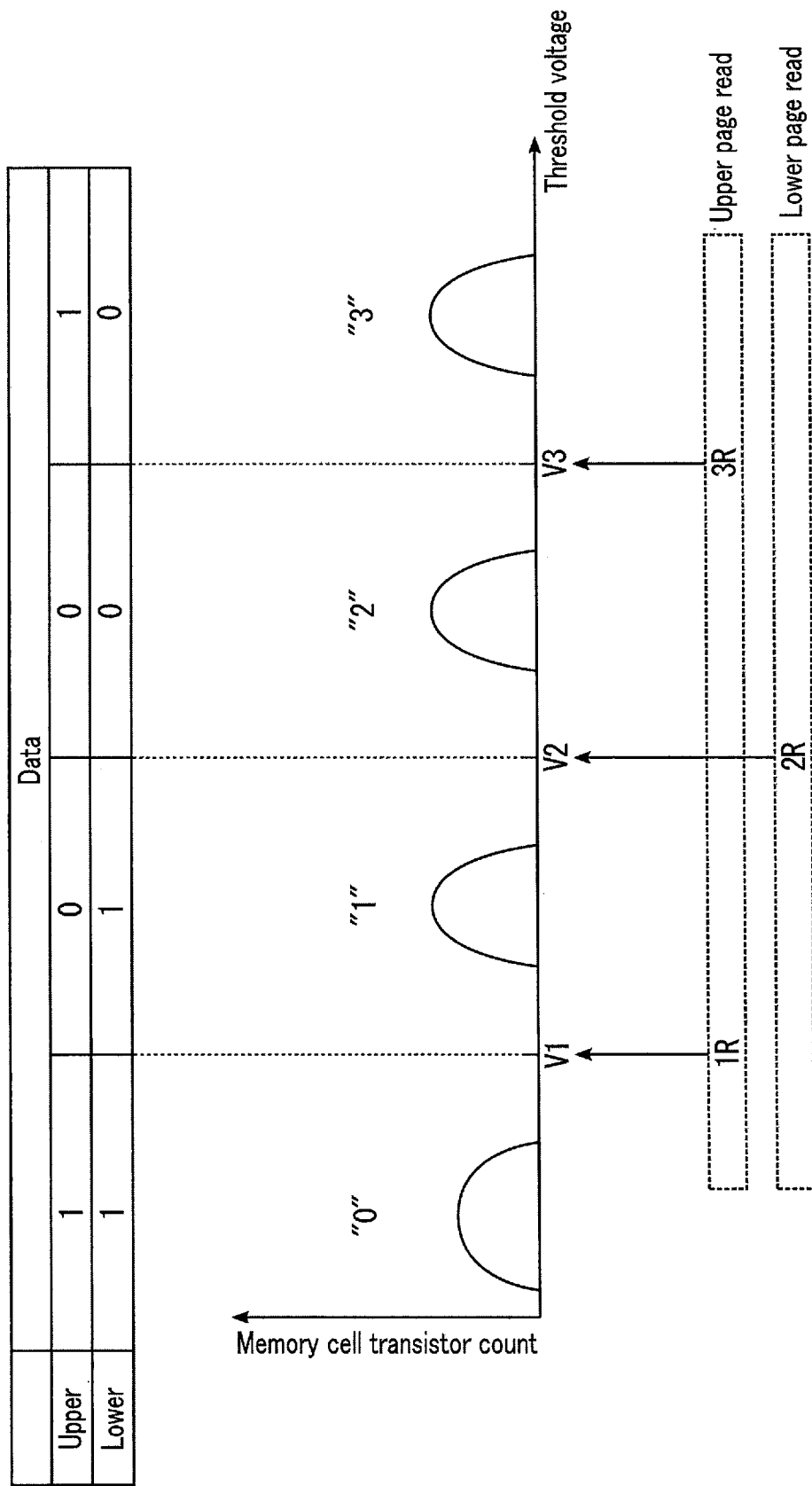
FIG. 47 illustrates a mapping between a threshold voltage distribution of memory cell transistors and data according to an 11th embodiment.

FIG. 47 illustrates an example of a mapping between four states of the memory cell transistors MT in the memory devices MC and two-bit data according to the 11th embodiment. As illustrated in FIG. 47, in the 11th embodiment, the memory devices MC treat each state as having the following two-bit data.

"0" State: "11"
"1" State: "10"
"2" State: "00"
"3" State: "01"

In the 12 mapping, the data of each page is determined using the following read voltages.

Lower page read: 2R
Upper page read: 1R and 3R

In the 12 mapping, the lower page corresponds to the fast page, while the upper page corresponds to the non-fast page.

To designate pages with respect to the memory devices MC that store two-bit data per memory cell transistor MT like the 11th embodiment, the command 01h and the command 02h are used. The command 01h designates the lower page. The command 02h designates the lower page.

<11.2. Data Writes>

In the 11th embodiment, each cell unit CU stores data of two pages in size, and the two pages include just one fast page. Based on this configuration, in the 11th embodiment, the memory area unit MA needs to spread over two independently operable planes PB. In the 11th embodiment, the planes PB0 and PB1 in each memory device MC cannot operate independently. For this reason, the memory area unit MA needs to spread over two memory devices MC.

To this end, the memory area unit MA according to the 11th embodiment spreads over a plane PB of the memory device MC0 and a plane PB of the memory device MC1. The memory area unit MA according to the 11th embodiment is referred to as the memory area unit MA8.

Figures 48, 49:
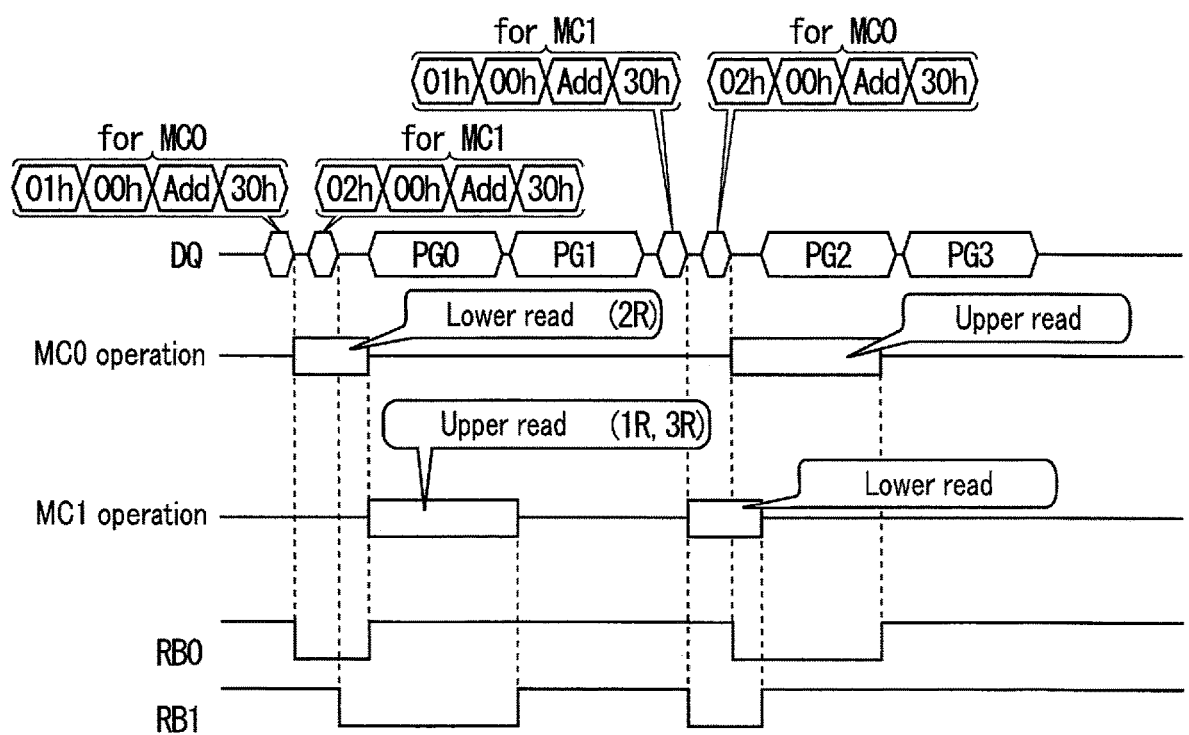
FIG. 48 illustrates an example of positions where page data are written in the memory devices according to the 11th embodiment.
FIG. 49 illustrates an input and output signal during data reads over time in the memory system according to the 11th embodiment.

FIG. 48 illustrates an example of the memory area unit MA8 and positions where page data are written in the memory devices MC according to the 11th embodiment. As illustrated in FIG. 48, the memory area unit MA8 is the set of the lower and upper pages of a cell unit CUs0w in a plane PBw of the memory device MC0, and the lower and upper pages of a cell unit CUs1w in a plane PBw of the memory device MC1.

Based on such features of the memory area unit MA8, four pieces of page data with consecutive logical addresses are stored in a single memory area unit MA8. As a specific example, FIG. 48 illustrates the positions where four pieces of write page data PG0 to PG3 with consecutive logical addresses are written in the memory area unit MA8.

For each of the cases where γ is 0 and 2, the page data PGγ and the page data PG(γ+1) form a data set.

As illustrated in FIG. 48, the page data PGγ and PG(γ+1) of each data set are written one by one to the memory devices MC0 and MC1, and in addition, one of the page data PGγ and PG(γ+1) is written to a fast page while the remaining one is written to a non-fast page.

As illustrated in FIG. 48, the page data PG0 is written to the lower page of the selected cell unit CUs0w of the memory device MC0. The page data PG1 is written to the upper page of the selected cell unit CUs1w of the memory device MC1. The page data PG2 is written to the lower page of the selected cell unit CUs0w of the memory device MC1. The page data PG3 is written to the upper page of the selected cell unit CUs0w of the memory device MC0.

<11.3. Data Reads>

FIG. 49 illustrates the flow of the input and output signal DQ during data reads over time in the memory system 100 according to the 11th embodiment.

As illustrated in FIG. 49, a data read from any of the non-fast pages proceeds in parallel with a data read of a fast page (lower page).

To read the data set containing the page data PG0 and PG1, the memory controller 2 first instructs the memory device MC0 to read the page data PG0 stored in the fast page. The memory device MC0 receives the instruction and starts a lower page read of the memory device MC0 for obtaining the page data PG0. Next, the memory controller 2 instructs the memory device MC1 to perform an upper page read for the page data PG1. The lower page read in the memory device MC0 and the upper page read in the memory device MC1 proceed in parallel.

When the read of the page data PG0 is completed, the memory device MC0 outputs the page data PG0 in accordance with the instruction from the memory controller 2. While the memory device MC0 is outputting the page data PG0, the upper page read in the memory device MC1 can proceed.

Thereafter, the memory controller 2 similarly reads the data set containing the page data PG2 and PG3. For reading any of the data sets, a data read from the fast page of each data set is started first, and after that, data reads from the non-fast pages are started. Thus, in each data set, a lower page read and an upper page read proceed in parallel over the memory devices MC0 and MC1.

<11.4. Advantages>

According to the 11th embodiment, the memory area unit MA8 spreads over two memory devices MC, first page data out of a data set containing two pieces of page data having two consecutive logical addresses is written to a fast page, while the remaining page data is written to a non-fast page. During reads of a data set written in this way, a read of the page data PG other than the first page data of the data set can proceed while the first page data is being output. For this reason, even in the case of storing two bits of data per memory cell transistor MT, data can be read and output efficiently according to the same basic principle as the first embodiment.

<11.5. Modification>

The 11th embodiment may also be applied to independently operable planes PB0 and PB1 in a single memory device MC. In other words, the memory device MC has the same configuration as the first embodiment, the memory area unit MA spreads over the planes PB0 and PB1 of a single memory device MC0 for example, and is the set of the lower and upper pages of the plane PB0 and the lower and upper pages of the plane PB1.

12th Embodiment

The 12th embodiment relates to another configuration for achieving data writes according to the 11th embodiment. Hereinafter, the features that differ from the 11th embodiment will be described mainly.

The configuration of the memory system 100 according to the 12th embodiment is the same as the first embodiment.

<12.1. Configuration of Memory Devices>

Figure 50:
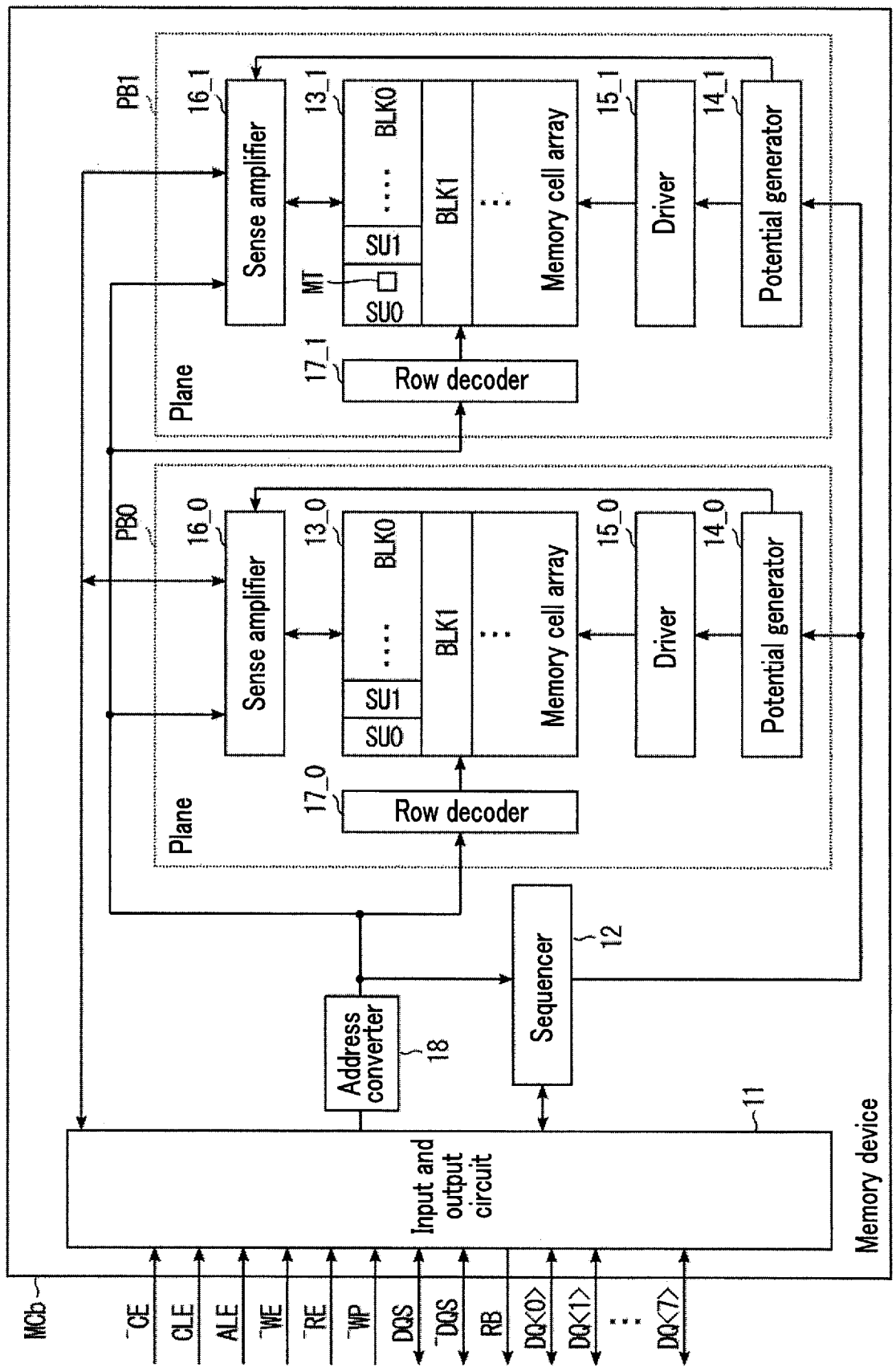
FIG. 50 illustrates components and connections in the memory devices according to a 12th embodiment.

FIG. 50 illustrates functional blocks of the memory devices MC according to the 12th embodiment. As illustrated in FIG. 50, each memory device MC includes an address converter 18 in addition to the components and connections according to the first embodiment (FIG. 3). The memory devices MC according to the 12th embodiment may be referred to as the memory devices MCb in some cases.

The address converter 18 receives an address signal from the input and output circuit 11, and converts a certain portion of the address signal, namely the portion indicating the address for a certain element, to a different address according to a predetermined rule. The portions other than the portion to be converted are output unchanged by the address converter 18. The output from the address converter 18 is supplied to components such as the sequencer 12, the row decoder 17, and the sense amplifier 16.

FIG. 51 illustrates components and connections in the address converter 18 according to the 12th embodiment. As illustrated in FIG. 51, the address converter 18 includes selectors S1 and S2.

Each of the selectors S1 and S2 includes a first input node, a second input node, a control input node, and an output node. Each of the first input node and the second input node is associated with a one-bit value. The first input node is associated with "0", and the second input node is associated with "1". Hereinafter, the first input node may be referred to as the "0" input node, while the second input node may be referred to as the "1" input node in some cases.

Each of the selectors S1 and S2 receives a signal CHIP_ADD<0> at the control input node, where <0> indicates that the signal of the preceding name has one bit (the "0th" bit). The signal CHIP_ADD<0> has the identification (ID) of the memory device MC that includes the address converter 18, or in other words, a value based on a unique number that specifies one from among all of the memory devices MC included in the memory system 100. For example, the signal CHIP_ADD<0> has the value "0" in the memory device MC0 and the signal CHIP_ADD<0> has the value "1" in the memory device MC1.

The selector S1 receives a signal Lower_SEL_pre at the "0" input node. The signal Lower_SEL_pre is supplied from the input and output circuit 11 for example, and is asserted when the command 01h, which designates the lower page, is received by the memory device MC. The signal Lower_SEL_pre is used to generate a signal informing the sequencer 12 of the page targeted by the process instructed by the command set following the command 01h, or in other words the command set associated with the command 01h. In other words, when the command 01h is received, a signal designating the page targeted by the command set associated with the command 01h is generated, and the generated signal is supplied to the sequencer 12.

The selector S1 receives a signal Upper_SEL_pre at the "1" input node. The signal Upper_SEL_pre is supplied from the input and output circuit 11 for example, and is asserted when the command 02h, which designates the upper page, is received by the memory device MC. The signal Upper_SEL_pre is used to generate a signal informing the sequencer 12 of the page targeted by the process instructed by the command set following the command 02h, or in other words the command set associated with the command 02h. In other words, when the command 02h is received, a signal designating the page targeted by the command set associated with the command 02h is generated, and the generated signal is supplied to the sequencer 12.

Of the "0" input node and the "1" input node, the selector S1 outputs the one associated with the same value as the value of the signal received by the control input node as a signal Lower_SEL. Specifically, the selector S1 outputs the signal received by the "0" input node while a "0" value signal is being received at the control input node, and outputs the signal received by the "1" input node while a "1" value signal is being received at the control input node. The signal Lower_SEL is supplied to the sequencer 12 and informs the sequencer 12 of the designation of the lower page. Using the signal Lower_SEL, the sequencer 12 recognizes that the lower page is the target of the command set associated with the page designation command (01h or 02h) that serves as the basis for generating the signal Lower_SEL.

The selector S2 receives the signal Upper_SEL_pre at the "0" input node, and receives the signal Lower_SEL_pre at the "1" input node. Of the "0" input node and the "1" input node, the selector S2 outputs the one associated with the same value as the value of the signal received by the control input node as a signal Upper_SEL. Specifically, the selector S2 outputs the signal received by the "0" input node while a "0" value signal is being received at the control input node, and outputs the signal received by the "1" input node while a "1" value signal is being received at the control input node. The signal Upper_SEL is supplied to the sequencer 12 and informs the sequencer 12 of the designation of the upper page. Using the signal Upper_SEL, the sequencer 12 recognizes that the upper page is the target of the command set associated with the page designation command (01h or 02h) that serves as the basis for generating the signal Upper_SEL.

FIG. 52 illustrates an example of a state of the address converter 18 according to the 12th embodiment. In particular, FIG. 52 illustrates the address converter 18 in the memory device MC1. As illustrated in FIG. 52, because the address converter 18 is in the memory device MC1, the signal CHIP_ADD<0> has the value "1" (has a high level). For this reason, as indicated by the bold lines, each of the selectors S1 and S2 couples its own "1" input node to its own output node. Accordingly, the interconnect transmitting the signal Lower_SEL_pre is coupled to the output node of the selector S2, and the signal Lower_SEL_pre is converted to the signal Upper_SEL. Also, the interconnect transmitting the signal Upper_SEL_pre is coupled to the output node of the selector S1, and the signal Upper_SEL_pre is converted to the signal Lower_SEL.

According to such conversion, when the command 01h designating the lower page is received by the memory device MC1, the sequencer 12 is informed that the target of the command set following the command 01h is the upper page. When the command 02h designating the upper page is received by the memory device MC1, the sequencer 12 is informed that the target of the command set following the command 02h is the lower page.

Note that the address converter 18 of the memory device MC0 receives the signal CHIP_ADD<0> having the value "0" (having a low level). For this reason, the signal Lower_SEL has the same logic level as the signal Lower_SEL_pre, and the signal Upper_SEL has the same logic level as the signal Upper_SEL_pre. Accordingly, when the command 01h designating the lower page is received by the memory device MC0, the sequencer 12 is informed that the target of the command set following the command 01h is the lower page. When the command 02h designating the upper page is received by the memory device MC0, the sequencer 12 is informed that the target of the command set following the command 02h is the upper page.

<12.2. Data Writes>

Figure 53:
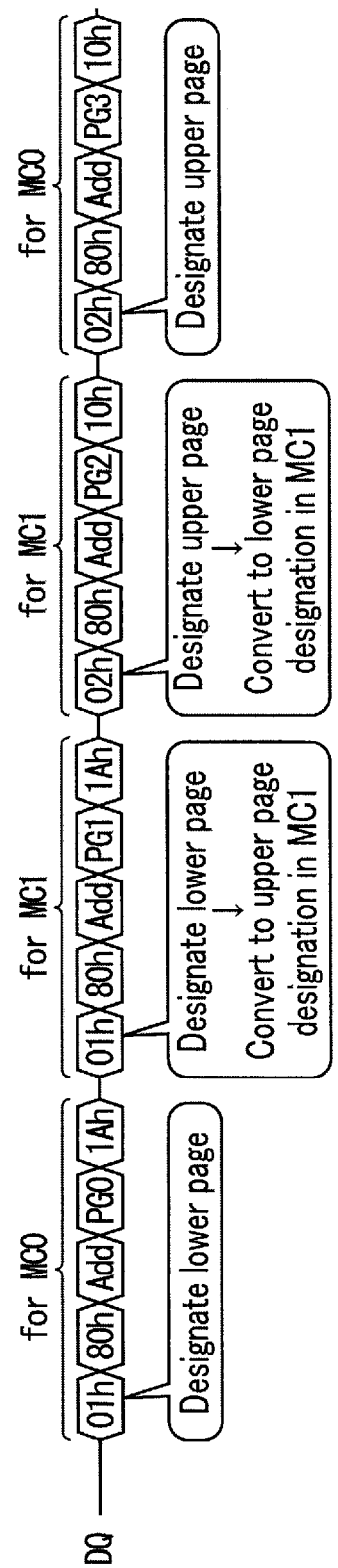
FIG. 53 illustrates a flow of an input and output signal for data writes in the memory system according to the 12th embodiment.

FIG. 53 illustrates a flow of the input and output signal DQ for data writes in the memory system according to the 12th embodiment. To write data to the memory devices MC0 and MC1 as illustrated in FIG. 48, the memory controller 2 transmits command sets and the page data PG0 to PG3 to the memory devices MC0 and MC1 as illustrated in FIG. 53.

First, to instruct the memory device MC0 to write the page data PG0, the memory controller 2 transmits the page data PG0 and a command set instructing the memory device MC0 to write the page data PG0 to the lower page of a selected cell unit CUs0w. For this purpose, the memory controller 2 transmits the command 01h, the command 80h, an address Add designating the selected cell unit CUs0w, the page data PG0, and the command 1Ah, in that order, for example. When the command set and the page data PG0 are received by the memory device MC0, the sequencer 12 recognizes an instruction to write the page data PG0 to the lower page of the selected cell unit CUs0w of the memory device MC0.

To instruct the memory device MC1 to write the page data PG1, the memory controller 2 transmits the page data PG1 and a command set instructing the memory device MC1 to write the page data PG1 to the lower page of a certain selected cell unit CUs1w. For this purpose, the memory controller 2 transmits the command 01h, the command 80h, an address Add designating the selected cell unit CUs1w, the page data PG1, and the command 1Ah, in that order, for example. When the command set and the page data PG1 are received by the memory device MC1, the designation of the lower page by the command 01h is converted to a designation of the upper page by the address converter 18. Accordingly, the sequencer 12 recognizes an instruction to write the page data PG1 to the upper page of the selected cell unit CUs1w of the memory device MC1.

To instruct the memory device MC1 to write the page data PG2, the memory controller 2 transmits the page data PG2 and a command set instructing the memory device MC1 to write the page data PG2 to the upper page of the selected cell unit CUs1w. For this purpose, the memory controller 2 transmits the command 02h, the command 80h, an address Add designating the selected cell unit CUs1w, the page data PG2, and the command 10h, in that order, for example. When the command set and the page data PG2 are received by the memory device MC1, the designation of the upper page by the command 02h is converted to a designation of the lower page by the address converter 18. Accordingly, the sequencer 12 recognizes an instruction to write the page data PG2 to the lower page of the selected cell unit CUs1w of the memory device MC1.

To instruct the memory device MC0 to write the page data PG3, the memory controller 2 transmits the page data PG3 and a command set instructing the memory device MC0 to write the page data PG3 to the upper page of the selected cell unit CUs0w. For this purpose, the memory controller 2 transmits the command 02h, the command 80h, an address Add designating the selected cell unit CUs0w, the page data PG3, and the command 10h, in that order, for example. When the command set and the page data PG3 are received by the memory device MC0, the sequencer 12 recognizes an instruction to write the page data PG3 to the upper page of the selected cell unit CUs0w of the memory device MC0.

Figures 54, 55:
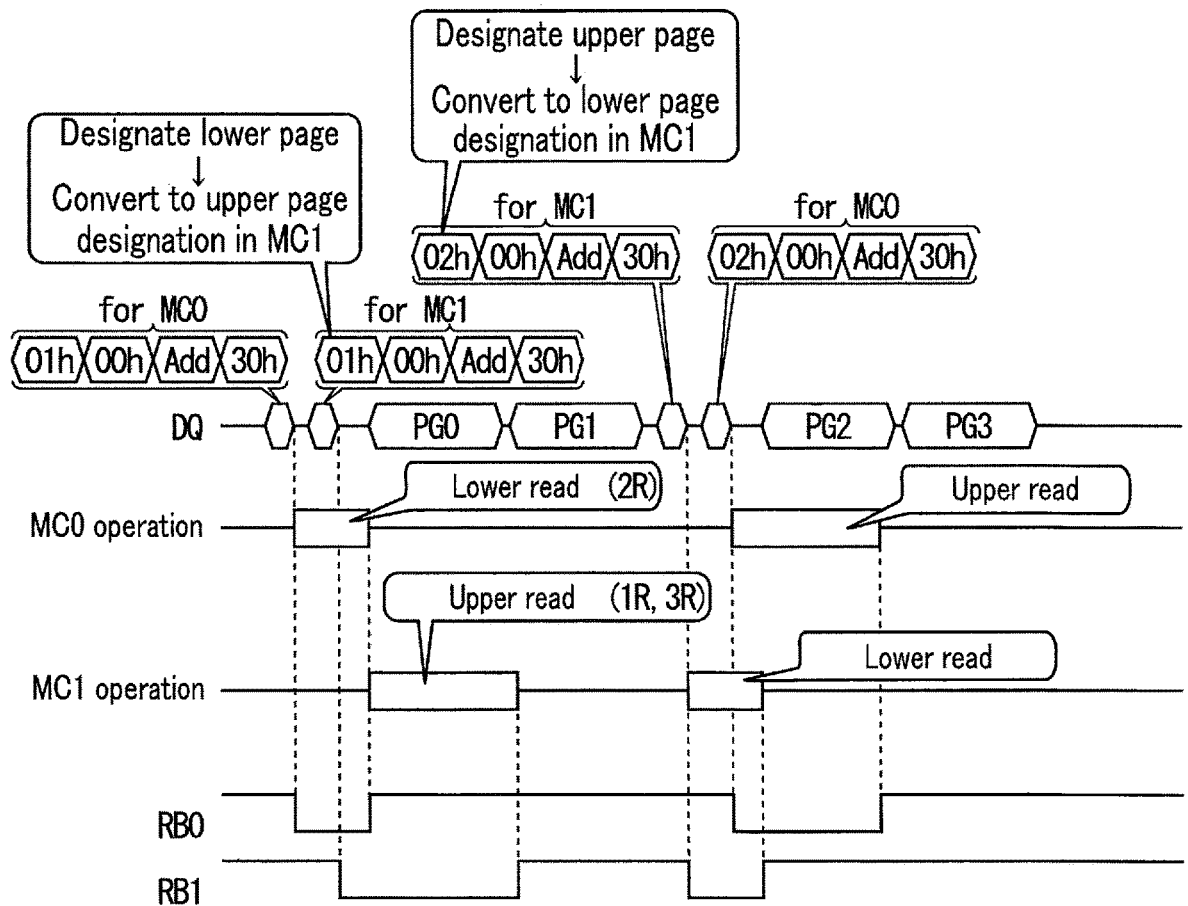
FIG. 54 illustrates an example of positions where page data are written as recognized by the memory controller according to the 12th embodiment.
FIG. 55 illustrates an input and output signal during data reads over time in the memory system according to the 12th embodiment.

The transmission of commands as illustrated in FIG. 53 means that the memory controller 2 recognizes that the page data PG0 to PG3 have been written to the positions illustrated in FIG. 54. In other words, the memory controller 2 recognizes that the page data PG0 has been written to the lower page of the selected cell unit CUs0w of the memory device MC0, the page data PG1 has been written to the lower page of the selected cell unit CUs1w of the memory device MC1, the page data PG2 has been written to the upper page of the selected cell unit CUs1w of the memory device MC1, and the page data PG3 has been written to the upper page of the selected cell unit CUs0w of the memory device MC0. The address conversion table 221 also indicates such correspondences between the page data PG and the physical addresses.

On the other hand, by the transmission of the commands and the page data PG as illustrated in FIG. 53, the page data PG0 to PG3 are actually written in the memory devices MC0 and MC1 as illustrated in FIG. 48.

<12.3. Data Reads>

FIG. 55 illustrates the flow of the input and output signal DQ during data reads over time in the memory system 100 according to the 12th embodiment. It should be noted that the memory controller 2 recognizes that the positions where the page data PG0 to PG3 are written are like in FIG. 54.

As illustrated in FIG. 55, the memory controller 2 reads the page data PG0 and PG1 in parallel. For this purpose, first, the memory controller 2 transmits a command set instructing the memory device MC0 to perform a data read from the lower page of the selected cell unit CUs0w. When the command set is received by the memory device MC0, the memory device MC0 obtains the page data PG0 stored in the lower page of the selected cell unit CUs0w.

Next, the memory controller 2 transmits a command set instructing the memory device MC1 to perform a data read from the lower page of the selected cell unit CUs1w. When the command set is received by the memory device MC1, the designation of the lower page by the command 01h is converted to a designation of the upper page by the address converter 18. Accordingly, the memory device MC1 obtains the page data PG1 stored in the upper page of the selected cell unit CUs1w.

Next, the memory controller 2 reads the page data PG2 and PG3 in parallel. For this purpose, first, the memory controller 2 transmits a command set instructing the memory device MC1 to perform a data read from the upper page of the selected cell unit CUs1w. When the command set is received by the memory device MC1, the designation of the upper page by the command 02h is converted to a designation of the lower page by the address converter 18. Accordingly, the memory device MC1 obtains the page data PG2 stored in the lower page of the selected cell unit CUs1w.

Next, the memory controller 2 transmits a command set instructing the memory device MC0 to perform a data read from the upper page of the selected cell unit CUs0w. When the command set is received by the memory device MC0, the memory device MC0 obtains the page data PG2 stored in the upper page of the selected cell unit CUs0w.

<12.4. Advantages>

Figure 56:
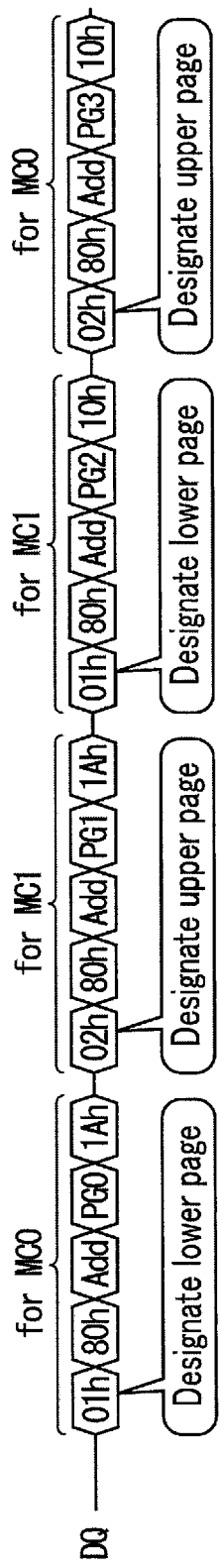
FIG. 56 illustrates an example for reference of an input and output signal for data writes in a memory system.

In cases where the 12th embodiment is not used, writes of the page data PG as illustrated in FIG. 48 according to the 11th embodiment typically requires the transmission of command sets and page data according to a sequence as illustrated in FIG. 56. In other words, the memory device MC and the page where the page data PG actually is to be written are designated. For example, the command set for writing the page data PG1 designates the upper page, while the command set for writing the page data PG2 designates the lower page. However, such a sequence has little regularity, and is not arranged well sequentially, such as writing data to the lower pages of the memory devices MC0 and MC1, and then writing data to the upper pages of the memory devices MC0 and MC1, for example.

According to the 12th embodiment, the transmission of the command sets for writing data sets as illustrated in the 11th embodiment is highly regular. In other words, for example, the writes of all data specifying the lower pages is complete, and then the writesg of data designating the upper pages can occur. Even with such command transmission, data is written as illustrated in the 11th embodiment. For this reason, the instructions for data writes by the memory controller 2 are simple, and the processing load on the memory controller 2 is light.

<12.5. Modification>

The conversion of designated pages by the address converter 18 or 19 like in the 12th embodiment is also applicable to embodiments other than the third and 11th embodiments.

13th Embodiment

The 13th embodiment relates to another configuration for achieving data writes according to the third embodiment. Hereinafter, the features that differ from the third embodiment will be described mainly.

The configuration of the memory system 100 according to the 13th embodiment is the same as the first embodiment.

The description below relates to an example of a configuration for achieving the writes illustrated in FIG. 24 from among the various specific examples of data writes according to the third embodiment. Persons skilled in the art are capable of using the principles described below to design a configuration for achieving another example of data writes (for example, FIG. 21) according to the third embodiment.

<13.1. Configuration of Memory Devices>

Figure 57:
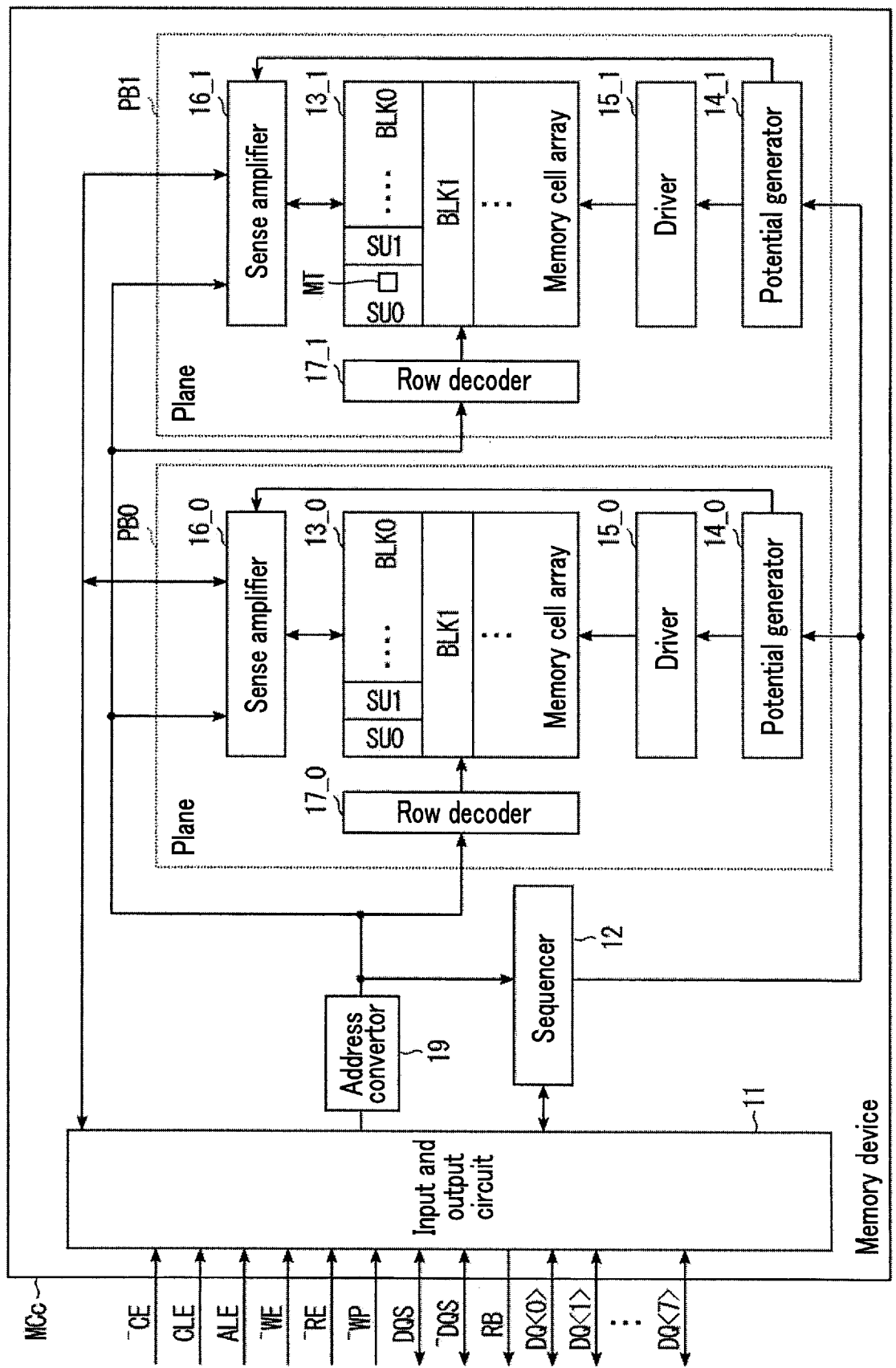
FIG. 57 illustrates components and connections in the memory devices according to a 13th embodiment.

FIG. 57 illustrates components and connections in the memory devices according to a 13th embodiment. As illustrated in FIG. 57, each memory device MC includes an address converter 19 in addition to the components and connections according to the first embodiment (FIG. 3). The memory devices MC according to the 13th embodiment may be referred to as the memory devices MCc in some cases.

The address converter 19 receives an address signal from the input and output circuit 11, and converts a certain portion of the address signal, namely the portion indicating the address for a certain element, to a different address according to a predetermined rule. The portions other than the portion to be converted are output unchanged by the address converter 19. The output from the address converter 19 is supplied to components such as the sequencer 12, the row decoder 17, and the sense amplifier 16.

FIG. 58 illustrates components and connections in the address converter 19 according to the 13th embodiment. As illustrated in FIG. 58, the address converter 19 includes selectors S11, S12, S13, and S14.

Each of the selectors S11 to S14 includes a first input node, a second input node, a third input node, a fourth input node, a control input node, and an output node. Each of the first input node to the fourth input node is associated with a two-bit value. The first input node is associated with "10". The second input node is associated with "11". The third input node is associated with "00". The fourth input node is associated with "01". Hereinafter, the first input node may be referred to as the "10" input node, the second input node may be referred to as the "11" input node, the third input node may be referred to as the "00" input node, and the fourth input node may be referred to as the "01" input node.

Each of the selectors S11 to S14 receives a signal CHIP_ADD<1:0> at the control input node, where the signal CHIP_ADD<1:0> has a value based on the ID of the memory device MC that includes the address converter 19. For example, the signal CHIP_ADD<1:0> has the value "00" in the memory device MC0, has the value "01" in the memory device MC1, has the value "10" in the memory device MC2, and has the value "11" in the memory device MC3.

The selector S11 receives a signal Lower_SEL_pre at the "10" input node.

The selector S11 receives a signal Middle_SEL_pre at the "11" input node. The signal Middle_SEL_pre is supplied from the input and output circuit 11 for example, and is asserted when the command 02h, which designates the middle page, is received by the memory device MC. The signal Middle_SEL_pre is used to generate a signal informing the sequencer 12 of the page targeted by the process instructed by the command set following the command 02h, or in other words the command set associated with the command 02h. In other words, when the command 02h is received, a signal designating the page targeted by the command set associated with the command 02h is generated, and the generated signal is supplied to the sequencer 12.

The selector S11 receives a signal Upper_SEL_pre at the "00" input node. The signal Upper_SEL_pre is supplied from the input and output circuit 11 for example, and is asserted when the command 03h, which designates the upper page, is received by the memory device MC. The signal Upper_SEL_pre is used to generate a signal informing the sequencer 12 of the page targeted by the process instructed by the command set following the command 03h, or in other words the command set associated with the command 03h. In other words, when the command 03h is received, a signal designating the page targeted by the command set associated with the command 03h is generated, and the generated signal is supplied to the sequencer 12.

The selector S11 receives a signal Top_SEL_pre at the "01" input node. The signal Top_SEL_pre is supplied from the input and output circuit 11 for example, and is asserted when a command 04h, which designates the top page, is received by the memory device MC. The signal Top_SEL_pre is used to generate a signal informing the sequencer 12 of the page targeted by the process indicated by the command set following the command 04h, or in other words the command set associated with the command 04h. In other words, when the command 04h is received, a signal designating the page targeted by the command set associated with the command 04h is generated, and the generated signal is supplied to the sequencer 12.

Of the "10" input node, the "11" input node, the "00" input node, and the "01" input node, the selector S11 outputs the one associated with the bit sequence having the same value as the value of the signal received by the control input node as the signal Lower_SEL. Specifically, while a "10" value signal is being received at the control input node, the selector S11 outputs the signal received by the "10" input node. While a "11" value signal is being received at the control input node, the selector S11 outputs the signal received by the "11" input node. While a "00" value signal is being received at the control input node, the selector S11 outputs the signal received by the "00" input node. While a "01" value signal is being received at the control input node, the selector S11 outputs the signal received by the "01" input node.

The selector S12 receives the signal Top_SEL_pre at the "10" input node, the signal Lower_SEL_pre at the "11" input node, the signal Middle_SEL_pre at the "00" input node, and the signal Upper_SEL_pre at the "01" input node. In a similar manner as the selector S11, of the "10" input node, the "11" input node, the "00" input node, and the "01" input node, the selector S12 outputs the one associated with the bit sequence having the same value as the value of the signal received by the control input node as the signal Middle_SEL. The signal Middle_SEL is supplied to the sequencer 12 and informs the sequencer 12 of the designation of the middle page. Using the signal Middle_SEL, the sequencer 12 recognizes that the middle page is the target of the command set associated with the page designation command (01h, 02h, 03h, or 04h) that serves as the basis for generating the signal Middle_SEL.

The selector S13 receives the signal Upper_SEL_pre at the "10" input node, the signal Top_SEL_pre at the "11" input node, the signal Lower_SEL_pre at the "00" input node, and the signal Middle_SEL_pre at the "01" input node. In a similar manner as the selector S11, of the "10" input node, the "11" input node, the "00" input node, and the "01" input node, the selector S13 outputs the one associated with the bit sequence having the same value as the value of the signal received by the control input node as the signal Upper_SEL.

The selector S14 receives the signal Middle_SEL_pre at the "10" input node, the signal Upper_SEL_pre at the "11" input node, the signal Top_SEL_pre at the "00" input node, and the signal Lower_SEL_pre at the "01" input node. In a similar manner as the selector S11, of the "10" input node, the "11" input node, the "00" input node, and the "01" input node, the selector S14 outputs the one associated with the bit sequence having the same value as the value of the signal received by the control input node as the signal Top_SEL. The signal Top_SEL is supplied to the sequencer 12 and informs the sequencer 12 of the designation of the top page. Using the signal Top_SEL, the sequencer 12 recognizes that the top page is the target of the command set associated with the page designation command (01h, 02h, 03h, or 04h) that serves as the basis for generating the signal Top_SEL.

Figure 59:
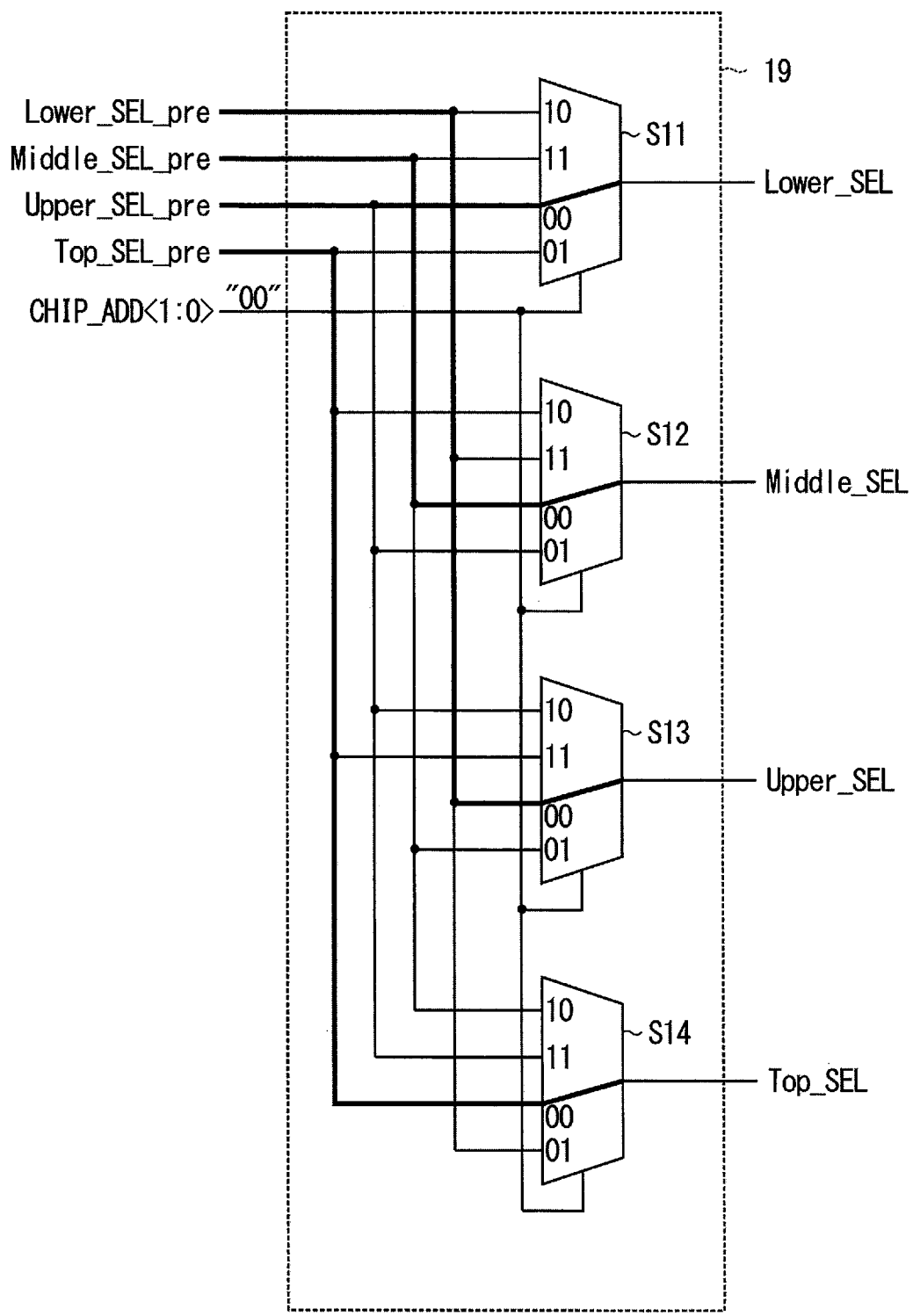
FIG. 59 illustrates a state of the address converter according to the 13th embodiment.

FIG. 59 illustrates an example of a state of the address converter 19 according to the 13th embodiment. In particular, FIG. 59 illustrates the address converter 19 in the memory device MC0. As illustrated in FIG. 59, because the address converter 19 is in the memory device MC0, the signal CHIP_ADD<1:0> has the value "00" (each bit is at a low level). For this reason, as indicated by the bold lines, each of the selectors S1 to S4 couples its own "00" input node to its own output node. Accordingly, the interconnect transmitting the signal Lower_SEL_pre is coupled to the output node of the selector S13, and the signal Lower_SEL_pre is converted to the signal Upper_SEL. The interconnect transmitting the signal Middle_SEL_pre is coupled to the output node of the selector S12, and the signal Middle_SEL_pre is converted to the signal Middle_SEL. The interconnect transmitting the signal Upper_SEL_pre is coupled to the output node of the selector S11, and the signal Upper_SEL_pre is converted to the signal Lower_SEL. The interconnect transmitting the signal Top_SEL_pre is coupled to the output node of the selector S14, and the signal Top_SEL_pre is converted to the signal Top_SEL.

According to such conversion, when the command 01h designating the lower page is received by the memory device MC0, the sequencer 12 is informed that the target of the command set following the command 01h is the upper page. When the command 03h designating the upper page is received by the memory device MC0, the sequencer 12 is informed that the target of the command set following the command 03h is the lower page.

On the other hand, when the command 02h designating the upper page is received by the memory device MC0, the sequencer 12 is informed that the target of the command set following the command 02h is the middle page. When the command 04h designating the top page is received by the memory device MC0, the sequencer 12 is informed that the target of the command set following the command 04h is the top page.

In the address converter 19 of the memory devices MC1, MC2, and MC3, conversion is performed in a different form from the address converter 19 of the memory device MC0 according to the same basic principle as the basic principle in the address converter 19 of the memory device MC0.

In the address converter 19 of the memory device MC1, the signal Lower_SEL_pre is converted to the signal Top_SEL. The signal Middle_SEL_pre is converted to the signal Upper_SEL. The signal Upper_SEL_pre is converted to the signal Middle_SEL. The signal Top_SEL_pre is converted to the signal Lower_SEL.

In the address converter 19 of the memory device MC2, the signal Lower_SEL_pre is converted to the signal Lower_SEL. The signal Middle_SEL_pre is converted to the signal Top_SEL. The signal Upper_SEL_pre is converted to the signal Upper_SEL. The signal Top_SEL_pre is converted to the signal Middle_SEL.

In the address converter 19 of the memory device MC3, the signal Lower_SEL_pre is converted to the signal Middle_SEL. The signal Middle_SEL_pre is converted to the signal Lower_SEL. The signal Upper_SEL_pre is converted to the signal Top_SEL. The signal Top_SEL_pre is converted to the signal Upper_SEL.

<13.2. Data Writes>

Figure 61:
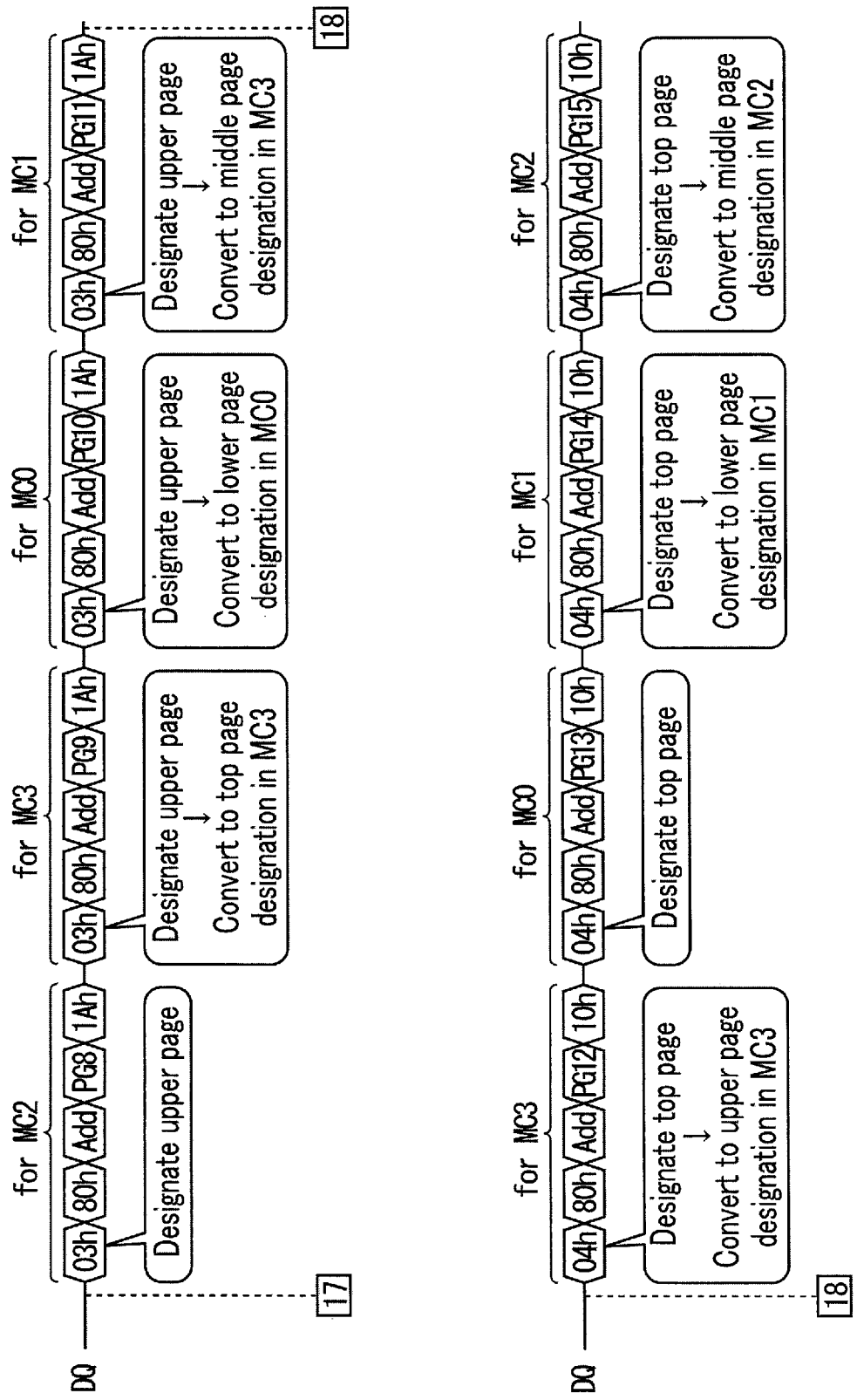
FIG. 61 illustrates a flow of an input and output signal for data writes in the memory system according to the 13th embodiment.

FIGS. 60 and 61 illustrate the flow of the input and output signal DQ for writes in the memory system 100 according to the 13th embodiment. FIG. 61 illustrates the state following FIG. 60.

To write data to the memory devices MC0 to MC3 as illustrated in FIGS. 60 and 61, the memory controller 2 transmits command sets and the page data PG0 to PG15 to the memory devices MC0 to MC3 as illustrated in FIGS. 60 and 61.

First, to instruct the memory device MC0 to write the page data PG0, the memory controller 2 transmits the page data PG0 and a command set instructing the memory device MC0 to write the page data PG0 to the lower page of a selected cell unit CUs0w. For this purpose, the memory controller 2 transmits the command 01h, the command 80h, an address Add designating the selected cell unit CUs0w, the page data PG0, and the command 1Ah, in that order, for example. When the command set and the page data PG0 are received by the memory device MC0, the designation of the lower page by the command 01h is converted to a designation of the upper page by the address converter 19. Accordingly, the sequencer 12 recognizes an instruction to write the page data PG0 to the upper page of the selected cell unit CUs0w of the memory device MC0.

To instruct the memory device MC1 to write the page data PG1, the memory controller 2 transmits the page data PG1 and a command set instructing the memory device MC1 to write the page data PG1 to the lower page of a selected cell unit CUs1w. For this purpose, the memory controller 2 transmits the command 01h, the command 80h, an address Add designating the selected cell unit CUs1w, the page data PG1, and the command 1Ah, in that order, for example. When the command set and the page data PG1 are received by the memory device MC1, the designation of the lower page by the command 01h is converted to a designation of the top page by the address converter 19. Accordingly, the sequencer 12 recognizes an instruction to write the page data PG1 to the top page of the selected cell unit CUs1w of the memory device MC1.

To instruct the memory device MC2 to write the page data PG2, the memory controller 2 transmits the page data PG2 and a command set instructing the memory device MC2 to write the page data PG2 to the lower page of a selected cell unit CUs2w. For this purpose, the memory controller 2 transmits the command 01h, the command 80h, an address Add designating the selected cell unit CUs2w, the page data PG2, and the command 1Ah, in that order, for example. When the command set and the page data PG2 are received by the memory device MC2, the designation of the lower page by the command 01h is informed as a designation of the lower page by the address converter 19. Accordingly, the sequencer 12 recognizes an instruction to write the page data PG2 to the lower page of the selected cell unit CUs2w of the memory device MC2.

To instruct the memory device MC3 to write the page data PG3, the memory controller 2 transmits the page data PG3 and a command set instructing the memory device MC3 to write the page data PG3 to the lower page of a selected cell unit CUs3w. For this purpose, the memory controller 2 transmits the command 01h, the command 80h, an address Add designating the selected cell unit CUs3w, the page data PG3, and the command 1Ah, in that order, for example. When the command set and the page data PG3 are received by the memory device MC3, the designation of the lower page by the command 01h is converted to a designation of the middle page by the address converter 19. Accordingly, the sequencer 12 recognizes an instruction to write the page data PG3 to the middle page of the selected cell unit CUs3w of the memory device MC3.

Thereafter, in a similar manner, instructions for writing the page data PG4 to PG15 are issued by the memory controller 2. The command sets for writing the page data PG4 to PG7 include the command 02h, the command 80h, the address Add, the page data PG, and the command 1Ah. In the memory device MC1, the designation of the middle page by the command 02h is converted to a designation of the upper page by the address converter 19. In the memory device MC2, the designation of the middle page by the command 02h is converted to a designation of the top page by the address converter 19. In the memory device MC3, the designation of the middle page by the command 02h is converted to a designation of the lower page by the address converter 19. In the memory device MC0, the designation of the middle page by the command 02h is maintained as a designation of the middle page.

The command sets for writing the page data PG8 to PG11 include the command 03h, the command 80h, the address Add, the page data PG, and the command 1Ah. In the memory device MC2, the designation of the upper page by the command 03h is maintained as a designation of the upper page. In the memory device MC3, the designation of the upper page by the command 03h is converted to a designation of the top page by the address converter 19. In the memory device MC0, the designation of the upper page by the command 03h is converted to a designation of the lower page by the address converter 19. In the memory device MC1, the designation of the upper page by the command 03h is converted to a designation of the middle page by the address converter 19.

The command sets for writing the page data PG12 to PG15 include the command 04h, the command 80h, the address Add, the page data PG, and the command 10h. In the memory device MC3, the designation of the top page by the command 04h is converted to a designation of the upper page by the address converter 19. In the memory device MC0, the designation of the middle page by the command 04h is maintained as a designation of the top page. In the memory device MC1, the designation of the top page by the command 04h is converted to a designation of the lower page by the address converter 19. In the memory device MC2, the designation of the top page by the command 04h is converted to a designation of the middle page by the address converter 19.

The transmission of commands as illustrated in FIGS. 60 and 61 means that the memory controller 2 recognizes that the page data PG0 to PG15 have been written as illustrated in FIG. 62. In other words, the memory controller 2 recognizes that the page data PG0 has been written to the lower page of the selected cell unit CUs0w of the memory device MC0, the page data PG1 has been written to the lower page of the selected cell unit CUs1w of the memory device MC1, the page data PG2 has been written to the lower page of the selected cell unit CUs2w of the memory device MC2, and the page data PG3 has been written to the lower page of the selected cell unit CUs3w of the memory device MC3.

The memory controller 2 recognizes that the page data PG4 has been written to the middle page of the selected cell unit CUs1w of the memory device MC1, the page data PG5 has been written to the middle page of the selected cell unit CUs2w of the memory device MC2, the page data PG6 has been written to the middle page of the selected cell unit CUs3w of the memory device MC3, and the page data PG7 has been written to the middle page of the selected cell unit CUs0w of the memory device MC0.

The memory controller 2 recognizes that the page data PG8 has been written to the upper page of the selected cell unit CUs2w of the memory device MC2, the page data PG9 has been written to the upper page of the selected cell unit CUs3w of the memory device MC3, the page data PG10 has been written to the upper page of the selected cell unit CUs0w of the memory device MC0, and the page data PG11 has been written to the upper page of the selected cell unit CUs1w of the memory device MC1.

The memory controller 2 recognizes that the page data PG12 has been written to the top page of the selected cell unit CUs3w of the memory device MC3, the page data PG13 has been written to the top page of the selected cell unit CUs0w of the memory device MC0, the page data PG14 has been written to the top page of the selected cell unit CUs1w of the memory device MC1, and the page data PG15 has been written to the top page of the selected cell unit CUs2w of the memory device MC2. The address conversion table 221 also indicates such correspondences between the page data PG and the physical addresses.

On the other hand, by the transmission of the commands and the page data PG as illustrated in FIGS. 60 and 61, the page data PG0 to PG15 are actually written in the memory devices MC0 to MC3 as illustrated in FIG. 24.

<13.3. Data Reades>

Figure 63:
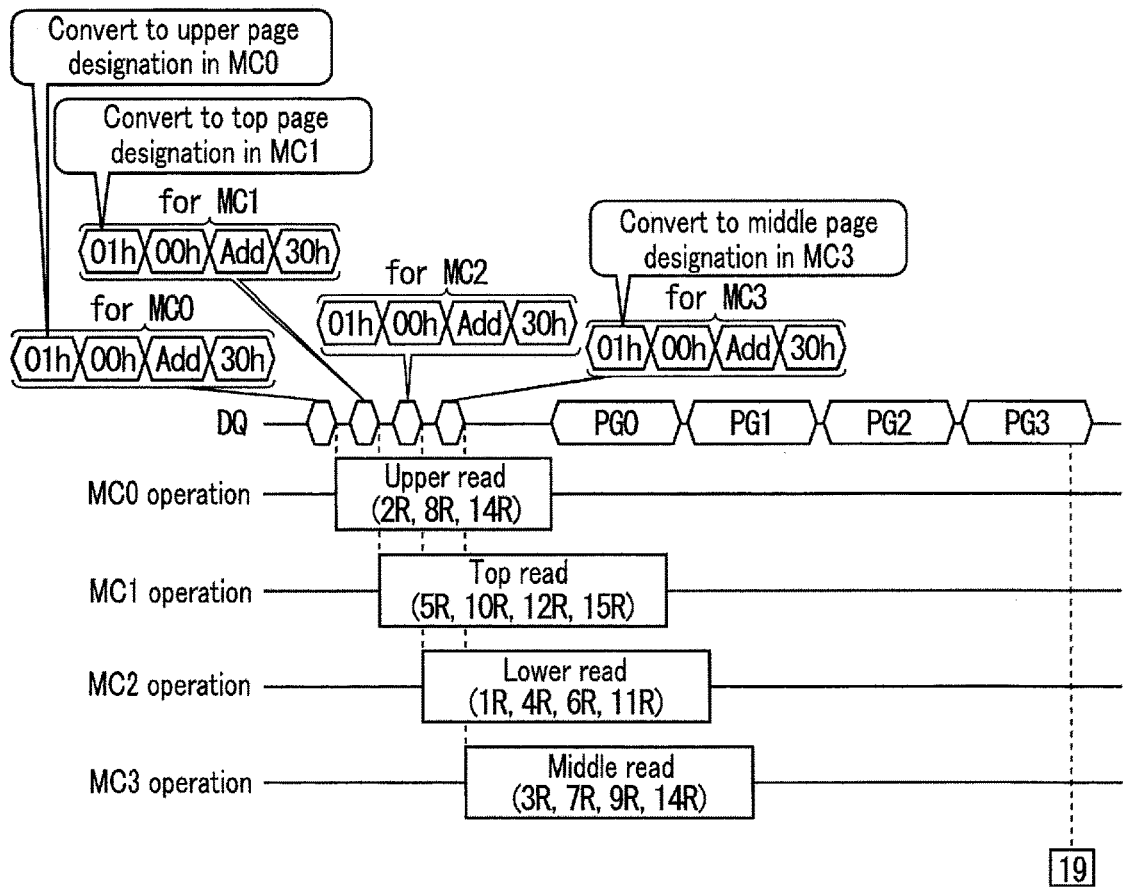
FIG. 63 illustrates an input and output signal during data reads over time in the memory system according to the 13th embodiment.
Figure 63:
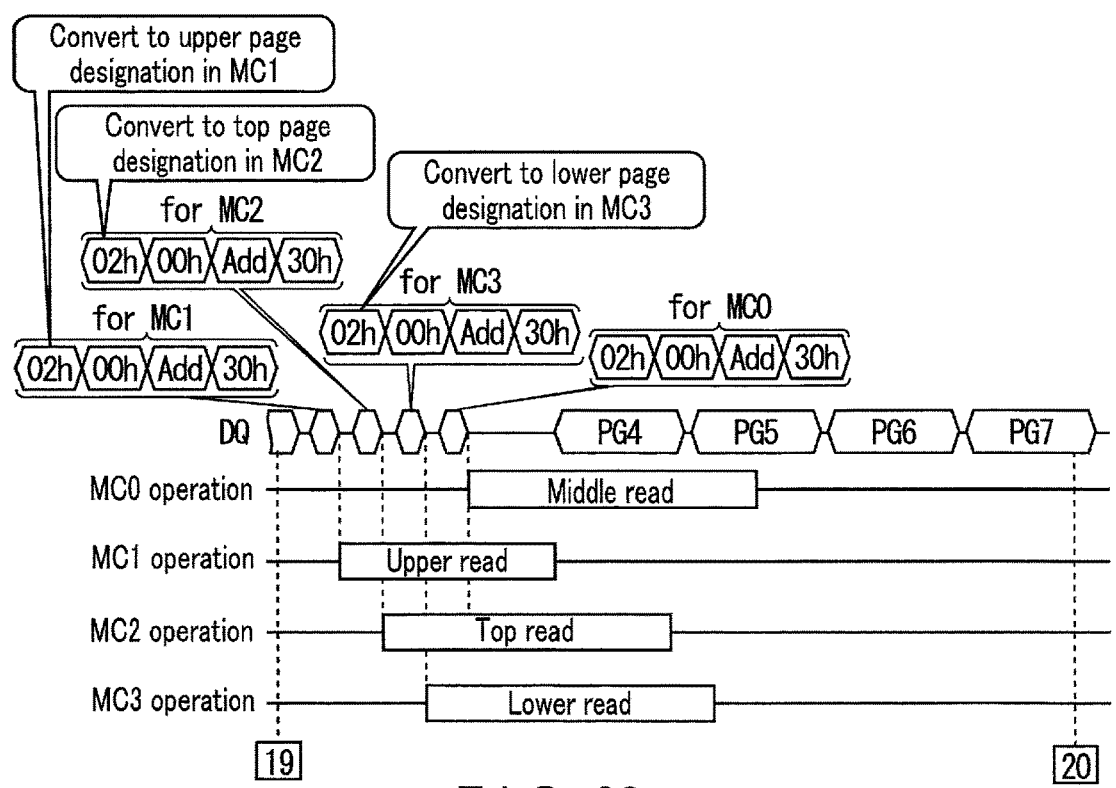
Figure 64:
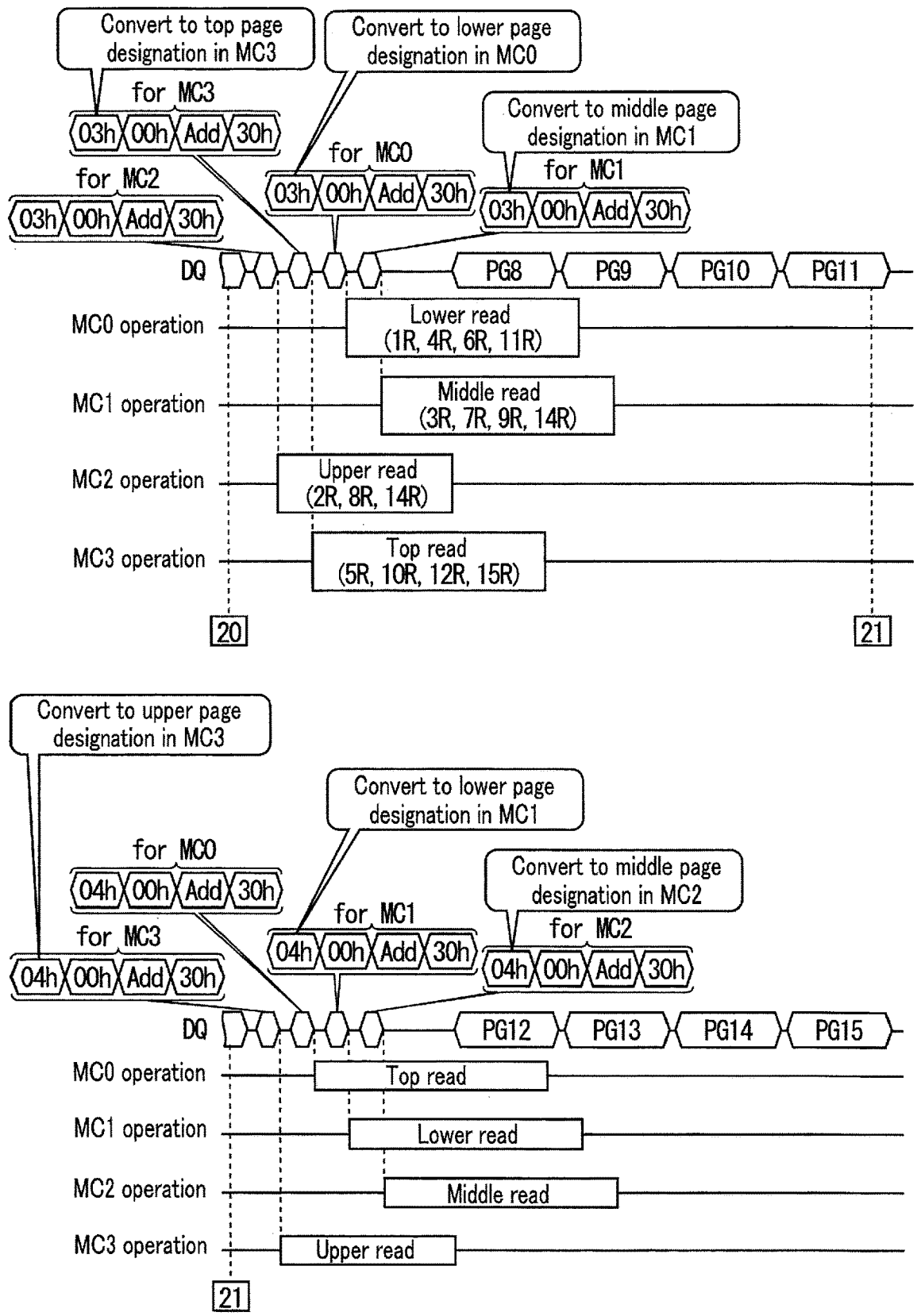
FIG. 64 illustrates an input and output signal during data reads over time in the memory system according to the 13th embodiment.

FIGS. 63 and 64 illustrate the flow of the input and output signal DQ during data reads over time in the memory system 100 according to the 13th embodiment. FIG. 64 illustrates the state following FIG. 63. It should be noted that the memory controller 2 recognizes that the positions where the page data PG0 to PG15 are written are like in FIG. 24.

As illustrated in FIGS. 63 and 64, the memory controller 2 reads the page data PG0 to PG3 in parallel. For this purpose, first, the memory controller 2 transmits a command set instructing the memory device MC0 to perform a data read from the lower page of the selected cell unit CUs0w. When the command set is received by the memory device MC0, the designation of the lower page by the command 01h is converted to a designation of the upper page by the address converter 19. Accordingly, the memory device MC0 obtains the page data PG0 stored in the upper page of the selected cell unit CUs0w.

The memory controller 2 transmits a command set instructing the memory device MC1 to perform a data read from the lower page of the selected cell unit CUs1w. When the command set is received by the memory device MC1, the designation of the lower page by the command 01h is converted to a designation of the top page by the address converter 19. Accordingly, the memory device MC1 obtains the page data PG1 stored in the top page of the selected cell unit CUs1w.

The memory controller 2 transmits a command set instructing the memory device MC2 to perform a data read from the lower page of the selected cell unit CUs2w. When the command set is received by the memory device MC2, the designation of the lower page by the command 01h is maintained as a designation of the lower page by the address converter 19. Accordingly, the memory device MC2 obtains the page data PG2 stored in the lower page of the selected cell unit CUs2w.

The memory controller 2 transmits a command set instructing the memory device MC3 to perform a data read from the lower page of the selected cell unit CUs3w. When the command set is received by the memory device MC3, the designation of the lower page by the command 01h is converted to a designation of the middle page by the address converter 19. Accordingly, the memory device MC3 obtains the page data PG3 stored in the middle page of the selected cell unit CUs3w.

Thereafter, in a similar manner, instructions for reading the page data PG4 to PG15 are issued by the memory controller 2. The command sets for reading the page data PG4 to PG7 include the command 02h, the command 00h, the address Add, and the command 30h. The designation of the middle page by the command 02h is converted as described for data writes. For this reason, an upper page read in the memory device MC1, a top page read in the memory device MC2, a lower page read in the memory device MC3, and a middle page read in the memory device MC0 are performed. As a result, the page data PG4 to PG7 are obtained.

The command sets for reading the page data PG8 to PG11 include the command 03h, the command 00h, the address Add, and the command 30h. The designation of the upper page by the command 03h is converted as described for data writes. For this reason, an upper page read in the memory device MC2, a top page read in the memory device MC3, a lower page read in the memory device MC0, and a middle page read in the memory device MC1 are performed. As a result, the page data PG8 to PG11 are obtained.

The command sets for reading the page data PG12 to PG15 include the command 04h, the command 00h, the address Add, and the command 30h. The designation of the top page by the command 04h is converted as described for data writes. For this reason, an upper page read in the memory device MC3, a top page read in the memory device MC0, a lower page read in the memory device MC1, and a middle page read in the memory device MC2 are performed. As a result, the data written as the page data PG12 to PG15 is obtained.

<13.4. Advantages>

Figure 65:
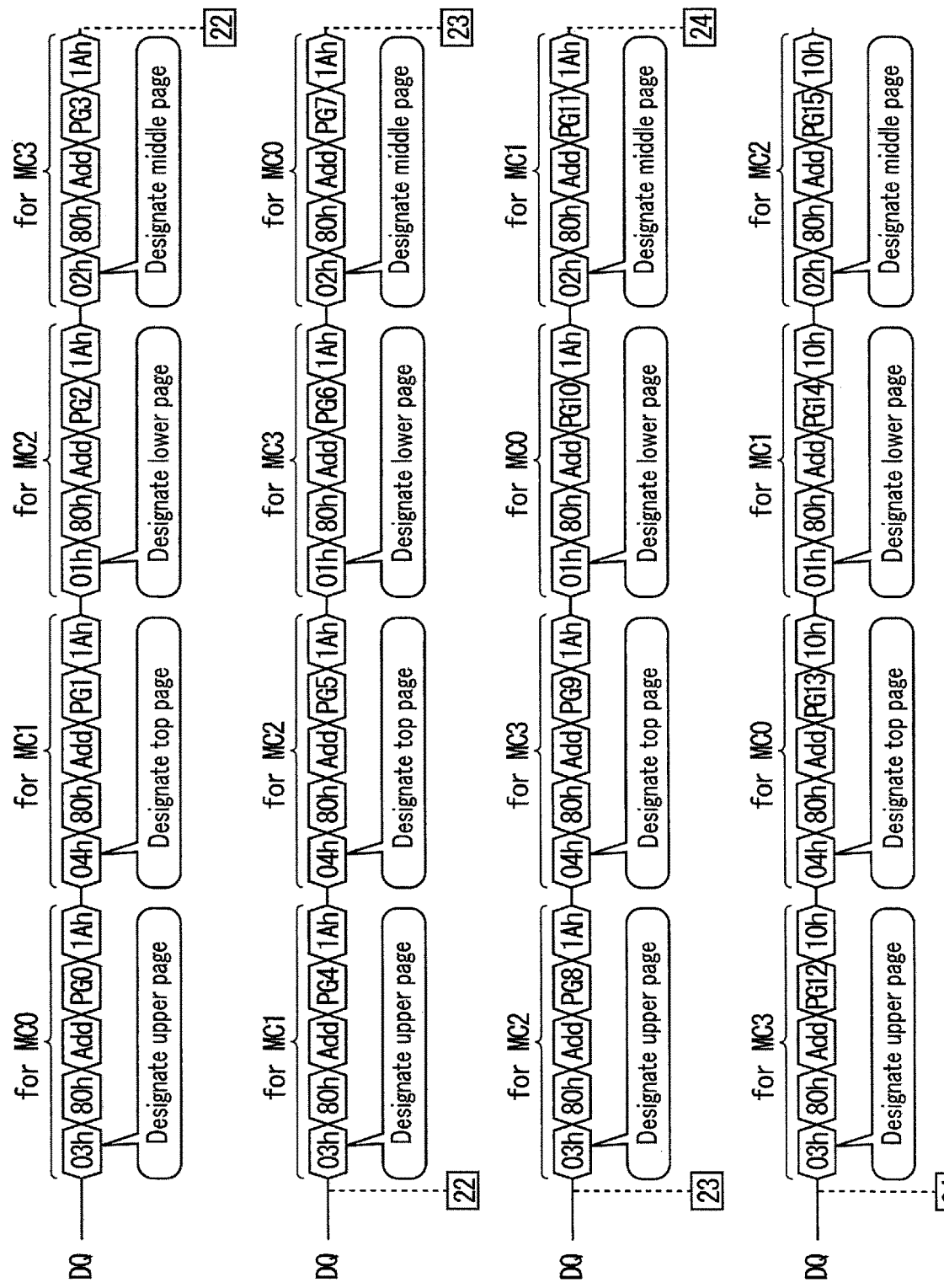
FIG. 65 illustrates an example for reference of an input and output signal for data writes in a memory system.

In cases where the 13th embodiment is not used, writes of the page data PG as illustrated in FIG. 24 according to the 13th embodiment typically requires the transmission of command sets and page data according to a sequence as illustrated in FIG. 65. In other words, the memory device MC and the page where the page data PG actually is to be written are designated. For example, the command set for writing the page data PG0 designates the upper page of the memory device MC0, the command set for writing the page data PG1 designates the top page of the memory device MC1, the command set for writing the page data PG2 designates the lower page of the memory device MC2, and the command set for writing the page data PG3 designates the middle page of the memory device MC3. However, such a sequence has little regularity, and is not arrange well sequentially, such as writing data to the lower pages of the memory devices MC0 to MC3, then writing data to the middle pages of the memory devices MC0 to MC3, then writing data to the upper pages of the memory devices MC0 to MC3, and then writing data to the top pages of the memory devices MC0 to MC3, for example.

According to the 13th embodiment, the transmission of the command sets for writing data sets as illustrated in the 13th embodiment is highly regular. In other words, for example, a sequence such as all data-writes designating the lower page, then all data-writes designating the middle page, then all data-writes designating the upper page, and then all data-writes designating the top page is possible. Even with such command transmission, data is written as illustrated in the 13th embodiment. For this reason, the instructions for data writing by the memory controller 2 are simple, and the processing load on the memory controller 2 is light.

<13.5. Modification>

The conversion of designated pages by the address converter 18 or 19 like in the 13th embodiment is also applicable to embodiments other than the third and 11th embodiments.

14th Embodiment

The 14th embodiment relates to details of read, and is applicable to the reading of data stored in any format. Hereinafter, the features that differ from the first embodiment will be described mainly.

<14.1. Configuration>

FIG. 66 illustrates functional blocks of a memory controller 2 according to the 14th embodiment. Each functional block is realizable by operations by the CPU 22 following firmware in the RAM 23, a portion of the memory space in the RAM 23, and/or dedicated hardware (or, a circuit).

The memory controller 2 includes a command generator 231, a command queue 232, and a command delivery unit 233. Of the plurality of functions provided by the read controller 212, the command generator 231 is responsible for generating the command sets described in the first to 13th embodiments. The command generator 231 generates command sets according to a first-in first-out rule, for example. In other words, the command generator 231 generates command sets in the same order as the order in which the command generator 231 determines the generation of the command sets, on the basis of information such as instructions from the host device 200.

The command queue 232 holds the command sets generated by the command generator 231 in the generated order. In other words, a command set generated earlier is assigned a higher order of priority.

The command delivery unit 233 transmits the command sets held in the command queue 232 to the memory interface 25 in an order rearranged according to a certain rule. The memory interface 25 transmits the command sets to the memory device MC in the order in which the command sets were received from the command delivery unit 233.

<14.2. Operations>

The following description and related diagrams relate to an example of the storage of two bits of data per memory cell transistor, the same as that described in the 11th embodiment. However, the 14th embodiment is also applicable to an example of the storage of three or more bits of data per memory cell transistor. The details can be inferred by persons skilled in the art on the basis of the principles described below.

The memory device MC uses the same 12 mapping as the 11th embodiment, such that each cell unit CU stores data of two pages in size, and the two pages include just one fast page. Also, like the 11th embodiment, the following description relates to an example in which the planes PB0 and PB1 in each memory device MC cannot operate independently.

Figure 67:
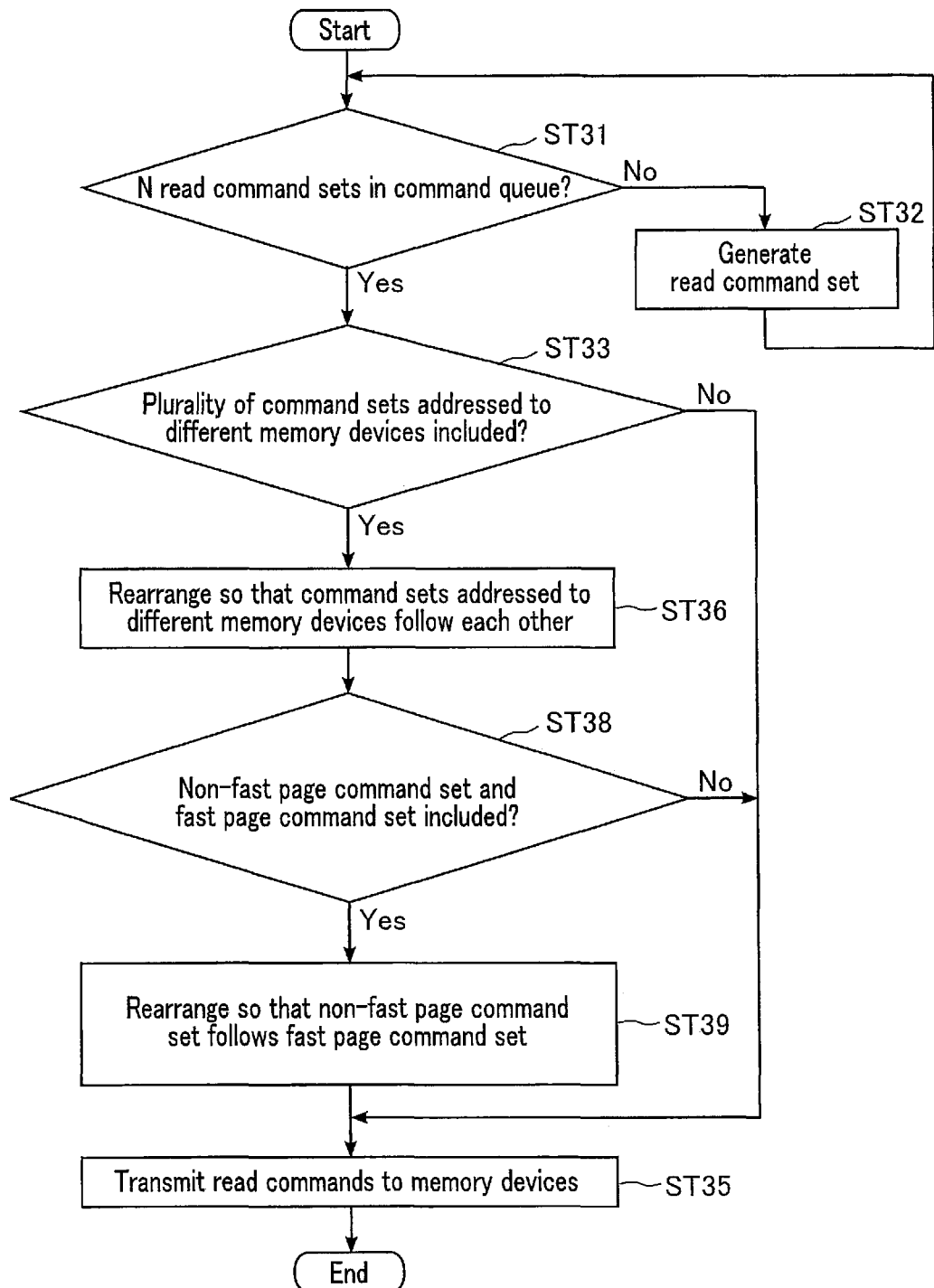
FIG. 67 illustrates a flow of data reads in the memory system according to the 14th embodiment.

FIG. 67 illustrates a flow of data reads in the memory system 100 according to the 14th embodiment, and more specifically, illustrates a flow of operations by the read controller 212. As illustrated in FIG. 67, the command generator 231 determines whether N read command sets are being held in the command queue 232 (step ST31). N is any number. As described later, the read controller 212 rearranges, for each N command set, an order in which to deliver the N command sets. For this reason, the order in which the command sets are generated and the order in which the command sets are delivered may be different, and there is a possibility of a delay in the delivery of a command set generated earlier. It is possible to determine N such that this delay does not violate the constraints that the memory system 100 should satisfy. The following description is based on an example where N is 4.

In the case where N read command sets are not being held in the command queue 232 (No branch of step ST31), the process proceeds to step ST32. In step ST32, the command generator 231 generates a read command set on the basis of the occurrence of processes to be executed. Step ST32 continues to step ST31.

In the case where N read command sets are being held in the command queue 232 (Yes branch of step ST31), the process proceeds to step ST33. In step ST33, the command delivery unit 233 determines whether the N command sets include a command set targeting a memory device MC and a command set targeting another memory device MC. In the case where command sets targeting different memory devices MC are not included (No branch of step ST33), the process proceeds to step ST35. In step ST35, the command delivery unit 233 transmits the N command sets to the target memory devices MC through the memory interface 25 in the current arrangement, that is, in the current order of priority.

In the case where command sets targeting different memory devices MC are included, the process proceeds to step ST36. In step ST36, the command delivery unit 233 rearranges the order of the N command sets in the command queue 232 such that the command set targeting a memory device MC is followed by the command set targeting another memory device MC. For example, in the case where four command sets arranged in the generated order target the memory devices MC0, MC0, MC1, and MC1, respectively, the command delivery unit 233 rearranges the command sets into the order of a command set targeting the memory device MC0, a command set targeting the memory device MC1, a command set targeting the memory device MC0, and a command set targeting the memory device MC1.

Hereinafter, rearranging the order of command sets CS and changing the priorities assigned to command sets CS refer to the same process.

The command delivery unit 233 determines whether the N command sets include a command set for a non-fast page and a command set for a fast page (step ST38). In the case where the N command sets do not include both a read command set for a non-fast page and a read command set for a fast page (No branch of step ST38), the process proceeds to step ST35.

In the case where the N command sets include both a read command set for a non-fast page (non-fast page command set) CS and a read command set targeting a fast page (fast page command set) CS (Yes branch of step ST38), the process proceeds to step ST39. In step ST39, the command delivery unit 233 rearranges the N command sets such that a fast page command set CS is followed by a non-fast page command set CS, while also maintaining the arrangement in which consecutive command sets CS target different memory devices MC. To this end, in the arrangement of the N command sets, the command delivery unit 233 can substitute each fast page command set with a different command set for the memory device MC targeted by the fast page command set among the N command sets. Through the rearrangement in step ST39, at least one fast page command set CS is moved to the front of the order of the N command sets CS.

Step ST39 continues to step ST35. When step ST35 ends, the flow in FIG. 67 ends. In the case where a read command set still exists, the flow in FIG. 67 starts from step ST31.

Hereinafter, FIGS. 68 to 70 will be referenced to describe three examples of rearranging read command sets.

FIGS. 68 to 70 illustrate states of the command queue 232 during operations over time in the memory system 100 according to the 14th embodiment. Specifically, FIGS. 68 to 70 respectively illustrate a first example, a second example, and a third example of the state of the command queue during the flow of FIG. 67, and relate to an example of N=4.

The portion (a) of FIG. 68 illustrates the state at the start of step ST33. As an example, the four command sets include command sets CS00, CS01, CS10, and CS11. The command set CS00 designates a read from a non-fast page of the memory device MC0. The command set CS01 designates a read from a non-fast page of the memory device MC0. The command set CS10 designates a read from a non-fast page of the memory device MC1. The command set CS11 (shaded in the diagram) designates a read from a fast page of the memory device MC1. The command sets CS00, CS01, CS10, and CS11 are generated in that order. For this reason, the command sets CS00, CS01, CS10, and CS11 are arranged by decreasing priority in that order.

The portion (b) of FIG. 68 illustrates the state at the end of step ST36. The command sets CS00, CS01, CS10, and CS11 have been rearranged such that a command targeting the memory device MC0 is adjacent to a command targeting the memory device MC1. As a result, for example, the command sets CS00, CS10, CS01, and CS11 are arranged by decreasing priority in that order.

The portion (c) of FIG. 68 illustrates the state at the end of step ST39. The command set CS11 targeting a fast page is moved to the front of the order of priority. Even after the move, the remaining command sets CS00, CS01, and CS10 are still rearranged such that a command targeting the memory device MC0 is adjacent to a command targeting the memory device MC1. As a result, the command sets CS11, CS00, CS10, and CS01 are arranged by decreasing priority in that order.

The portion (a) of FIG. 69 illustrates the state at the start of step ST33. As an example, the four command sets include command sets CS00, CS01, CS11, and CS02. The command set CS02 designates a read from a non-fast page of the memory device MC0. The command sets CS00, CS01, CS11, and CS02 are generated in that order.

The portion (b) of FIG. 69 illustrates the state at the end of step ST39. As a result of rearrangement, the only fast page command set CS11 is positioned at the beginning of the order of priority, and is followed by a command set that targets the memory device MC0, which is different from the memory device MC1, which is the target of the fast page command set CS11, such as the command set CS00 for example. Because there is no other command set CS targeting the memory device MC1, the command set CS00 is followed by the command sets targeting the memory device MC0, such as the command sets CS01 and CS02 in that order, for example.

The portion (a) of FIG. 70 illustrates the state at the start of step ST33. As an example, the four command sets include command sets CS00, CS03, CS10, and CS11. The command set CS03 designates a read from a fast page of the memory device MC0. The command sets CS00, CS03, CS10, and CS11 are generated in the above order.

The portion (b) of FIG. 70 illustrates the state at the end of step ST39. As a result of rearrangement, the fast page command set CS03 is positioned at the beginning of the order of priority, and is followed by the command set CS11, which targets the memory device MC1, which is different from the memory device MC0, which is the target of the command set CS03. The command set CS00 targeting the memory device MC0, which is different from the memory device MC1, which is the target of the command CS11, follows next, and is followed by the remaining command set CS10.

<14.3. Advantages>

Depending on the order in which the read command sets are generated, if the read command sets are transmitted in the generated order, the execution of the reads may be time-consuming in some cases. For example, the command sets CS00, CS01, CS10, and CS11 generated in the order illustrated in the portion (a) of FIG. 68 can be rearranged such that command sets CS targeting different memory devices MC are adjacent to each other, as illustrated in the portion (b) of FIG. 68. This arrangement makes it possible to proceed with reads by a plurality of command sets in parallel. However, the command set CS11 targeting a fast page comes after the command set CS01 targeting a non-fast page. For this reason, even though preparations are complete for the output of page data PG by the command set CS11, it is necessary to wait for the read and the output of the obtained page data PG by the command set CS01.

According to the 14th embodiment, a plurality of command sets CS are transmitted from the memory controller 2 in an order such that a fast page command set CS is positioned in front and is also followed by a command set CS targeting another memory device MC, and also such that a fast page command set CS is followed by a non-fast page command set CS, regardless of the generated order.

For this reason, the start of a read from a certain fast page of a certain memory device MC is followed by the start of a read from a certain non-fast page of another memory device MC, while in addition, the non-fast page read is started after the start of the fast page read in another memory device MC, regardless of the order in which the read command sets are generated. This makes it possible to output the data of the fast page while the non-fast page read is in progress. Consequently, it is possible to read and output data with the same efficiency as the first embodiment according to the same principle as the first embodiment.

<14.4. Modification>

The description so far relates to an example in which the command delivery unit 233 is included in the read controller 212. The 14th embodiment is not limited to this example. For example, the command delivery unit 233 may also be a part of the functions of the memory interface 25.

15th Embodiment

The 15th embodiment relates to an extension of the first to 11th embodiments, and is applicable to the first to 14th embodiments.

<15.1. Structure (Configuration)>

Figure 71:
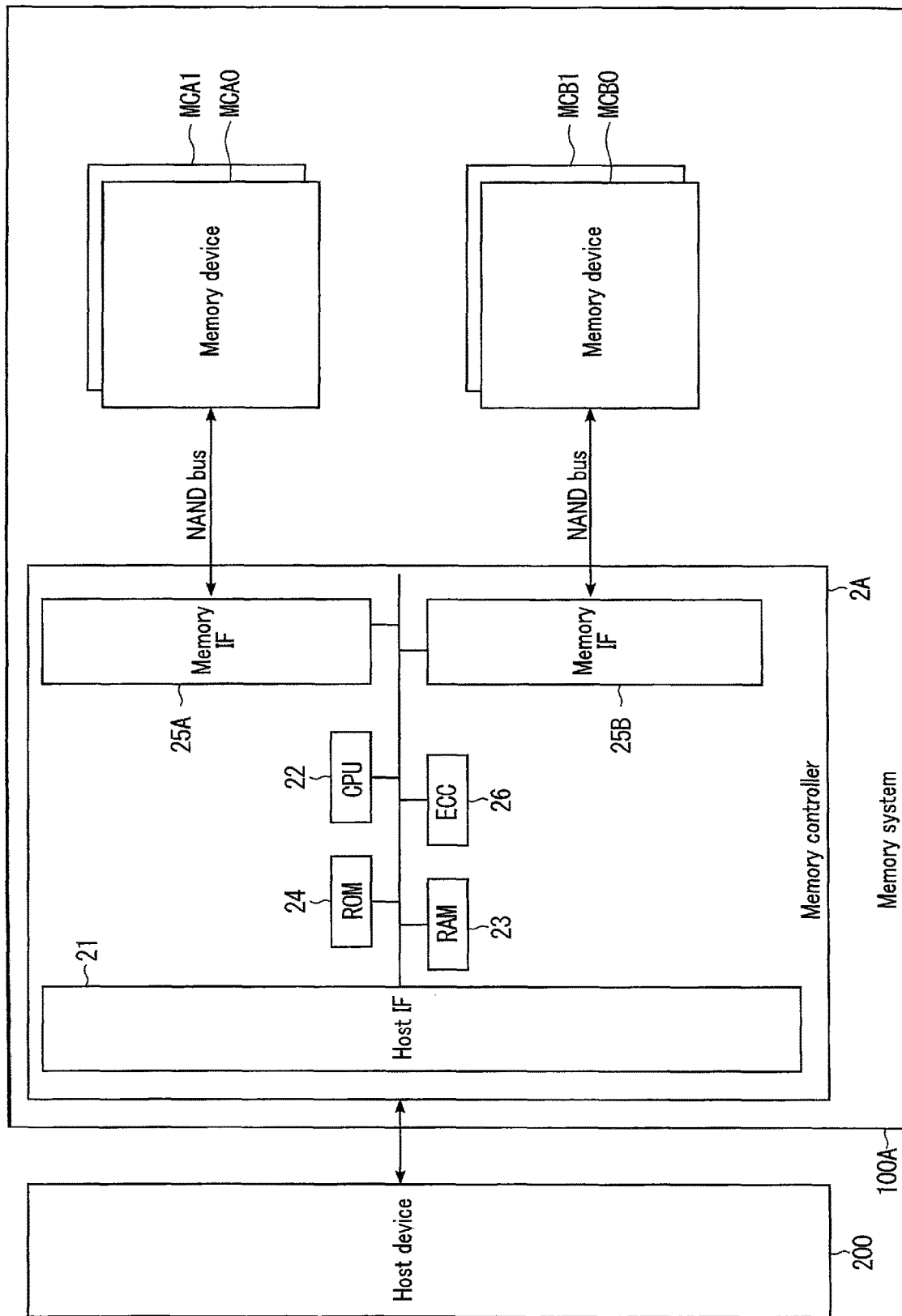
FIG. 71 illustrates components and connections in a memory system according to a 15th embodiment, and related components.

FIG. 71 illustrates components and connections in a memory system according to a 15th embodiment, and related components. As illustrated in FIG. 71, the memory system 100 according to the 15th embodiment is different from the configuration according to the first embodiment (FIG. 1) with regard to the memory controller 2 and the memory devices MC. In general, the memory system 100 according to the 15th embodiment includes two or more sets of the memory interface 25 according to the first embodiment and one or more memory devices MC connected to that memory interface 25. Hereinafter, the memory system 100 and the memory controller 2 according to the 15th embodiment may be referred to as the memory system 100A and the memory controller 2A, respectively, for distinction.

The memory controller 2A includes a plurality of memory interfaces 25. FIG. 71 and the following description are based on an example in which the memory system 100 includes two sets, and consequently the memory controller 2A includes two memory interfaces 25A and 25B. The memory interfaces 25A and 25B have the same configuration as the memory interface 25.

The memory interface 25A is connected to one or more memory devices MCA (MCA0, MCA1, and so on). The memory interface 25B is connected to one or more memory devices MCB (MCB0, MCB1, and so on). Each memory interface 25 and the memory devices MCS connected to each memory interface 25 are connected similarly to the connection between the memory interface 25 and the one or more memory devices MC in the first embodiment (FIG. 1).

Figure 72:
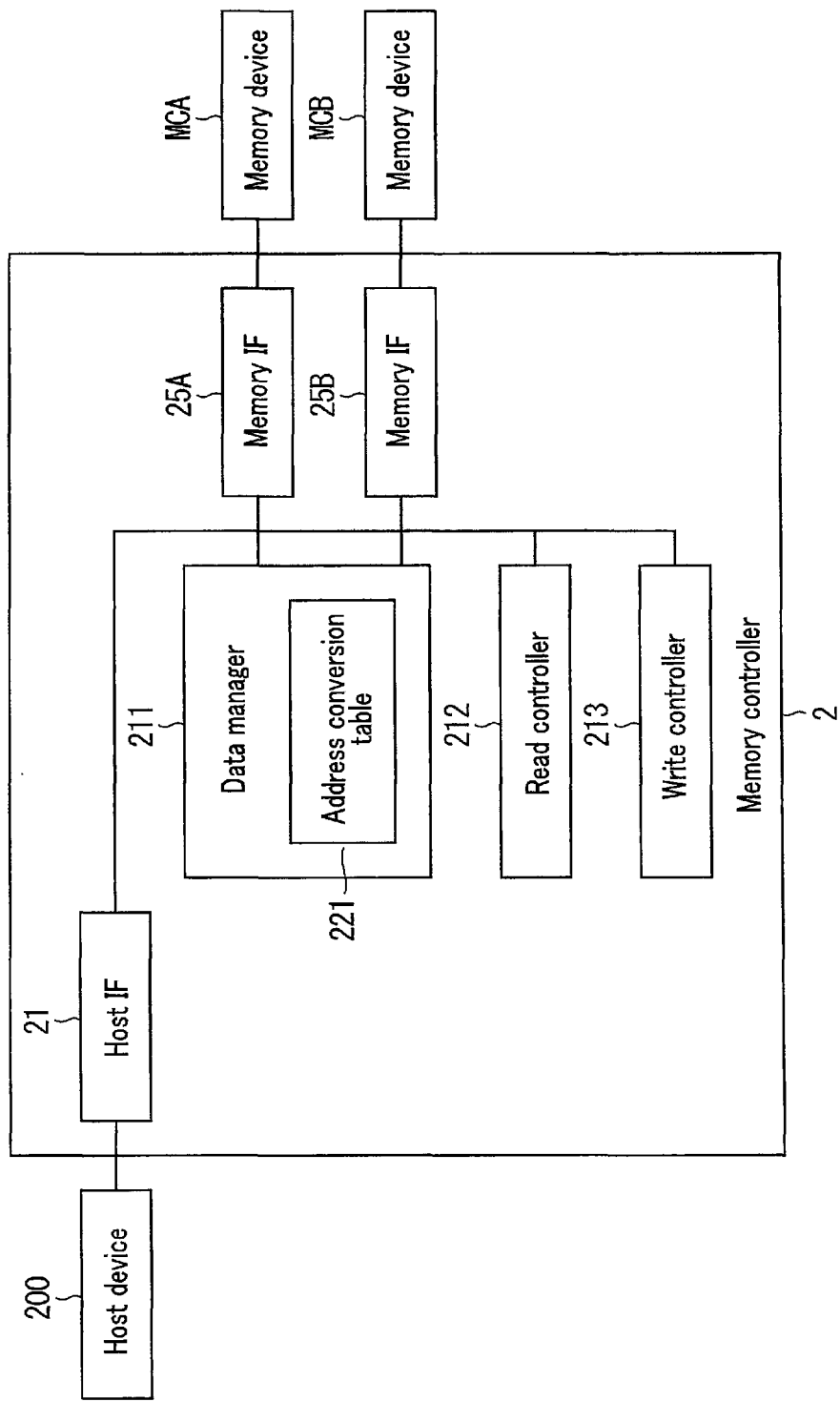
FIG. 72 illustrates functional blocks of a memory controller according to the 15th embodiment.

FIG. 72 illustrates functional blocks of the memory controller 2A according to the 15th embodiment. Each functional block is realizable by operations by the CPU 22 following firmware in the RAM 23, a portion of the memory space in the RAM 23, and/or dedicated hardware (or, a circuit). As illustrated in FIG. 72, the memory controller 2A includes the memory interfaces 25A and 25B instead of the memory interface 25.

<15.2. Operations>

The memory controller 2A writes data to the memory devices MC as described below. Hereinafter, the case of an extension of the second embodiment is described as an example. In other words, the 4434 mapping is used, and each memory device MC includes the planes PB0 and PB1 capable of operating independently. Also, in each of the memory device MCA and the memory device MCB, the memory area unit MA2 is configured as in the second embodiment. The memory area unit MA2 of the memory device MCA is referred to as the memory area unit MA2A, and the memory area unit MA2 of the memory device MCB is referred to as the memory area unit MA2B.

The memory area unit MA2A is the set of the lower, middle, upper, and top pages of a cell unit CUs00 in a plane PB0 of a memory device MCA0, the lower, middle, upper, and top pages of a cell unit CUs01 in a plane PB1 of the memory device MCA0, the lower, middle, upper, and top pages of a cell unit CUs10 in a plane PB0 of a memory device MCAT, and the lower, middle, upper, and top pages of a cell unit CUs11 in a plane PB1 of the memory device MCA1.

The memory area unit MA2B is the set of the lower, middle, upper, and top pages of a cell unit CUs00 in a plane PB0 of a memory device MCB0, the lower, middle, upper, and top pages of a cell unit CUs01 in a plane PB1 of the memory device MCB0, the lower, middle, upper, and top pages of a cell unit CUs10 in a plane PB0 of a memory device MCB1, and the lower, middle, upper, and top pages of a cell unit CUs11 in a plane PB1 of the memory device MCB1.

Based on such features of the memory area units MA2A and MA2B, 32 pieces of page data PG with consecutive logical addresses are stored in a single memory area unit MA2A or MA2B. Additionally, 16 pieces of page data PG with certain logical addresses are held in the memory area unit MA2A, while the 16 pieces of page data PG with the remaining logical addresses are held in the memory area unit MA2B.

Next, FIGS. 73 to 75 will be referenced to describe specific first to third examples of writing. FIGS. 73 to 75 respectively illustrate first to third examples of the memory area units MA2 and positions where page data are written in the memory devices MC according to the 15th embodiment. In general, 32 pieces of page data PG with consecutive logical addresses are written in a distributed manner to the memory area units MA2A and MA2B, similarly to the second embodiment.

15.2.1. First Example

As illustrated in FIG. 73, the 32 pieces of page data PG with consecutive logical addresses are alternately written to the memory area units MA2A and MA2B in order of ascending logical address. In other words, page data PG(2γ) is written to the memory area unit MA2A according to a rule by which the descriptions regarding the page data PG0 to PG15 in the second embodiment are applied to the page data PG(2γ) for the cases of γ from 0 to 15, respectively. Additionally, page data PG(2γ+1) is written to the memory area unit MA2B according to a rule by which the descriptions regarding the page data PG0 to PG15 in the second embodiment are applied to the page data PG(2γ+1) for the cases of γ from 0 to 15, respectively. Details are as follows.

For each of the cases where δ is 0, 1, 8, 9, 16, 17, 24, and 25, the page data PGδ, PG(δ+2), PG(δ+4), and PG(δ+6) form a data set.

As illustrated in FIG. 73, for each of the cases where δ is 0, 8, 16, and 24, each one of the page data PGδ, PG(δ+2), PG(δ+4), and PG(δ+6) of each data set is written to a different one of all combinations of the planes PB0 and PB1 of the memory devices MCA0 and MCAT, and in addition, one of the page data PGδ, PG(δ+2), PG(δ+4), and PG(δ+6) is written to a fast page (upper page) while the remaining three are written to non-fast pages. Also, each piece of page data included in a data set and written to a non-fast page is written to any of the lower, middle, and top pages. Furthermore, the pages to which the page data PG0, PG2, PG4, PG6, PG8, PG10, PG12, PG14, PG16, PG18, PG20, PG22, PG24, PG26, PG28, and PG30 are written are determined such that four data sets are written to the memory area unit MA2A. Insofar as the pages are written in this way, the positions where the page data PG0, PG2, PG4, PG6, PG8, PG10, PG12, PG14, PG16, PG18, PG20, PG22, PG24, PG26, PG28, and PG30 are written are not limited to the example in FIG. 73. As an example, the page data PG written to the non-fast pages can be written to different one of lower, middle, and top pages.

Also, for each of the cases where δ is 1, 9, 17, and 25, each one of the page data PGδ, PG(δ+2), PG(δ+4), and PG(δ+6) of each data set are written to a different one of all combinations of the planes PB0 and PB1 of the memory devices MCB0 and MCB1, and in addition, one of the page data PGδ, PG(δ+2), PG(δ+4), and PG(δ+6) is written to a fast page (upper page) while the remaining three are written to non-fast pages. Also, each piece of page data included in a data set and written to a non-fast page is written to any of the lower, middle, and top pages. Furthermore, the pages to which the page data PG1, PG3, PG5, PG7, PG9, PG11, PG13, PG15, PG17, PG19, PG21, PG23, PG25, PG27, PG29, and PG31 are written are determined such that four data sets are written to the memory area unit MA2B. Insofar as the pages are written in this way, the positions where the page data PG1, PG3, PG5, PG7, PG9, PG11, PG13, PG15, PG17, PG19, PG21, PG23, PG25, PG27, PG29, and PG31 are written are not limited to the example in FIG. 73. As an example, the page data PG written to the non-fast pages can be written to different one of lower, middle, and top pages.

As illustrated in FIG. 73, the page data PG0 is written to the upper page of the selected cell unit CUs00 in the plane PB0 of the memory device MCA0. The page data PG1 is written to the upper page of the selected cell unit CUs00 in the plane PB0 of the memory device MCB0. The page data PG2 is written to the middle page of the selected cell unit CUs01 in the plane PB1 of the memory device MCA0. The page data PG3 is written to the middle page of the selected cell unit CUs01 in the plane PB1 of the memory device MCB0. The page data PG4 is written to the lower page of the selected cell unit CUs10 in the plane PB0 of the memory device MCA1. The page data PG5 is written to the lower page of the selected cell unit CUs10 in the plane PB0 of the memory device MCB1. The page data PG6 is written to the top page of the selected cell unit CUs11 in the plane PB1 of the memory device MCA1. The page data PG7 is written to the top page of the selected cell unit CUs11 in the plane PB1 of the memory device MCB1.

The page data PG8 is written to the upper page of the selected cell unit CUs00 in the plane PB1 of the memory device MCA0. The page data PG9 is written to the upper page of the selected cell unit CUs00 in the plane PB1 of the memory device MCB0. The page data PG10 is written to the middle page of the selected cell unit CUs00 in the plane PB0 of the memory device MCA0. The page data PG11 is written to the middle page of the selected cell unit CUs00 in the plane PB0 of the memory device MCB0. The page data PG12 is written to the lower page of the selected cell unit CUs11 in the plane PB1 of the memory device MCA1. The page data PG13 is written to the lower page of the selected cell unit CUs11 in the plane PB1 of the memory device MCB1. The page data PG14 is written to the top page of the selected cell unit CUs10 in the plane PB0 of the memory device MCA1. The page data PG15 is written to the top page of the selected cell unit CUs10 in the plane PB0 of the memory device MCB1.

The page data PG16 is written to the upper page of the selected cell unit CUs10 in the plane PB0 of the memory device MCA1. The page data PG17 is written to the upper page of the selected cell unit CUs10 in the plane PB0 of the memory device MCB1. The page data PG18 is written to the middle page of the selected cell unit CUs11 in the plane PB1 of the memory device MCA1. The page data PG19 is written to the middle page of the selected cell unit CUs11 in the plane PB1 of the memory device MCB1. The page data PG20 is written to the top page of the selected cell unit CUs00 in the plane PB0 of the memory device MCA0. The page data PG21 is written to the top page of the selected cell unit CUs00 in the plane PB0 of the memory device MCB0. The page data PG22 is written to the lower page of the selected cell unit CUs01 in the plane PB1 of the memory device MCA0. The page data PG23 is written to the lower page of the selected cell unit CUs01 in the plane PB1 of the memory device MCB0.

The page data PG24 is written to the upper page of the selected cell unit CUs11 in the plane PB1 of the memory device MCA1. The page data PG25 is written to the upper page of the selected cell unit CUs11 in the plane PB1 of the memory device MCB1. The page data PG26 is written to the middle page of the selected cell unit CUs10 in the plane PB0 of the memory device MCA1. The page data PG27 is written to the middle page of the selected cell unit CUs10 in the plane PB0 of the memory device MCB1. The page data PG28 is written to the top page of the selected cell unit CUs01 in the plane PB1 of the memory device MCA0. The page data PG29 is written to the top page of the selected cell unit CUs01 in the plane PB1 of the memory device MCB0. The page data PG30 is written to the lower page of the selected cell unit CUs00 in the plane PB0 of the memory device MCA0. The page data PG31 is written to the lower page of the selected cell unit CUs00 in the plane PB0 of the memory device MCB0.

Data reads are the same as those in the second embodiment, except for occurring in the memory devices MCA and MCB in parallel. In other words, in each of the memory area units MA2A and MA2B, reads can proceed according to a rule by which the descriptions regarding the 16 pieces of page data PG with consecutive logical address in the second embodiment are applied to 16 pieces of page data PG with alternating logical addresses.

15.2.2. Second Example

As illustrated in FIG. 74, the 32 pieces of page data PG with consecutive logical addresses are alternately written to the memory area units MA2A and MA2B in order of ascending logical address for every four pieces of page data PG with certain logical addresses. Specifically, the page data PGγ, PG(γ+1), PG(γ+4), and PG(γ+5) are written to the memory area unit MA2A according to a rule where the descriptions regarding the page data PG0 to PG15 in the second embodiment are applied to the page data PGγ, PG(γ+1), PG(γ+4), and PG(γ+5) in ascending order for each of the cases where γ is 0, 8, 16, and 24. Furthermore, the page data PGγ, PG(γ+1), PG(γ+4), and PG(γ+5) are written to the memory area unit MA2B according to a rule where the descriptions regarding the page data PG0 to PG15 in the second embodiment are applied to the page data PGγ, PG(γ+1), PG(γ+4), and PG(γ+5) in ascending order for each of the cases where γ is 2, 10, 18, and 26. Details are as follows.

For each of the cases where δ is 0, 2, 8, 10, 16, 18, 24, and 26, the page data PGδ, PG(δ+1), PG(δ+4), and PG(δ+5) form a data set.

As illustrated in FIG. 74, for each of the cases where δ is 0, 8, 16, and 24, each one of the page data PGδ, PG(δ+1), PG(δ+4), and PG(δ+5) of each data set is written to a different one of all combinations of the planes PB0 and PB1 of the memory devices MCA0 and MCAT, and in addition, one of the page data PGδ, PG(δ+1), PG(δ+4), and PG(δ+5) is written to a fast page (upper page) while the remaining three are written to non-fast pages. Also, each piece of page data included in a data set and written to a non-fast page is written to any of the lower, middle, and top pages. Furthermore, the pages to which the page data PG0, PG1, PG4, PG5, PG8, PG9, PG12, PG13, PG16, PG17, PG20, PG21, PG24, PG25, PG28, and PG29 are written are determined such that four data sets are written to the memory area unit MA2A. Insofar as the pages are written in this way, the positions where the page data PG0, PG1, PG4, PG5, PG8, PG9, PG12, PG13, PG16, PG17, PG20, PG21, PG24, PG25, PG28, and PG29 are written are not limited to the example in FIG. 74. As an example, the page data PG written to the non-fast pages can be written to different one of lower, middle, and top pages.

Also, for each of the cases where δ is 2, 10, 18, and 26, each of the page data PGδ, PG(δ+1), PG(δ+4), and PG(δ+5) of each data set is written to a different one of all combinations of the planes PB0 and PB1 of the memory devices MCB0 and MCB1, and in addition, one of the page data PGδ, PG(δ+1), PG(δ+4), and PG(δ+5) is written to a fast page (upper page) while the remaining three are written to non-fast pages. Also, each piece of page data included in a data set and written to a non-fast page is written to any of the lower, middle, and top pages. Furthermore, the pages to which the page data PG2, PG3, PG6, PG7, PG10, PG11, PG14, PG15, PG18, PG19, PG22, PG23, PG26, PG27, PG30, and PG31 are written are determined such that four data sets are written to the memory area unit MA2B. Insofar as the pages are written in this way, the positions where the page data PG2, PG3, PG6, PG7, PG10, PG11, PG14, PG15, PG18, PG19, PG22, PG23, PG26, PG27, PG30, and PG31 are written are not limited to the example in FIG. 74. As an example, the page data PG written to the non-fast pages can be written to different one of lower, middle, and top pages.

Data reads are the same as those in the second embodiment, except for occurring in the memory devices MCA and MCB in parallel. In other words, in each of the memory area units MA2A and MA2B, reads can proceed according to a rule where the descriptions regarding the 16 pieces of page data PG with consecutive logical address in the second embodiment are applied to 16 pieces of page data PG with two consecutive logical addresses every four logical addresses.

15.2.3. Third Example

As illustrated in FIG. 75, the 32 pieces of page data PG with consecutive logical addresses are alternately written to the memory area units MA2A and MA2B in order of ascending logical address for every four pieces of page data PG with consecutive logical addresses. Specifically, the page data PGγ, PG(γ+1), PG(γ+2), and PG(γ+3) are written to the memory area unit MA2A according to a rule where the descriptions regarding the page data PG0 to PG15 in the second embodiment are applied to the page data PGγ, PG(γ+1), PG(γ+2), and PG(γ+3) in ascending order for each of the cases where γ is 0, 8, 16, and 24. Furthermore, the page data PGγ, PG(γ+1), PG(γ+2), and PG(γ+3) are written to the memory area unit MA2B according to a rule where the descriptions regarding the page data PG0 to PG15 in the second embodiment are applied to the page data PGγ, PG(γ+1), PG(γ+2), and PG(γ+3) in ascending order for each of the cases where γ is 4, 12, 20, and 28. Details are as follows.

For each of the cases where δ is 0, 4, 8, 12, 16, 20, 24, and 28, the page data PGδ, PG(δ+1), PG(δ+2), and PG(δ+3) form a data set.

As illustrated in FIG. 75, for each of the cases where δ is 0, 8, 16, and 24, each of the page data PGδ, PG(δ+1), PG(δ+2), and PG(δ+3) of each data set is written to a different one of all combinations of the planes PB0 and PB1 of the memory devices MCA0 and MCAT, and in addition, one of the page data PGδ, PG(δ+1), PG(δ+2), and PG(δ+3) is written to a fast page (upper page) while the remaining three are written to non-fast pages. Also, each piece of page data included in a data set and written to a non-fast page is written to any of the lower, middle, and top pages. Furthermore, the pages to which the page data PG0, PG1, PG2, PG3, PG8, PG9, PG10, PG11, PG16, PG17, PG18, PG19, PG24, PG25, PG26, and PG27 are written are determined such that four data sets are written to the memory area unit MA2A. Insofar as the pages are written in this way, the positions where the page data PG0, PG1, PG2, PG3, PG8, PG9, PG10, PG11, PG16, PG17, PG18, PG19, PG24, PG25, PG26, and PG27 are written are not limited to the example in FIG. 75. As an example, the page data PG written to the non-fast pages can be written to different one of lower, middle, and top pages.

Also, for each of the cases where δ is 4, 12, 20, and 28, each of the page data PGδ, PG(δ+1), PG(δ+2), and PG(δ+3) of each data set is written to a different one of every combination of the planes PB0 and PB1 of the memory devices MCB0 and MCB1, and in addition, one of the page data PGδ, PG(δ+1), PG(δ+2), and PG(δ+3) is written to a fast page (upper page) while the remaining three are written to non-fast pages. Also, each piece of page data included in a data set and written to a non-fast page is written to any of the lower, middle, and top pages. Furthermore, the pages to which the page data PG4, PG5, PGδ, PG7, PG12, PG13, PG14, PG15, PG20, PG21, PG22, PG23, PG28, PG29, PG30, and PG31 are written are determined such that four data sets are written to the memory area unit MA2B. Insofar as the pages are written in this way, the positions where the page data PG4, PG5, PGδ, PG7, PG12, PG13, PG14, PG15, PG20, PG21, PG22, PG23, PG28, PG29, PG30, and PG31 are written are not limited to the example in FIG. 75. As an example, the page data PG written to the non-fast pages can be written to different one of lower, middle, and top pages.

Data reads are the same as those in the second embodiment, except for occurring in the memory devices MCA and MCB in parallel. In other words, in each of the memory area units MA2A and MA2B, reads can proceed according to a rule where the descriptions regarding the 16 pieces of page data PG with consecutive logical address in the second embodiment are applied to 16 pieces of page data PG with consecutive logical addresses every four logical addresses.

<15.3. Modification>

As described above, the 15th embodiment is applicable to any of the first embodiment and the third to 11th embodiments. In this case, the principles of the 15th embodiment described as being applied to the second embodiment above are applied to the applied embodiment. In other words, writes in the applied embodiment proceeds in parallel in the memory devices MCA and MCB as described above. The details can be inferred by persons skilled in the art from the description of the 15th embodiment.

<15.4. Advantages>

According to the 15th embodiment, the first to 11th embodiments can be applied to each of a plurality of memory devices MC connected to different memory interfaces 25. Consequently, the same advantages as the applied embodiment are obtained, even in the case where the memory system 100 includes a plurality of memory interfaces 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a semiconductor memory device including a first plurality of memory cells, a second plurality of memory cells, a first word line coupled to the first plurality of memory cells and a second word line coupled to the second plurality of memory cells, the first plurality of memory cells and the second plurality of memory cells being capable of being read in parallel, each capable of storing n (where n is a natural number equal to or greater than 2) bits of data, the method comprising:

writing first data to the first plurality of memory cells as an i-th bit of data of the n bits of data;

writing second data to the second plurality of memory cells as a j-th bit of data of the n bits of data, a logical address corresponding to the first data being smaller than a logical address corresponding to the second data, the logical address corresponding to the first data and the logical address corresponding to the second data being consecutive;

writing third data to a third plurality of memory cells as a k-th bit of data of the n bits of data, the third plurality of memory cells being one of the first plurality of memory cells and the second plurality of memory cells, the logical address corresponding to the second data being smaller than a logical address corresponding to the third data; and writing fourth data to a fourth plurality of memory cells as an l-th bit of data of the n bits of data, the fourth plurality of memory cells being one of the first plurality of memory cells and the second plurality of memory cells, the fourth plurality of memory cells being different from the third plurality of memory cells, the logical address corresponding to the third data being smaller than a logical address corresponding to the fourth data, the logical address corresponding to the third data and the logical address corresponding to the fourth data being consecutive, wherein j is a natural number different from i, k is a natural number different from l, and each of k and l is a natural number different from one of i and j.

2. The method according to claim 1, further comprising:

applying read voltages to the first word line to read data in the i-th bit of data among the n bits of data, wherein a number of read voltages for reading data in the i-th bit among the n bits is smaller than a number of read voltages for reading data in bits other than the i-th bit.

3. The method according to claim 1, wherein the semiconductor memory device includes first plane and second plane, each including a sense amplifier and a row decoder, the first plane includes the first plurality of memory cells, and the second plane includes the second plurality of memory cells.

4. The method according to claim 1, wherein n is a natural number equal to or greater than 3, and the method comprising:

writing fifth data to a fifth plurality of memory cells as a f-th bit of data of the n bits of data, the fifth plurality of memory cells being one of the first plurality of memory cells and the second plurality of memory cells; and writing sixth data to a sixth plurality of memory cells as a g-th bit of data of the n bits of data, the sixth plurality of memory cells being one of the first plurality of memory cells and the second plurality of memory cells, the sixth plurality of memory cells being different from the fifth plurality of memory cells, wherein f is a natural number different from g, f is a natural number different from one of i and j and different from one of k and l, g is a natural number different from one of i and j and different from one of k and l, the logical address corresponding to the fourth data is smaller than a logical address corresponding to the fifth data, the logical address corresponding to the fifth data is smaller than a logical address corresponding to the sixth data, and the logical address corresponding to the fifth data and the logical address corresponding to the sixth data are consecutive.

5. The method according to claim 1, wherein
the semiconductor memory device includes two potential generators respectively coupled to the first and second word lines, and
the two potential generators are configured to output potentials of independent magnitudes at independent timings from each other.

6. The method according to claim 1, further comprising:
transmitting an instruction to read the first data; and
transmitting an instruction to read the second data subsequently after the instruction to read the first data.

7. The method according to claim 4, further comprising:
transmitting an instruction to read the first data;
transmitting an instruction to read the second data subsequently after the instruction to read the first data;
transmitting an instruction to read the third data after the instruction to read the second data;
transmitting an instruction to read the fourth data subsequently after the instruction to read the third data;
transmitting an instruction to read the fifth data after the instruction to read the fourth data; and
transmitting an instruction to read the sixth data subsequently after the instruction to read the fifth data.

8. The method according to claim 1, wherein n is 4, and the method comprises:
writing fifth data to a fifth plurality of memory cells as a f-th bit of data of the n bits of data, the fifth plurality of memory cells being one of the first plurality of memory cells and the second plurality of memory cells;
writing sixth data to a sixth plurality of memory cells as a g-th bit of data of the n bits of data, the sixth plurality of memory cells being one of the first plurality of memory cells and the second plurality of memory cells, the sixth plurality of memory cells being different from the fifth plurality of memory cells;
writing seventh data to a seventh plurality of memory cells as a p-th bit of data of the n bits of data, the seventh plurality of memory cells being one of the first plurality of memory cells and the second plurality of memory cells; and
writing eighth data to an eighth plurality of memory cells as a q-th bit of data of the n bits of data, the eighth plurality of memory cells being one of the first plurality of memory cells and the second plurality of memory cells, the eighth plurality of memory cells being different from the seventh plurality of memory cells, wherein f is a natural number different from g, f is a natural number different from one of i and j and different from one of k and l, g is a natural number different from one of i and j and different from one of k and l, p is a natural number different from q, p is a natural number different from one of i and j, different from one of k and l and different from one of f and g, q is a natural number different from one of i and j, different from one of k and l and different from one of f and g, the logical address corresponding to the fourth data is smaller than a logical address corresponding to the fifth data, the logical address corresponding to the fifth data is smaller than a logical address corresponding to the sixth data, the logical address corresponding to the fifth data and the logical address corresponding to the sixth data are consecutive, the logical address corresponding to the sixth data is smaller than a logical address corresponding to the seventh data, the logical address corresponding to the seventh data is smaller than a logical address corresponding to the eighth data, and the logical address corresponding to the seventh data and the logical address corresponding to the eighth data are consecutive.

9. The method according to claim 8, wherein
the i-th bit is a bit read by applying three different voltages to the first word line, and
the k-th bit is a bit read by applying four or more different voltages to the first word line when the third plurality of memory cells is the first plurality of memory cells.

10. The method according to claim 8, wherein
the i-th bit is a bit read by applying one voltage to the first word line, and
the k-th bit is a bit read by applying two or more different voltages to the first word line when the third plurality of memory cells is the first plurality of memory cells.

11. The method according to claim 8, further comprising:
transmitting an instruction to read the first data;
transmitting an instruction to read the second data subsequently after the instruction to read the first data;
transmitting an instruction to read the third data after the instruction to read the second data;
transmitting an instruction to read the fourth data subsequently after the instruction to read the third data;
transmitting an instruction to read the fifth data after the instruction to read the fourth data;
transmitting an instruction to read the sixth data subsequently after the instruction to read the fifth data;
transmitting an instruction to read the seventh data after the instruction to read the sixth data; and
transmitting an instruction to read the eighth data subsequently after the instruction to read the seventh data.

12. The method according to claim 4, wherein
the i-th bit is a bit read by applying one voltage to the first word line, and
the k-th bit is a bit read by applying two or more different voltages to the first word line when the third plurality of memory cells is the first plurality of memory cells.

13. The method according to claim 4, wherein
the i-th bit is a bit read by applying two or more voltages to the first word line, and the k-th bit is a bit read by applying three or more different voltages to the first word line when the third plurality of memory cells is the first plurality of memory cells.

14. The method according to claim 1, wherein the i-th bit is a bit read by applying one voltage to the first word line, and the k-th bit is a bit read by applying two or more different voltages to the first word line when the third plurality of memory cells is the first plurality of memory cells.

* * * * *